(12) United States Patent
Sasagawa et al.

(10) Patent No.: US 7,998,801 B2
(45) Date of Patent: Aug. 16, 2011

(54) MANUFACTURING METHOD OF THIN FILM TRANSISTOR HAVING ALTERED SEMICONDUCTOR LAYER

(75) Inventors: Shinya Sasagawa, Kanagawa (JP); Motomu Kurata, Kanagawa (JP); Sho Osada, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 134 days.

(21) Appl. No.: 12/424,563

(22) Filed: Apr. 16, 2009

(65) Prior Publication Data

US 2010/0099226 A1 Apr. 22, 2010

(30) Foreign Application Priority Data

Apr. 25, 2008 (JP) ................. 2008-115834

(51) Int. Cl.
*H01L 21/00* (2006.01)
*H01L 21/302* (2006.01)

(52) U.S. Cl. .. 438/158; 438/719; 438/734; 257/E21.414
(58) Field of Classification Search .................. 438/158, 438/719, 734; 257/E21.414
See application file for complete search history.

(56) References Cited

U.S. PATENT DOCUMENTS

| | | | |
|---|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,453,858 A | 9/1995 | Yamazaki |
| 5,514,879 A | 5/1996 | Yamazaki |
| 5,591,987 A | 1/1997 | Yamazaki et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |

(Continued)

FOREIGN PATENT DOCUMENTS

EP 0 535 979 A2 4/1993

(Continued)

OTHER PUBLICATIONS

Arai et al., 41.2: Micro Silicon Technology for Active Matrix OLED Display, SID Digest '07 : SID International Symposium Digest of Technical Papers, vol. XXXVII , pp. 1370-1373, 2007.

(Continued)

*Primary Examiner* — Hsien-ming Lee
*Assistant Examiner* — Kevin Parendo
(74) *Attorney, Agent, or Firm* — Nixon Peabody LLP; Jeffrey L. Costellia

(57) ABSTRACT

Decrease of the off-state current, increase of the on-state current, and reduction of variations of electrical characteristics. A method for manufacturing a channel-etched inversed staggered thin film transistor includes the following steps: removing, by first dry-etching, a part of a semiconductor layer including an impurity element which imparts one conductivity type, which is exposed from the source and drain electrodes, and partially a part of an amorphous semiconductor layer just below and in contact with the part of the semiconductor layer; removing, by second dry-etching, partially the part of the amorphous semiconductor layer which is exposed by the first dry-etching; and performing plasma treatment on the surface of the part of the amorphous semiconductor layer which is exposed by the second dry-etching so that an altered layer is formed.

14 Claims, 31 Drawing Sheets

U.S. PATENT DOCUMENTS

| | | | |
|---|---|---|---|
| 5,859,445 A | 1/1999 | Yamazaki | |
| 5,864,150 A | 1/1999 | Lin | |
| 5,932,302 A | 8/1999 | Yamazaki et al. | |
| 6,011,277 A | 1/2000 | Yamazaki | |
| 6,023,075 A | 2/2000 | Yamazaki | |
| 6,121,162 A * | 9/2000 | Endo | 438/787 |
| 6,133,162 A | 10/2000 | Suzuki et al. | |
| 6,153,893 A | 11/2000 | Inoue et al. | |
| 6,171,674 B1 | 1/2001 | Yamazaki et al. | |
| 6,183,816 B1 | 2/2001 | Yamazaki et al. | |
| 6,252,249 B1 | 6/2001 | Yamazaki | |
| 6,281,520 B1 | 8/2001 | Yamazaki | |
| 6,291,366 B1 | 9/2001 | Sano et al. | |
| 6,306,213 B1 | 10/2001 | Yamazaki | |
| 6,420,276 B2 | 7/2002 | Oku et al. | |
| 6,458,715 B2 | 10/2002 | Sano et al. | |
| 6,468,617 B1 | 10/2002 | Yamazaki et al. | |
| 6,468,839 B2 | 10/2002 | Inoue et al. | |
| 6,500,752 B2 | 12/2002 | Oku et al. | |
| 6,646,327 B2 | 11/2003 | Oku et al. | |
| 6,737,676 B2 | 5/2004 | Yamazaki | |
| 6,756,258 B2 | 6/2004 | Zhang et al. | |
| 6,759,283 B2 | 7/2004 | Yasuda et al. | |
| 6,835,523 B1 | 12/2004 | Yamazaki et al. | |
| 6,835,669 B2 | 12/2004 | Oku et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,161,212 B2 | 1/2007 | Ohishi et al. | |
| 7,199,846 B2 | 4/2007 | Lim | |
| 7,410,818 B2 | 8/2008 | Ohishi et al. | |
| 2003/0189232 A1* | 10/2003 | Law et al. | 257/359 |
| 2004/0198046 A1* | 10/2004 | Yu-Chou et al. | 438/689 |
| 2004/0235224 A1* | 11/2004 | Lin et al. | 438/149 |
| 2005/0022864 A1 | 2/2005 | Fujioka et al. | |
| 2006/0019433 A1* | 1/2006 | Chen | 438/151 |
| 2010/0096637 A1* | 4/2010 | Yamazaki et al. | 257/66 |

FOREIGN PATENT DOCUMENTS

| | | |
|---|---|---|
| EP | 1 505 174 A1 | 2/2005 |
| JP | 55-163848 | 12/1980 |
| JP | 57-071126 | 5/1982 |
| JP | 58-042239 | 3/1983 |
| JP | 58-092217 | 6/1983 |
| JP | 62-062073 | 12/1987 |
| JP | 01-144682 | 6/1989 |
| JP | 02-053941 | 11/1990 |
| JP | 02-053941 B2 | 11/1990 |
| JP | 04-242724 | 8/1992 |
| JP | 06-326312 | 11/1994 |
| JP | 08-055858 | 2/1996 |
| JP | 10-163195 | 6/1998 |
| JP | 11-274504 | 10/1999 |
| JP | 2000-277439 | 10/2000 |
| JP | 2001-007024 | 1/2001 |
| JP | 2002-110992 | 4/2002 |
| JP | 2002-164346 | 6/2002 |
| JP | 2003-037270 | 2/2003 |
| JP | 2003-332313 | 11/2003 |
| JP | 2004-014958 | 1/2004 |
| JP | 2005-049832 | 2/2005 |
| JP | 2005-167051 | 6/2005 |
| JP | 2005-228826 | 8/2005 |
| JP | 2008-021722 | 1/2008 |

OTHER PUBLICATIONS

Kim et al, 42.1: A Novel Four-Mask-Count Process Architecture for TFT-LCDS, SID Digest '00 : SID International Symposium Digest of Technical Papers, pp. 1006-1009, 2000.

Song et al., 34.1: Advanced Four-Mask Process Architecture for the A-SI TFT Array Manufacturing Method, SID Digest '02 : SID International Symposium Digest of Technical Papers, pp. 1038-1041, 2002.

Choi et al., P-16: Novel Four-Mask Process in the FFS TFT-LCD With Optimum Multiple-Slit Design Applied by the Use of a Gray-Tone Mask, SID Digest '05 : SID International Symposium Digest of Technical Papers, pp. 284-287, 2005.

Lee et al., How to Achieve High Mobility Thin Film Transistors by Direct Deposition of Silicon Using 13.56 MHz RF PECVD?, Int. Electron Devices Meeting Tech. Digest, p. 295-298, 2006.

Czhang et al., Directly Deposited Nanocrystalline Silicon Thin-Film Transistors With Ultra High Mobilities, Appl. Phys. Lett., 89, pp. 252101-1-252101-3, 2006.

Fujiwara et al., Real-time spectroscopic ellipsometry studies of the nucleation and grain growth processes in microcrystalline silicon thin films, Phys. Rev. B, 63, pp. 115306-1-115306-9, 2001.

Fujiwara et al., Microcrystalline silicon nucleation sites in the sub-surface of hydrogenated amorphous silicon, Sur. Sci., 497, pp. 333-340, 2002.

Fujiwara et al., Stress-Induced Nucleation of Microcrystalline Silicon From Amorphous Phase, Jpn. J. Appl. Phys., vol. 41/Part1, No. 5A, pp. 2821-2828, 2002.

Kamei et al., A Significant Reduction of Impurity Contents in Hydrogenated Microcrystalline Silicon Films for Increased Grain Size and Reduced Defect Density, Jpn. J. Appl. Phys., vol. 37/Part2, No. 3A, pp. L265-L268, 1998.

* cited by examiner $H_2O*$   $H_2O*$   $H_2O*$   $H_2O*$   $H_2O*$

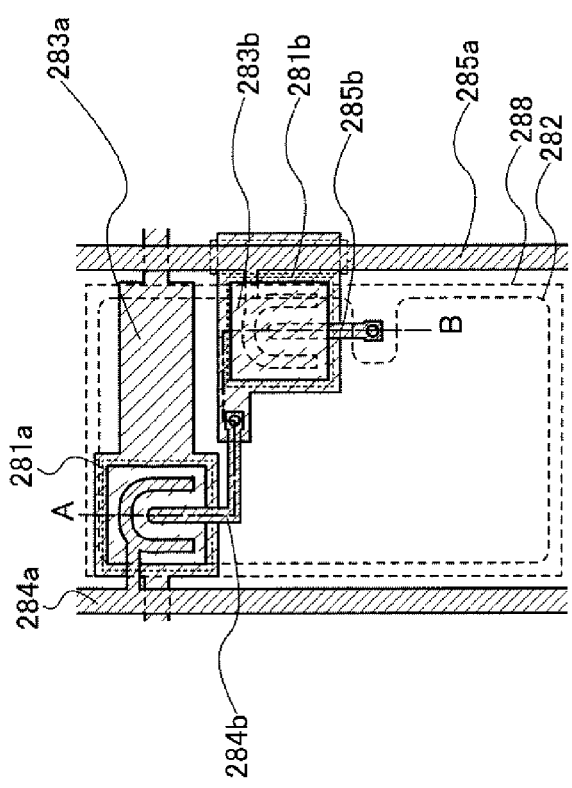
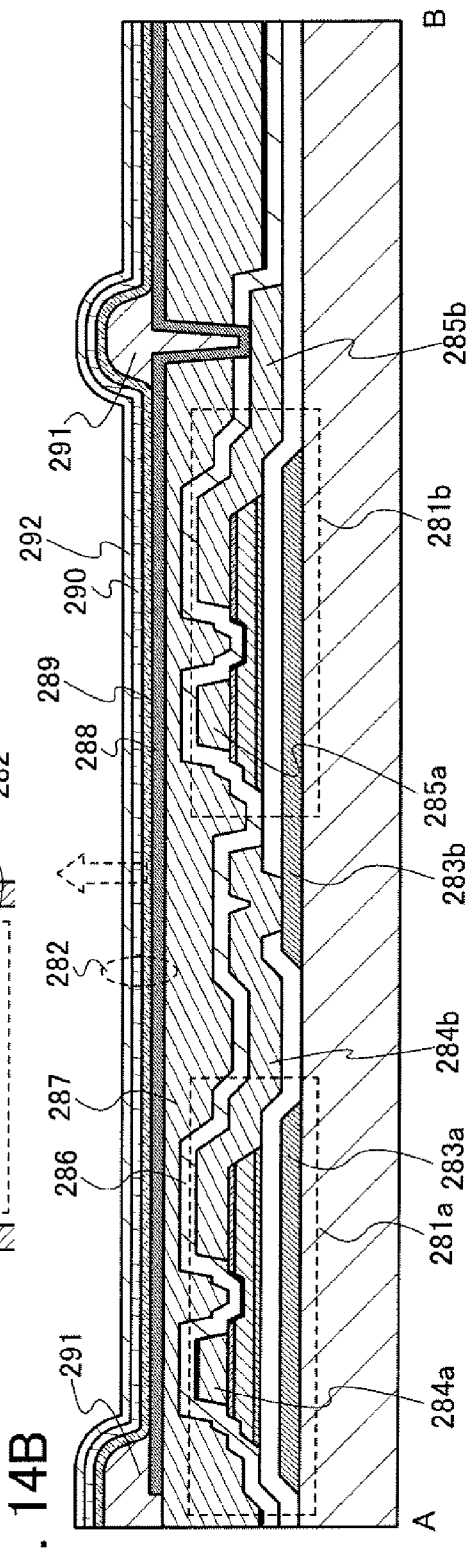
FIG. 14A
FIG. 14B alterd layer silicon nitride
amorphous silicon
amorphous silicon
silicon nitride
microcrystalline silicon alterd layer silicon nitride
amorphous silicon
amorphous silicon
silicon nitride
microcrystalline silicon Si   H   OH Si   H   OH   H

−OH

MANUFACTURING METHOD OF THIN FILM TRANSISTOR HAVING ALTERED SEMICONDUCTOR LAYER

BACKGROUND OF THE INVENTION

1. Field of the Invention

The present invention relates to a method for manufacturing a thin film transistor. Further, the present invention relates to a display device including the thin film transistor. Further, the present invention relates to an electro-optic device typified by a liquid-crystal display device and an electronic device including the display device as a component.

In this specification, a semiconductor device means any device which can function by utilizing semiconductor characteristics; a display device, a semiconductor circuit, an electronic device are all included in the category of the semiconductor device.

2. Description of the Related Art

In recent years, a technique for forming thin film transistors (TFTs) using a semiconductor thin film (with a thickness of several tens to several hundreds of nanometers) formed over a substrate having an insulating surface has been attracting attention. Thin film transistors have been widely applied to electronic devices such as ICs or display devices. In particular, of them, development as a switching element of a display device typified by a liquid-crystal display device has been quickened.

In display devices such as liquid-crystal display devices, amorphous silicon thin film transistors have been mainly in practical use as switching elements. Typically, channel-etched inversed staggered (or bottom-gate) TFTs including a channel formation region made of amorphous silicon have been used in many cases.

In the case of the channel-etched TFT, a back-channel portion, which is an interface between amorphous silicon and an interlayer insulating film, is exposed to the air and work environment during the manufacturing of the thin film transistor, so that the back-channel portion might be contaminated and impurities might be attached to the interface to affect the off-state current. In addition, in the case of the channel-etched TFT, the back-channel portion is etched so that the interface is damaged, which causes increase of the off-state current of transistor characteristics.

Japanese Published Patent Application No. H11-274504 has disclosed a technology for removing such impurities attached to the surface of the back-channel portion, in which surface treatment is carried out with plasma discharged using an atmosphere gas containing $H_2$ or He to remove the impurities attached to the surface of the back-channel portion.

SUMMARY OF THE INVENTION

The plasma discharge using the atmosphere gas containing $H_2$ or He, at the back-channel portion can remove the impurities; however, the back-channel portion is damaged by plasma, which might cause increase of the off-state current of TFT characteristics and decrease of the field-effect mobility.

In view of the foregoing, an object of one embodiment of the present invention is to increase the on-state current of a thin film transistor, decrease the off-state current, and improve the field-effect mobility. Further, an object of one embodiment of the present invention is to reduce variations of electrical characteristics of a TFT between elements, substrates, or lots. Further, an object of one embodiment of the present invention is to improve the image quality of a display device.

In order to achieve the above-described object, one embodiment of the present invention provides a method for manufacturing a thin film transistor. The method for manufacturing a thin film transistor includes the following steps: forming a gate insulating layer over a substrate having an insulating surface provided with a gate electrode; forming a microcrystalline semiconductor layer over the gate insulating layer; forming an amorphous semiconductor layer over the microcrystalline semiconductor layer; forming a semiconductor layer including an impurity element which imparts one conductivity type, which forms a source and drain regions over the amorphous semiconductor layer; forming a source and drain electrodes by using a mask over the semiconductor layer including an impurity element which imparts one conductivity type; removing, by first dry-etching, the part of the semiconductor layer including an impurity element which imparts one conductivity type, which is exposed from the source and drain electrodes, and partially the part of the amorphous semiconductor layer just below and in contact with the part of the semiconductor layer including an impurity element which imparts one conductivity type; removing, by second dry-etching, partially the part of the amorphous semiconductor layer which is exposed by the first dry-etching; and performing Mg plasma treatment on the surface of the part of the amorphous semiconductor layer which is exposed by the second dry-etching so that an altered layer (also referred to as an insulating layer) is formed.

The part of the amorphous semiconductor layer which is exposed by the first dry-etching is partially removed by the second dry-etching, so that impurities such as etching residues on the exposed surface of the amorphous semiconductor layer can be removed. Further, the plasma treatment is performed after the second dry-etching, so that the altered layer can be formed.

As for the plasma treatment, it is preferable that the surface of the part of the amorphous semiconductor layer which is exposed by the second dry-etching is irradiated with plasma including OH free radicals. By the irradiation with the plasma including OH free radicals on the surface of the part of the amorphous semiconductor layer which is exposed by the second dry-etching, the OH free radicals act on dangling bonds formed in the first and second dry-etching to terminate the dangling bonds with the OH free radicals. As a result, the stable altered layer can be formed on the exposed surface of the amorphous semiconductor layer. Accordingly, a thin film transistor with less off-state current and higher switching property can be formed. In addition, variations in electrical characteristics can be reduced.

It is preferable that the plasma treatment is performed with a plasma down-flow processing apparatus where a plasma generation chamber and a reaction chamber are separated from each other. The plasma down-flow processing apparatus in which samples are separate from a region of generating plasma is preferable in that plasma damage on the sample by plasma treatment can be suppressed.

As for the structure of a semiconductor layer forming the channel formation region of the thin film transistor according to one embodiment of the present invention, a first semiconductor layer including a plurality of crystalline regions is disposed on the side closer to the gate insulating layer and a second semiconductor layer having an amorphous structure is disposed on the side closer to the source and drain regions. By stacking the semiconductor including a plurality of crystalline regions (typically a microcrystalline semiconductor) and the semiconductor having an amorphous structure (typically an amorphous semiconductor), preferable off-state current and on-state current both can be realized. Alternatively, the second semiconductor layer having an amorphous structure can be used for the channel formation region of the thin film transistor.

According to one embodiment of the present invention, a thin film transistor with large on-state current, small off state current, and high switching property can be manufactured. Further, variations of electrical characteristics of a TFT between elements, substrates, or lots can be reduced. Further, a display device with improved image quality can be manufactured using the TFT.

BRIEF DESCRIPTION OF THE DRAWINGS

FIGS. 14A and 14B are a top view and a cross-sectional diagram illustrating one example of a display device to which the thin film transistor can be applied, according to one embodiment of the present invention.

DETAILED DESCRIPTION OF THE INVENTION

Figure 1A:
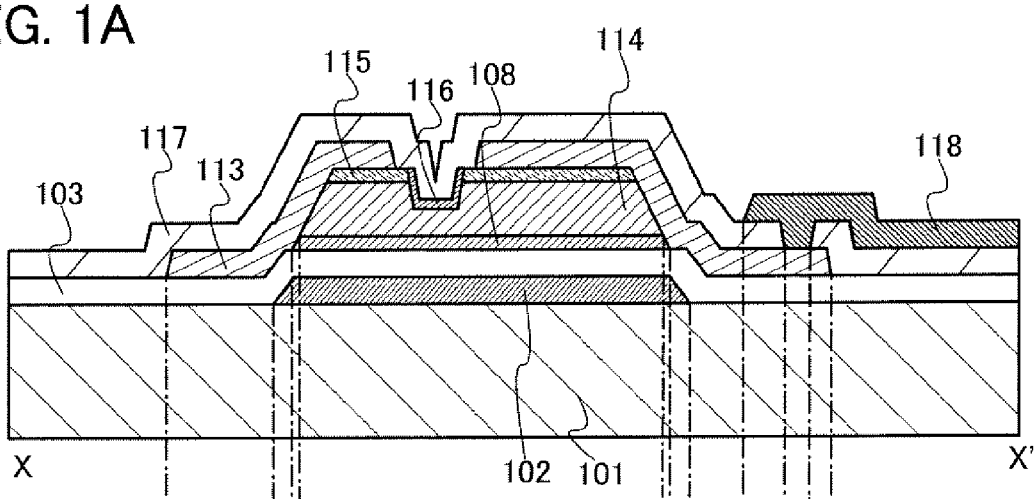
FIGS. 1A and 1B are a cross-sectional diagram and a top view illustrating a structure of a thin film transistor according to one embodiment of the present invention.

Embodiments and Examples of the present invention will be described in detail below with reference to drawings. However, the present invention is not limited to the following explanation, and it is easily understood by those skilled in the art that the mode and the detail of the present invention can be modified in various ways without departing from the purpose and scope of the present invention. Therefore, the present invention should not be interpreted as being limited to the description of the embodiments and examples to be given below. Note that for the description of each embodiment of the present invention with reference to drawings, the same portions in embodiment modes are denoted by the same reference numerals through the drawings.

In this specification, the "on-state current" means a current which flows between source and drain when the transistor is in an on-state. The "off-state current" means a current which flows between source and drain when the transistor is in an off-state. For example, a leak current which flows between source and drain when the gate voltage is lower than the threshold voltage in the case of an n-channel transistor is the off-state current.

In this specification also, a "film" means what has been formed over an entire surface and has not been patterned into a predetermined shape. A "layer" means what has been patterned into a desired shape with a resist mask or the like. This discrimination between "film" and "layer" is for convenience; and they are used without any discrimination in some cases. Also as for each layer in a stacked-layer film, the "film" and the "layer" are used without any discrimination in some cases.

Embodiment 1

In Embodiment 1, a thin film transistor according to one embodiment of the present invention will be described using drawings.

Figure 1B:
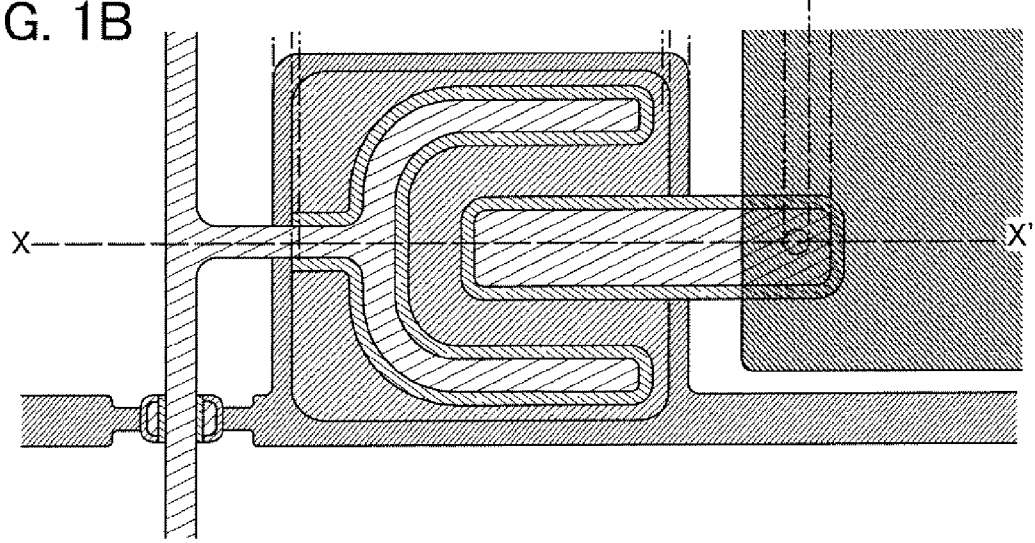

FIGS. 1A and 1B are a cross-sectional diagram and a top view of a thin film transistor according to one embodiment of the present invention. The thin film transistor shown in FIGS. 1A and 1B is a so-called an inversed staggered thin film transistor, which includes the following: a gate electrode layer 102 provided over a substrate 101; a gate insulating film 103 which covers the gate electrode layer 102; a first semiconductor layer 108 (also referred to as a microcrystalline semiconductor layer) provided over the gate insulating film 103; a second semiconductor layer 114 (also referred to as an amorphous semiconductor layer) provided on and in contact with the first semiconductor layer 108; a pair of impurity semiconductor layers 115 which is spaced from each other and in contact with the second semiconductor layer 114; and a pair of wiring layers 113 which is spaced from each other and in contact with the pair of impurity semiconductor layers 115. The first semiconductor layer 108 is a semiconductor layer including a plurality of crystalline regions. The second semiconductor layer 114 is a semiconductor layer having an amorphous structure. An insulating layer 116 is formed on the surface of a depressed portion in the second semiconductor layer 114. The pair of impurity semiconductor layers 115 is an impurity semiconductor layer 115 having one conductivity type in which an impurity element which imparts one conductivity type is added, and forms a source and drain regions. The pair of wiring layers 113 forms a source and drain electrodes. The pair of wiring layers 113 is spaced from each other in accordance with the pair of impurity semiconductor layers 115 which is spaced from each other. That is, one of the pair of wiring layers 113 is provided just above one of the pair of impurity semiconductor layers 115, and the other of the pair of wiring layers 113 is provided just above the other of the pair of impurity semiconductor layers 115. An insulating layer 117 which functions as a protection layer is provided over the wiring layers 113. Each layer is patterned into a predetermined shape.

In the thin film transistor according to Embodiment 1, carriers flow through the first semiconductor layer 108 when the transistor is on. The first semiconductor layer 108 including a plurality of crystal regions has higher electrical conductivity than the second semiconductor layer 114 having an amorphous structure, and therefore acts such that larger on-state current is generated than a thin film transistor in which the channel formation region is formed of an amorphous semiconductor. In the thin film transistor according to Embodiment 1 also, leak current flows through the second semiconductor layer 114 when the transistor is off. The second semiconductor layer 114 having an amorphous structure has lower electrical conductivity than the first semiconductor layer 108 including a plurality of crystal regions, and therefore acts such that smaller off-state current is generated than a thin film transistor in which the channel formation region is formed of a microcrystalline semiconductor. That is, with the provision of the first semiconductor layer and the second semiconductor layer on the gate insulating layer side and on the impurity semiconductor layer side, respectively, off-state current can be reduced and on-state current can be improved.

Between the gate insulating film 103 formed over the gate electrode layer 102 and the pair of impurity semiconductor layers 115 which is spaced from each other, the first semiconductor layer 108 and the second semiconductor layer 114 are stacked sequentially on the gate insulating film 103. The stack structure of the first semiconductor layer 108 and the second semiconductor layer 114 overlaps with the gate electrode layer 102 with the gate insulating film 103 interposed therebetween. The stack structure of the first semiconductor layer 108 and the second semiconductor layer 114 also overlaps with the pair of impurity semiconductor layers 115 and the pair of wiring layers 113. The stack structure of the first semiconductor layer 108 and the second semiconductor layer 114 extends at least in the channel length direction of a thin film transistor. In Embodiment 1, the stack structure of the first semiconductor layer 108 and the second semiconductor layer 114 continuously extends from one to the other of the pair of impurity semiconductor layers 115 which is spaced from each other; or from one to the other of the pair of wiring layers 113 which is spaced from each other.

The first semiconductor layer 108 is a semiconductor layer including a plurality of crystal regions. The first semiconductor layer 108 including a plurality of crystal regions is typically formed of a microcrystalline semiconductor; microcrystalline silicon, microcrystalline silicon germanium, microcrystalline germanium, or the like is used.

The microcrystalline semiconductor in Embodiment 1 means a semiconductor having an intermediate structure between amorphous and crystalline (including single crystalline and polycrystalline) structures. The microcrystalline semiconductor is a semiconductor having a third state which is stable in free energy; for example, a semiconductor in which the crystal grain is equal to or greater than 2 nm and equal to or less than 200 nm, preferably equal to or greater than 10 nm and equal to or less than 80 nm, more preferably equal to or greater than 20 nm and equal to or less than 50 nm. Raman spectrum of microcrystalline silicon, which is a typical example of the microcrystalline semiconductor, is shifted in lower wave-number side than 520/cm that represents the Raman spectrum of single crystal silicon. That is, the peak of the Raman spectrum of microcrystalline silicon is within the range from 520/cm that represents single crystal silicon to 480/cm that represents amorphous silicon. In addition, microcrystalline silicon contains hydrogen or halogen of at least 1 at. % or more in order to terminate a dangling bond. Moreover, a rare gas element such as helium, argon, krypton, or neon may be added to further promote lattice distortion, so that stability of the structure of the microcrystalline silicon is improved and a favorable microcrystalline semiconductor can be obtained. Description of such a first semiconductor layer is disclosed in, for example, U.S. Pat. No. 4,409,134. The definition of the microcrystalline semiconductor is not fixed at only the above-described grain size in Embodiment 1; the microcrystalline semiconductor can be replaced with any other semiconductor material having a property value equivalent to the above value.

The thickness of the first semiconductor layer 108 is equal to or more than 2 nm and equal to or less than 60 nm, preferably equal to or more than 10 nm and equal to or less than 30 nm.

The second semiconductor layer 114 is a semiconductor layer having an amorphous structure. The second semiconductor layer 114 having an amorphous structure is typically formed of an amorphous semiconductor; amorphous silicon, amorphous silicon containing germanium, or the like is used. The thickness of the second semiconductor layer 114 is equal to or greater than 30 nm and equal to or less than 200 nm, preferably equal to or greater than 50 nm and equal to or less than 150 nm.

The thin film transistor controls carriers (electrons or holes) flowing between the source region and the drain region by a voltage applied to the gate electrode. In Embodiment 1, between the pair of impurity semiconductor layers 115 which forms a source and drain regions (in the space between the pair of impurity semiconductor layers 115), carriers flow through the first semiconductor layer 108 and the second semiconductor layer 114 which overlap with the gate electrode layer 102.

In the case where the thin film transistor is on, a large number of carriers are excited at and near the interface between the gate insulating film 103 and the first semiconductor layer 108. Then, when the thin film transistor according to one mode of the present invention is turned on, the carriers excited in the first semiconductor layer 108 flow from one to the other of the pair of wiring layers 113. In the case where the thin film transistor according to one mode of the present invention is off, off-state current flows through the surface (back-channel) portion of the layer connecting the source region to the drain region.

The first semiconductor layer 108 including a plurality of crystal regions can be formed of a semiconductor (typically a microcrystalline semiconductor) in which a donor, which is an impurity element that supplies an electron as a carrier, or an acceptor, which is an impurity element that supplies a hole as a carrier is added. As the impurity element serving as a donor, a Group 15 element in the periodic table such as phosphorus, arsenic, or antimony is typically given. As the impurity element serving as an acceptor, a Group 13 element in the periodic table such as boron or aluminum is typically given.

The thin film transistor shown in FIGS. 1A and 1B illustrates the example in which the semiconductor layer which is in contact with the pair of impurity semiconductor layers 115 which form a source and drain regions has the depressed portion between the pair of impurity semiconductor layers 115. This type of the thin film transistor is also called a channel-etched thin film transistor. The thin film transistor according to one mode of the present invention has the depressed portion in the second semiconductor layer 114, and the insulating layer 116 exists in the depressed portion.

The thin film transistor shown in FIGS. 1A and 1B can be applied to a pixel transistor provided in a pixel portion of a light-emitting display device typified by a liquid-crystal display device or an EL display device. Therefore, in the illustrated example, an opening is formed in the insulating layer 117, a pixel electrode layer 118 is provided on the insulating layer 117, and the pixel electrode layer 118 is connected to one of the pair of wiring layers 113 through the opening.

Top view of one of the source and drain electrodes has a U-shape (also called a ko-shape using a letter "ko" in the Japanese katakana or a horseshoe-shape) so that U-shape one of the source and drain electrodes surrounds the other of the source and drain electrodes. The distance between the source electrode and the drain electrode is kept almost constant (see FIG. 1B).

The above-described shape of the thin film transistor enables the channel width of the thin film transistor to increase, so that the amount of current which flows therethrough is increased. In addition, variations in electrical characteristics can be reduced. Further, degradation of reliability due to misalignment of a mask pattern in the manufacturing process can be suppressed. One mode of the present invention is not limited to this shape: one of the source and drain electrodes of the thin film transistor does not necessarily have a U-shape.

Next, the method for manufacturing the thin film transistor shown in FIGS. 1A and 1B will be described. In the case of a thin film transistor including a microcrystalline semiconductor, carrier mobility is higher in an n-channel thin film transistor than in a p-channel thin film transistor. It is preferable that all thin film transistors formed over the same substrate have the same conductivity type because the number of manufacturing steps can be reduced. In view of this, a method for manufacturing an n-channel thin film transistor will be described in Embodiment 1.

Figure 2A:
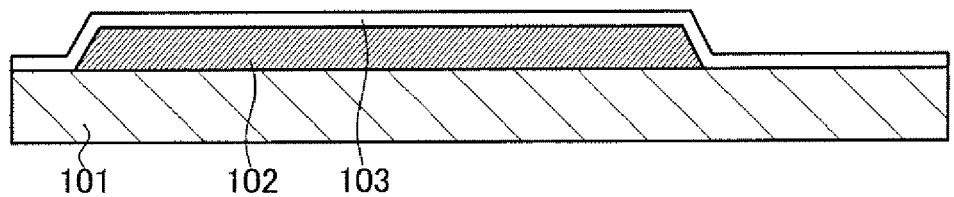
FIGS. 2A to 2D are cross-sectional diagrams illustrating a method for manufacturing the thin film transistor according to one embodiment of the present invention.

First, the gate electrode layer 102 is formed over the substrate 101 (see FIG. 2A).

As the substrate 101, a glass substrate; a ceramic substrate; a plastic substrate which has high heat resistance enough to withstand a process temperature of this manufacturing process; or the like can be used. In the case where a light-transmitting property is not needed for the substrate, a substrate in which an insulating layer is provided for the surface of a metal substrate made of a stainless alloy or the like may be used. As the glass substrate, for example, an alkali-free glass substrate made of barium-borosilicate glass, alumino-borosilicate glass, aluminosilicate glass, or the like may be used. When the substrate 101 is mother glass, the substrate may have any of the following sizes: in addition to 1st generation (for example, 320 mm×400 mm) to 7th generation (for example, 1870 mm×2200 mm), 8th generation (for example, 2200 mm×2400 mm), 9th generation (for example, 2400 mm×2800 mm) and 10th generation (for example, 2950 mm×3400 mm).

The gate electrode layer 102 can be formed with a single layer structure or a stack structure using a metal material such as molybdenum, titanium, chromium, tantalum, tungsten, aluminum, copper, neodymium, or scandium or an alloy material including any of these materials as a main component. The gate electrode layer 102 can be formed in such a manner that a conductive film is formed on the substrate 101 by a sputtering method or a vacuum evaporation method, a mask is formed on the conductive film by a photolithography method, an inkjet method, or the like, and the conductive layer is etched using the mask. Alternatively, the gate electrode layer 102 can be formed by discharging a conductive nanopaste of silver, gold, copper, or the like on the substrate by an inkjet method and baking the conductive nanopaste. In Embodiment 1, a conductive film is formed on the substrate 101 and etched using a resist mask formed using a photomask, so that the gate electrode layer 102 is formed.

In the case where aluminum is used as the gate electrode layer 102, an Al—Ta alloy in which aluminum is alloyed with tantalum added thereto is preferably used because hillocks are suppressed. Alternatively, an Al—Nd alloy in which aluminum is alloyed with neodymium added thereto is more preferably used because wiring with low resistance can be formed in addition to suppression of hillocks. Further alternatively, the gate electrode layer 102 may be formed using a semiconductor typified by polycrystalline silicon doped with an impurity element such as phosphorus, or an AgPdCu alloy. For example, a two-layer structure in which a molybdenum layer is stacked on an aluminum layer, a two-layer structure in which a molybdenum layer is stacked on a copper layer, or a two-layer structure in which a titanium nitride layer or a tantalum nitride layer is stacked on a copper layer is preferably used. By stacking a metal layer functioning as a barrier layer on a layer with low electric resistance, electric resistance can be reduced and a metal element of the metal layer can be prevented from diffusing into the semiconductor layer formed on the metal layer. Alternatively, a two-layer structure including a titanium nitride layer and a molybdenum layer, or a three-layer structure in which a 50-nm-thick tungsten layer, a 500-nm-thick alloy layer of aluminum and silicon, and a 30-nm-thick titanium nitride layer may be used. When the three-layer structure as described above is used, tungsten nitride may be used instead of tungsten of the first conductive film included in the gate electrode layer 102, an alloy of aluminum and titanium may be used instead of the alloy of aluminum and silicon of the second conductive film, and titanium may be used instead of titanium nitride of the third conductive film. For example, a molybdenum layer is stacked on an Al—Nd alloy layer, so that a conductive film which has excellent heat resistance and low electrical resistance can be formed. Note that as barrier metal which increases adhesion between the gate electrode layer 102 and the substrate 101 and prevents diffusion into a base, a nitride layer of any of the above-described metal materials may be provided between the substrate 101 and the gate electrode layer 102.

Note that the side surface of the gate electrode layer 102 is preferably tapered. This is because disconnection of a wiring at a step when an insulating layer, a semiconductor layer, and a wiring layer are formed later on the gate electrode layer 102. The side surface of the gate electrode layer 102 is tapered by etching while reducing the resist mask. For example, etching can be performed while reducing the resist by oxygen gas contained in an etching gas.

Further, a gate wiring (a scan line) can be formed at the same time by the step for forming the gate electrode layer 102. Furthermore, a capacitor line included in the pixel portion can also be formed at the same time. Note that a scan line means a wiring for selecting a pixel and a capacitor line means a wiring which is connected to one electrode of a capacitor of each pixel. However, the present invention is not limited thereto: one or both of the gate wiring and the capacitor wiring may be formed by a separate step from the gate electrode layer 102.

Next, the gate insulating film 103 is formed to cover the gate electrode layer 102 (see FIG. 2A). The gate insulating film 103 can be formed using a single layer or a stack layer selected from a silicon oxide film, a silicon nitride film, a silicon oxynitride film, and a silicon nitride oxide film by a CVD method, a sputtering method, or the like. The gate insulating film 103 may also formed with a microwave plasma CVD apparatus having high frequencies (about 1 GHz). The high frequency with the use of the microwave plasma CVD apparatus enables a dense layer to be formed as the gate insulating film 103. By densely forming the gate insulating film 103, the withstand voltage between the gate electrode and the drain and source electrodes can be improved so that a highly reliable thin film transistor can be formed. By forming the gate insulating film 103 using silicon oxynitride, variations of threshold voltage of the transistor can be suppressed.

In this specification, silicon oxynitride means a substance having higher composition of oxygen than nitrogen and showing concentration ranges of oxygen, nitrogen, silicon, and hydrogen from 50 to 70 at. %, 0.5 to 15 at. %, 25 to 35 at. %, and 0.1 to 10 at. %, respectively in the measurement using Rutherford backscattering spectrometry (RBS) and hydrogen forward scattering (HFS). Further, silicon nitride oxide means a substance having higher composition of nitrogen than oxygen, and showing the concentration ranges of oxygen, nitrogen, silicon, and hydrogen from 5 to 30 at. %, 20 to 55 at. %, 25 to 35 at. %, and 10 to 30 at. %, respectively in the measurement using RBS and HFS. Note that percentages of nitrogen, oxygen, silicon, and hydrogen fall within the ranges given above, where the total number of oxygen atoms, nitrogen atoms, silicon atoms, and hydrogen atoms contained in silicon oxynitride or silicon nitride oxide is defined as 100 at. %.

Figure 2B:
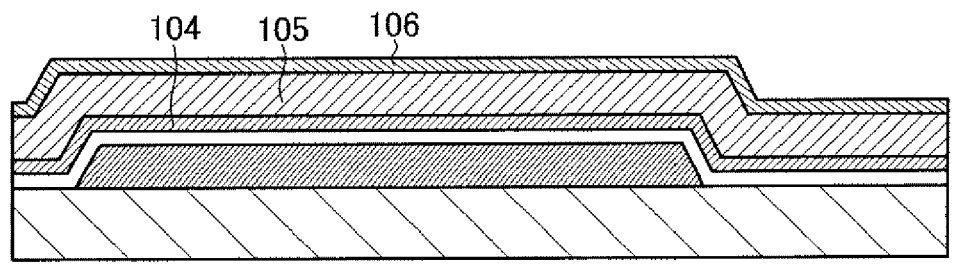

Next, a first semiconductor film 104 including a plurality of crystal regions is formed over the gate insulating film 103 (see FIG. 2B). The first semiconductor film 104 is deposited using plasma of a reaction gas in which a semiconductor material gas and a dilution gas are mixed at a ratio capable of formation of a semiconductor including a plurality of crystal regions, typically a microcrystalline semiconductor. In specific, a reaction gas (also called a source gas) in which a semiconductor material gas typified by silane is diluted with hydrogen or the like is introduced into a reaction chamber and a predetermined pressure is kept to generate glow discharging plasma, so that a film (semiconductor film including a plurality of crystal regions) is deposited on the substrate disposed in the reaction chamber. As the semiconductor material gas, silicon hydride typified by silane or disilane can be used. Hydrogen is a typical example of the dilution gas; and as well as silicon hydride and hydrogen, one or more rare gas elements selected from helium, argon, krypton, and neon can be used for the dilution for forming the first semiconductor film 104. For the dilution, the flow rate of hydrogen to silicon hydride is equal to or greater than 5:1 and equal to or less than 200:1, preferably equal to or greater than 50:1 and equal to or less than 150:1, more preferably 100:1. For example, the first semiconductor film 104 can be formed using glow discharge plasma of a gas in which a semiconductor material gas typified by silane is diluted with hydrogen or the like in a process chamber (also called a chamber, a reaction chamber, a film formation chamber, or a reaction space) in a plasma CVD apparatus. Instead of silicon hydride, silicon chloride such as $SiH_2Cl_2$, $SiHCl_3$, or $SiCl_4$, or silicon fluoride such as $SiF_4$ can be used. Glow discharge plasma is generated by applying high-frequency power at 1 to 20 MHz, typically 13.56 MHz, or high-frequency power at 20 to about 120 MHz, typically 27.12 or 60 MHz. Alternatively, high-frequency power at microwaves of 1 GHz or more may be applied. In addition, the film formed by microwave plasma at a frequency of 1 GHz or more has high electron density, and silicon hydride can be easily dissociated. Therefore, with the use of the microwave plasma, the semiconductor film including a plurality of crystal regions can be manufactured more easily than with a high-frequency plasma CVD method at a frequency of several tens to several hundreds of megahertz, so that deposition rate can be improved and productivity can be improved.

The first semiconductor film 104 including a plurality of crystal regions is formed with a thickness equal to or greater than 2 nm and equal to or less than 60 nm, preferably equal to or greater than 10 nm and equal to or less than 30 nm. In the case where the semiconductor film including a plurality of crystal regions is a microcrystalline semiconductor film, it is preferable that the semiconductor film is formed thin so that throughput can be improved because the deposition rate of the microcrystalline semiconductor film is low as a tenth to a hundredth as the deposition rate of an amorphous semiconductor layer.

Next, a second semiconductor film 105 having an amorphous structure is formed on the first semiconductor film 104 (see FIG. 2B). The second semiconductor film 105 having an amorphous structure, typically, an amorphous semiconductor film, is formed using plasma using a semiconductor material gas typified by silane. The same material to the material of the first semiconductor film 104 can be used as the semiconductor material gas; silicon hydride typified by silane or disilane, silicon fluoride, or silicon chloride is diluted with one or more kinds of rare gas elements selected from helium, argon, krypton, and neon to be deposited by a plasma CVD method. Alternatively, hydrogen at a flow rate which is 1 to 10 times, preferably 1 to 5 times as high as that of silicon hydride is used to dilute, so that a hydrogen-containing amorphous semiconductor can be formed. Further, a halogen element such as fluorine or chlorine may be added to the above-described hydrogen-containing amorphous semiconductor.

Further alternatively, as the second semiconductor film 105 having an amorphous structure, an amorphous semiconductor can be used by sputtering a semiconductor target of silicon, germanium, or the like used as a target with hydrogen or a rare gas. That is, the second semiconductor film 105 can be formed by a sputtering method.

Next, an impurity semiconductor film 106 having one conductivity type in which an impurity element which imparts one conductivity type is added is formed over the second semiconductor film 105 (see FIG. 2B).

In this embodiment, in order to form an n-channel thin film transistor, a semiconductor film containing an impurity element which serves as a donor and imparts one conductivity type (the impurity element is also called an impurity element which imparts n-type conductivity) (the semiconductor film is an impurity semiconductor film) is formed as the impurity semiconductor film 106. By later etching the impurity semiconductor film 106, a pair of impurity semiconductor layers having one conductivity type which form a source region and a drain region is formed. In the case where an n-channel thin film transistor is formed, phosphorous may be added as the impurity element which serves as a donor when the impurity semiconductor film 106 is formed: the impurity semiconductor film 106 can be formed with a semiconductor material gas typified by silane in which a gas containing an impurity element which imparts n-type conductivity such as phosphine ($PH_3$) is added. The impurity semiconductor film 106 can be formed using an amorphous semiconductor. The amorphous semiconductor may contain crystal grains. Alternatively, a microcrystalline semiconductor may be used. The impurity semiconductor film 106 may be formed with a thickness equal to or greater than 30 nm and equal to or less than 100 nm.

In the case where a p-channel thin film transistor is formed, a semiconductor film containing an impurity element which serves as an acceptor and imparts one conductivity type (the impurity element is also called an impurity element which imparts p-type conductivity) (the semiconductor film is an impurity semiconductor film) is formed as the impurity semiconductor film 106. Boron may be added as the typical impurity element which serves as an acceptor: a gas containing an impurity element which imparts p-type conductivity such as diborane ($B_2H_6$) may be added to a semiconductor material gas typified by silane.

Figure 2C:
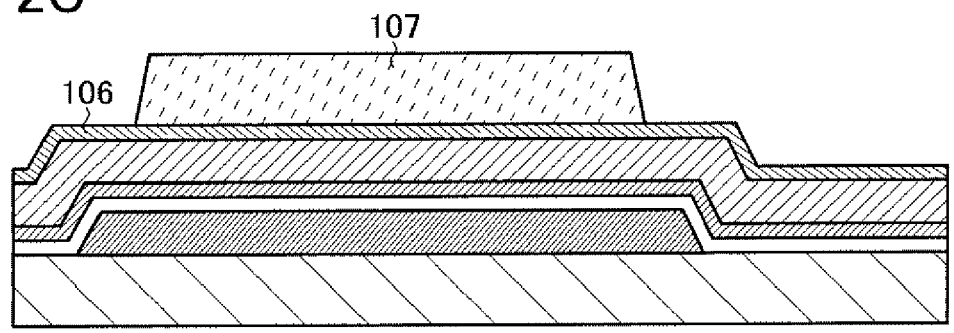

Next, a first resist mask 107 is formed over the impurity semiconductor film 106 (see FIG. 2C). A resist mask is formed using a photomask, as the first resist mask 107.

Figure 2D:
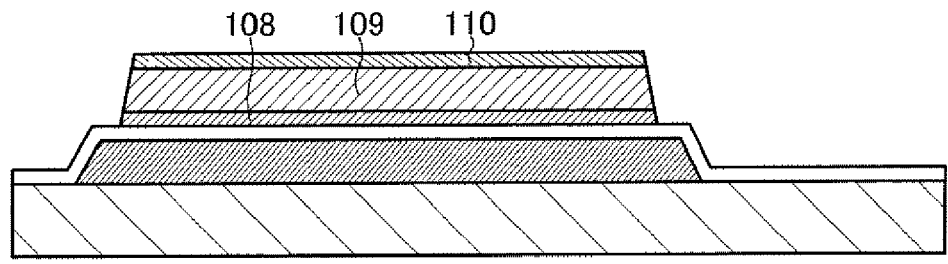

Next, the impurity semiconductor film 106, the second semiconductor film 105, and the first semiconductor film 104 are etched using the first resist mask 107. By this step, the first semiconductor film 104, the second semiconductor film 105, and the impurity semiconductor film 106 are separated for each element. Through the separation for each element, the first semiconductor layer 108, a second semiconductor layer 109, and an impurity semiconductor layer 110 which are patterned into a predetermined shape are obtained (see FIG. 2D). After that, the first resist mask 107 is removed.

Figure 3A:
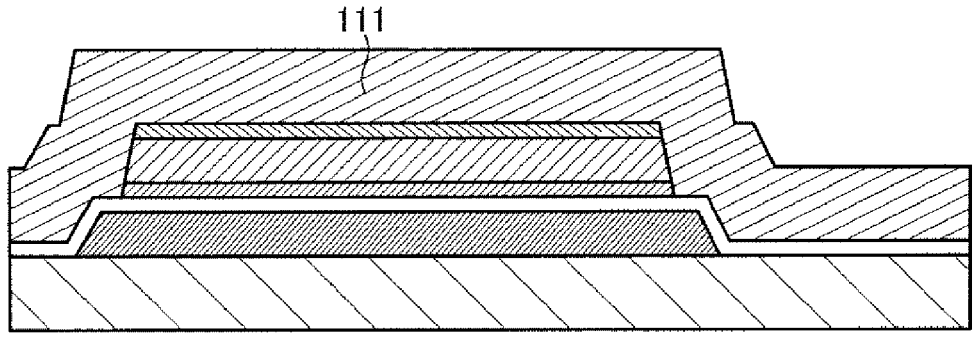
FIGS. 3A to 3C are cross-sectional diagrams illustrating the method for manufacturing the thin film transistor according to one embodiment of the present invention.

Next, a conductive film 111 is formed over the gate insulating film 103 and the impurity semiconductor layer 110. The conductive film 111 is formed so as to cover the side and top surfaces of the impurity semiconductor layer 110 and the side surfaces of the second semiconductor layer 109 and the first semiconductor layer 108 (see FIG. 3A).

The conductive film 111 can be formed of a single layer or a stacked layer using aluminum, copper, titanium, neodymium, scandium, molybdenum, chromium, tantalum, tungsten, or the like. Alternatively, an aluminum alloy to which an element for preventing a hillock is added (e.g., an Al—Nd alloy which can be used for the gate electrode layer 102) may be used. Further alternatively, crystalline silicon to which an impurity element which imparts one conductivity type is added may be used. The conductive film 111 may have a stack structure where a film on the side which is in contact with the crystalline silicon to which an impurity which imparts one conductivity type is added is formed using titanium, tantalum, molybdenum, tungsten, or nitride of any of these elements and aluminum or an aluminum alloy is formed thereover. Further alternatively, the conductive film 111 may have a stack structure where an upper side and a lower side of aluminum or an aluminum alloy is sandwiched with titanium, tantalum, molybdenum, tungsten, or nitride of any of these elements. For example, the conductive film 111 may have a three-layer structure in which an aluminum film is sandwiched with molybdenum films.

The conductive film 111 is formed by a CVD method, a sputtering method, or a vacuum evaporation method. Alternatively, the conductive film 111 may be formed by discharging a conductive nanopaste of silver, gold, copper, or the like by a screen printing method, an inkjet method, or the like and baking it.

Next, a second resist mask 112 is formed over the conductive film 111. The second resist mask 112 is formed using a photomask as is in the case of forming the first resist mask 107.

Figure 3B:
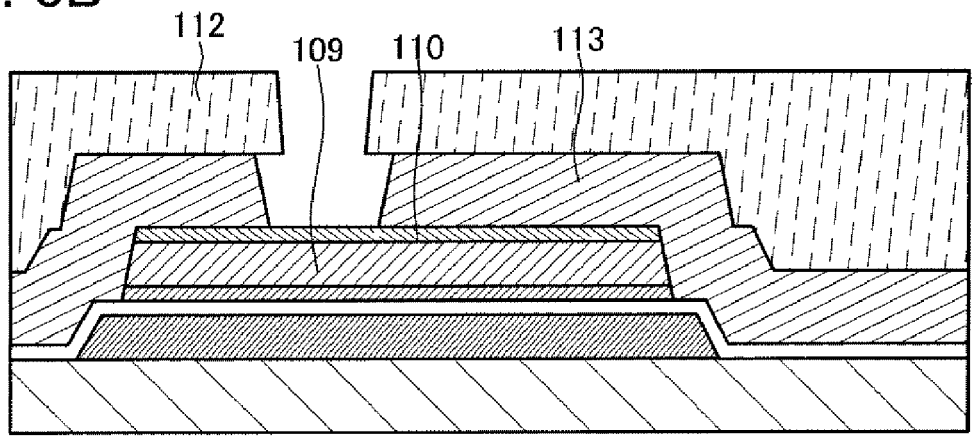

Next, the conductive film 111 is etched using the second resist mask 112 to form the pair of wiring layers 113 (see FIG. 3B). The pair of wiring layers 113 forms a source electrode and a drain electrode. The etching of the conductive film 111 is performed by wet-etching. By the wet-etching, the conductive film 111 is isotropically etched. As a result, the conductive film 111 is side-etched in the direction to the inner side of the second resist mask 112, so that the separated pair of wiring layers 113 is formed. By employing wet-etching, between the separated pair of wiring layers 113, the side surfaces of the pair of wiring layers 113 which faces each other are not aligned with the side surfaces of a pair of impurity semiconductor layers later formed which faces each other: the side surfaces of the pair of impurity semiconductor layers which forms a source region and a drain region are positioned on the outer side of the side surfaces of the wiring layers 113. The wiring layers 113 function as not only a source electrode and a drain electrode but also as a signal line. However, the present invention is not limited thereto: a wiring layer which forms a signal line may be provided separately from the wiring layers which form a source electrode and a drain electrode.

Figure 3C:
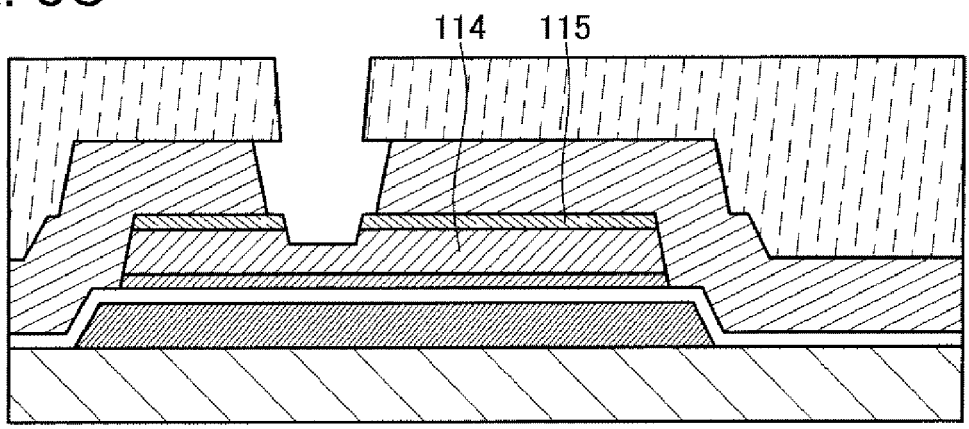

Next, the impurity semiconductor layer 110 is etched with the second resist mask 112 as it is (see FIG. 3C). By this etching, the pair of impurity semiconductor layers 115 which is patterned into a predetermined shape is obtained. The pair of impurity semiconductor layers 115 is spaced from each other and forms a source region and a drain region.

Also by the etching of forming the pair of impurity semiconductor layers 115 which forms a source region and a drain region, part of the second semiconductor layer 109 is etched away to form a depressed portion, so that the second semiconductor layer 114 is formed. It is preferable that the etching of the impurity semiconductor layer 110 is controlled such that part of the second semiconductor layer 109 remains. It is preferable that the thickness of the part of the second semiconductor layer 114, which remains in the depressed portion after the etching of the impurity semiconductor layer 110 (the thickness is the thickness of the depressed portion of the second semiconductor layer 114) is about half the thickness before the etching. That is, after the formation of the pair of impurity semiconductor layers 115 by the etching, in the second semiconductor layer 114 under the pair of impurity semiconductor layers 115, the thickness thereof is different between the region just below the impurity semiconductor layer 115 and the region other than the region just below the impurity semiconductor layer 115 (the region just below the space between the impurity semiconductor layers 115). This is because the second semiconductor layer just below the impurity semiconductor layers 115 is not etched but the second semiconductor layer other than the second semiconductor layer just below the impurity semiconductor layers 115 is etched in the step of forming the impurity semiconductor layers 115 which form a source region and a drain region. The depressed portion is a surface of the layer which connects the source region to the drain region and is also called a back-channel.

However, the surface of the depressed portion is damaged by the etching at the time of forming the depressed portion by etching part of the second semiconductor layer away. The surface of the depressed portion is subjected to plasma of a gas atmosphere containing hydrogen, nitrogen, oxygen, carbon, boron, or chlorine in the same apparatus as the apparatus used for dry-etching, so that an altered layer in which the above-described element is introduced is formed on the surface of the depressed portion. An altered layer in which an element in the air is introduced is formed by exposing the surface of the depressed portion to the air. The altered layer containing carbon, chlorine, or the like formed on the surface of the depressed portion adversely affects electrical characteristics such as increase in off-state current or decrease in mobility. Further, the etching away of the part of the second semiconductor layer causes damage to the second semiconductor layer, such as generation of defects. Such a defect or an impurity element which exists on the surface of the second semiconductor layer becomes a leak path, which brings increase in off-state current.

Next, dry-etching is performed with the second resist mask 112 as it is. By performing the dry-etching in the condition so as not to damage the second semiconductor layer 114 after the depressed portion is formed by etching the part of the second semiconductor layer away, impurities such as etching residues on the surface of the depressed portion can be removed.

The dry-etching condition is set such that the exposed second semiconductor layer 109 is not damaged and the etching rate of the second semiconductor layer 109 is low. That is, the condition by which the exposed surface of the second semiconductor layer 109 is not damaged as much as possible and the thickness of the exposed second semiconductor layer 109 is not decreased as much as possible is used. The exposed second semiconductor layer 109 corresponds to the surface of the depressed portion formed in the second semiconductor layer 109. As an etching gas, a chlorine-based gas is used: typically, a $Cl_2$ gas is used. There is not particular limitation on the etching method: an ICP method, a CCP method, an ECR method, a RIE (reactive ion etching) method, or the like can be used.

In this embodiment, as one example of the above-described dry-etching condition, the following is employed: plasma is generated with a flow rate of the $Cl_2$ gas of 100 sccm, a pressure in the chamber of 0.67 Pa, a lower-electrode temperature of $-10°$ C., and an RF (13.56 MHz) power of 2000 W applied to a coil of an upper-electrode, and no power (0 W) is applied to the substrate 101 (the substrate provided with the second semiconductor layer 109), and etching for 30 seconds is performed. It is preferable that temperature of the inner wall of the chamber is about 80° C.

Figure 5A:
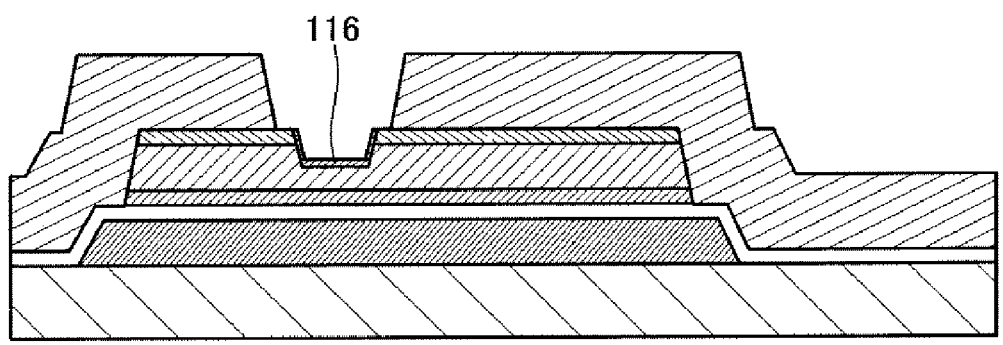
FIGS. 5A and 5B are cross-sectional diagrams illustrating the method for manufacturing the thin film transistor according to one embodiment of the present invention.

In view of this, after the dry-etching is performed on the second semiconductor layer, water plasma treatment is performed with the second resist mask 112 as it is so that the insulating layer 116 is formed (see FIG. 5A). By thus doing, the altered layer (the insulating layer 116) can be formed so as to be stable on the surface of the depressed portion in the second semiconductor layer, so that the damage caused by the formation of the depressed portion in the second semiconductor layer can be repaired. The insulating layer 116 is preferably formed using silicon oxide. Further, the quality of the interface between the surface of the depressed portion and the insulating layer 116 can be improved. With the insulating layer 116, electrical characteristics of the thin film transistor can be improved: for example, the off-state current is decreased and the field-effect mobility is increased. Then, the second resist mask 112 can be removed by plasma exposure using a $H_2O$ gas.

The water plasma treatment can be performed by generating water plasma using a gas containing water as its main component typified by water vapor ($H_2O$ vapor), introduced into a reaction chamber. By making $H_2O$ plasma, an oxygen (O) atom, a hydrogen (H) atom, or an excited molecule of $H_2O$, and further, an OH free radical are generated. It is possible to use any substance as long as it generates OH free radicals in the state of plasma: hydrogen peroxide solution ($H_2O_2$) can be used as well as the gas containing water as its main component typified by water vapor ($H_2O$ vapor). There is no particular limitation on the plasma generation method: an inductively coupled plasma (ICP) method, a capacitively coupled plasma (CCP) method, an electron cyclotron resonance (ECR) method, a helicon method, or the like can be used. Further, it is preferable that the plasma treatment is performed at temperatures ranging from 100° C. to 280° C., preferably temperatures ranging from 220° C. to 280° C. This is because the ashing rate of the resist mask is decreased if the temperature of the plasma treatment is too low whereas OH radicals by which dangling bonds of the second semiconductor layer are terminated are eliminated and the termination of the dangling bonds is interrupted if the temperature of the plasma treatment is too high.

Figure 4:
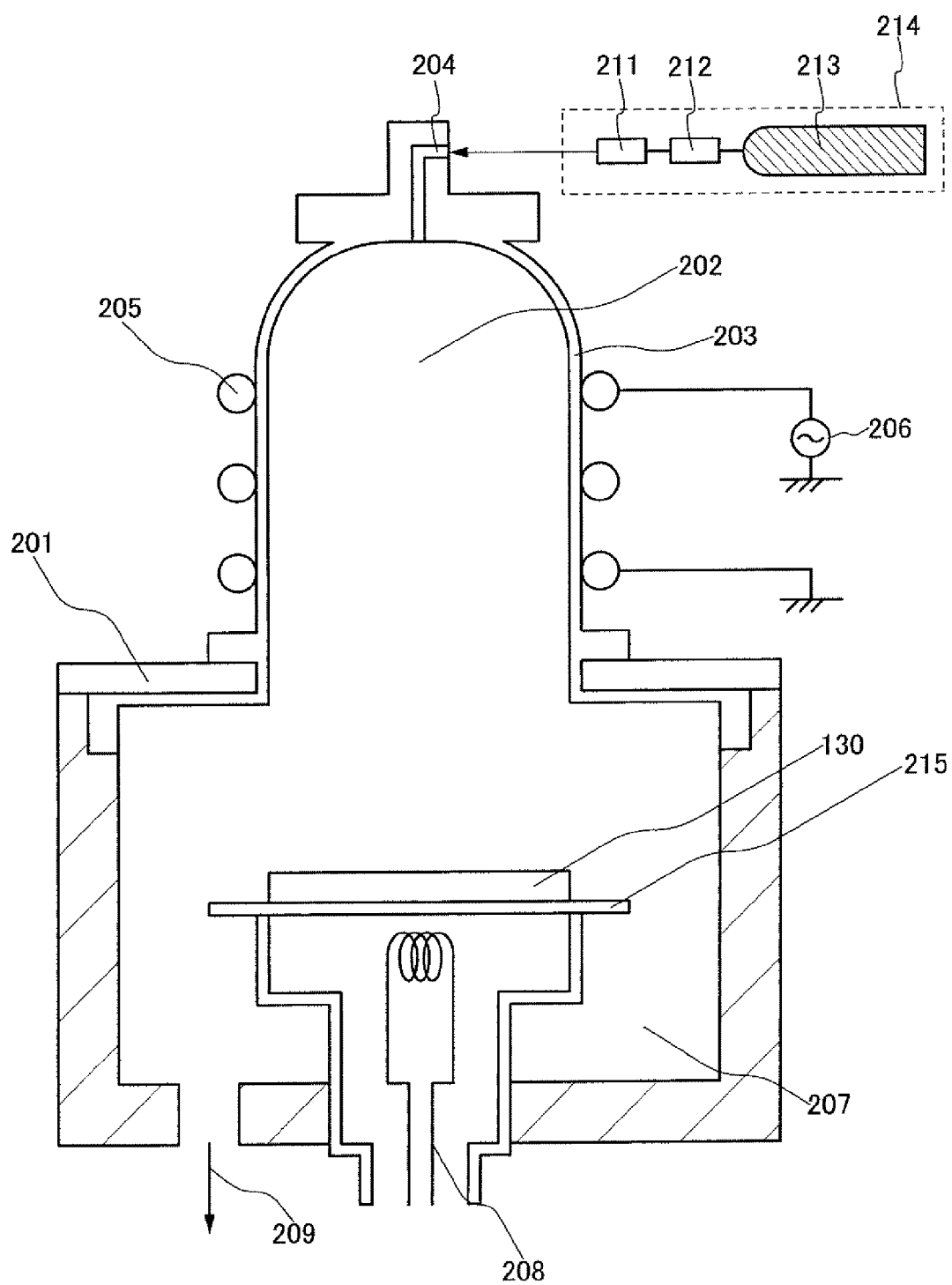
FIG. 4 is a general structure diagram illustrating one example of a plasma processing apparatus.

FIG. 4 is a general structural diagram illustrating an example of a plasma treatment apparatus used in Embodiment 1. In Embodiment 1, a so-called down-flow ICP plasma treatment apparatus in which an object 130 to be processed is disposed in a plasma atmosphere existing on the downstream side of a plasma generation chamber is used.

On the upper portion of a vacuum case 201 included in the main body of the plasma treatment apparatus, a discharge tube 203 inside of which a plasma generation chamber 202 is formed is provided. For example, a gas introduction tube 204 is provided at the top of the discharge tube 203 made of quartz. A process gas is introduced through the gas introduction tube 204 into the plasma generation chamber 202. The gas introduction tube 204 is connected to a gas supply unit 214. The gas supply unit 214 includes a mass flow controller 211, vaporizer 212, a cylinder 213, and the like.

On the outer portion of the discharge tube 203, a discharge coil 205 for exciting plasma in the plasma generation chamber 202 is spirally wrapped around. In order to supply power to the discharge coil 205, the discharge coil 205 is connected to one terminal of a high-frequency (radio frequency) power source 206 (hereinafter referred to as an RF power source). Therefore, power with a high-frequency of 100 kHz to 100 MHz, for example, about 13.56 MHz is supplied to the discharge coil 205 by the RF power source 206. The other terminal of the RF power source 206 is connected to ground.

A down flow chamber 207 is formed under the vacuum case 201, that is, below the plasma generation chamber 202. In this down flow chamber 207, a stage 215 for supporting the object 130 to be processed is provided and plasma is introduced from the plasma generation chamber 202. Into the stage 215 for upward supporting the object 130 to be processed (the substrate 101 with the state of FIG. 3C in Embodiment 1), a heater 208 for heating the object 130 to be processed so that the plasma treatment is promoted is incorporated. In order to set the pressure in the vacuum case 201 at a pressure as low as 1.0 Pa, an exhaust outlet 209 is provided by forming an opening in the lower wall of the down flow chamber 207 and connected to a vacuum pump which is not shown.

The sample is spaced from the region where plasma is generated in such a down-flow plasma treatment apparatus, which is preferable in that plasma damage on the sample due to plasma treatment can be suppressed.

Next, an example of the method for performing water plasma treatment on a substrate with the use of the above-described plasma treatment apparatus will be described below.

First, the temperature of the stage 215 is set at 250° C. by the heater 208 to heat the object 130 to be processed. The pressure of the chamber is set at 66.5 Pa and RF (13.56 MHz) power with 1800 W is applied to the coil electrode so that plasma is generated, and power is applied to the substrate side. Then, pure water is supplied from the cylinder 213 and vaporized by the vaporizer 212, so that water gas ($H_2O$) at a flow rate of 300 sccm is introduced into the plasma generation chamber 202. In the plasma generation chamber 202, $H_2O$ is made to be plasma by the microwave. Then, plasma $H_2O$ is introduced into the down-flow chamber 207 in the downstream of the gas, and plasma $H_2O$ is supplied to the second semiconductor layer 114 and the second resist mask 112 on the stage 215 of the down-flow chamber 207. The supply of such plasma $H_2O$ is performed for 180 seconds.

Through the treatment, the insulating layer 116 is formed on the surface of the depressed portion of the second semiconductor layer 114, and the second resist mask 112 reacts with the plasma $H_2O$ to be calcified and removed.

Dry-etching may be further performed in the condition such that the second semiconductor layer 114 is not damaged, after the depressed portion of the second semiconductor layer 114 is formed, so that impurities such as residues or the like on the exposed second semiconductor layer 114 can be removed. By performing the water plasma treatment using an $H_2O$ gas following the dry-etching, OH free radicals act on the dangling bonds (damage) formed at the time of the dry-etching on the surface of the depressed portion of the second semiconductor layer, so that the dangling bonds can be terminated with the OH free radicals. Accordingly, the stable altered layer (the insulating layer 116) can be formed on the surface of the depressed portion of the second semiconductor layer, so that defects formed at the time of forming the depressed portion of the second semiconductor layer can be repaired. Further, the interface quality between the surface of the depressed portion and the insulating layer 116 can be improved. Consequently, the water plasma treatment can improve the film quality, which leads to improvement of electrical characteristics of the thin film transistor.

The exposure of the second resist mask 112 to the water plasma can remove the second resist mask 112. By exposing the second resist mask 112 to the water plasma, chlorine and the like which cause corrosion, in the substrate can be removed by a product generated from the water plasma. Further, generation of corrosion in the wiring formed using a metal film can be suppressed, so that resist residues can be easily removed. Accordingly, by forming the depressed portion of the second semiconductor layer 114, further performing dry-etching in the condition such that the second semiconductor layer 114 is not damaged, and after that, performing water plasma treatment using a $H_2O$ gas following the dry-etching, a thin film transistor with high switching characteristics, high on-state current, and low off-state current can be formed. Further, variations in electrical characteristics can be reduced.

Here, the cause of reducing the off-state current due to the water plasma treatment was examined. In the water plasma treatment, main production species are H atoms and OH radicals. The state where H atoms and OH radicals act on the dangling bonds (defects) of Si was examined.

Simulation was performed on each of a model in which there is one dangling bond of Si (Model 1), a model in which one dangling bond of Si is terminated with H atoms (Model 2), and a model in which one dangling bond of Si is terminated with an OH radical (Model 3). As the software for simulation, CASTEP (software of first principle calculation using density functional theory) produced by Accelrys Software Inc. was used. Further, in Embodiment 1, one Si atom was removed out of a lattice of 64 Si atoms, that is, 63 Si atoms were used.

Figure 29A:
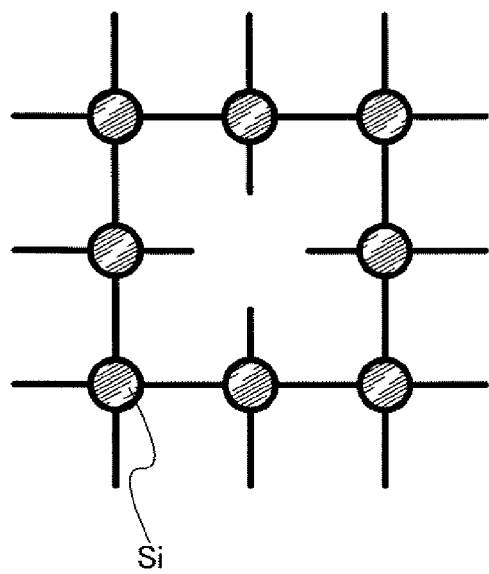
FIGS. 29A to 29C are diagrams illustrating simulation models.
Figure 29C:
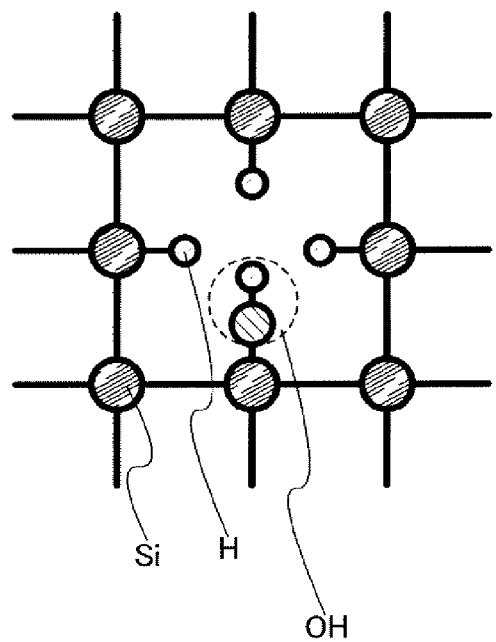
Figure 29B:
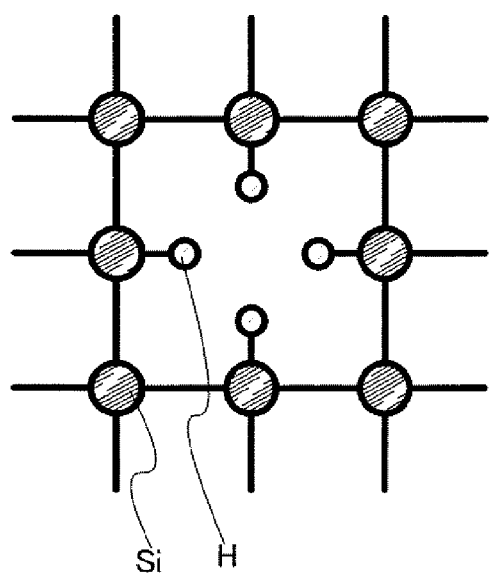

FIG. 29A is a model diagram of a lattice structure (Model 1) of a silicon film in which there is one dangling bond of Si. FIG. 29B is a model diagram of a lattice structure (Model 2) of a silicon film in which one dangling bond of Si is terminated with H atoms. FIG. 29C is a model diagram of a lattice structure (Model 3) of a silicon film in which one dangling bond of Si is terminated with an OH radical.

Figure 30:
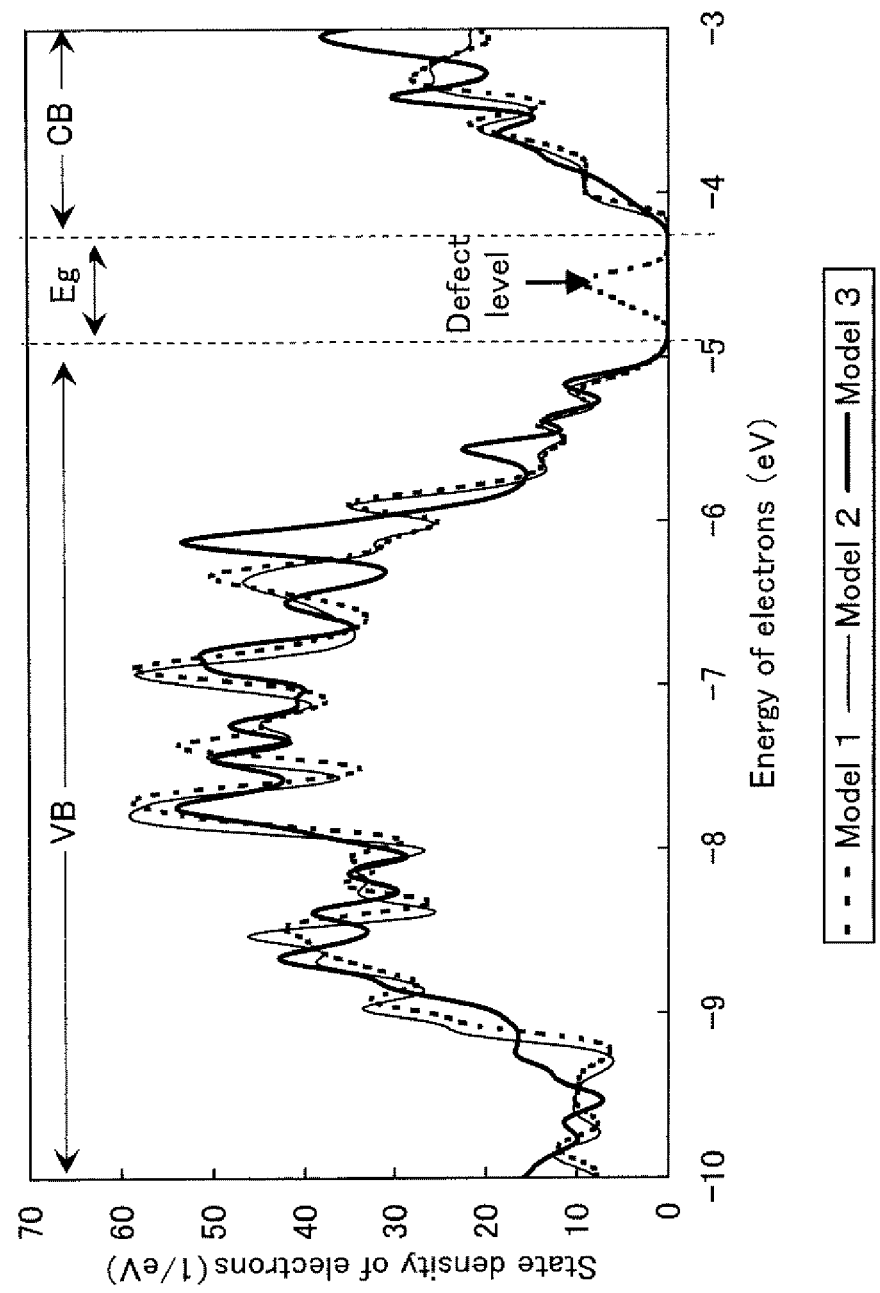
FIG. 30 shows calculation results using Models 1 to 3.

Calculation results using Models 1 to 3 are shown in FIG. 30. In FIG. 30, the horizontal axis indicates the energy of electrons when the vacuum level is at the coordinate origin and the vertical axis indicates the state density of the electrons. Simulation results of the Model 1, the Model 2, and the Model 3 are shown by a dotted line, a thin solid line, and a bold solid line, respectively.

The band where the energy of electrons is equal to or lower than −5.0 eV is a valence band (referred to as VB), the band where the energy of electrons is equal to or higher than −4.1 eV is a conduction band (referred to as CB), and the range from −5.0 eV to −4.1 eV is a bandgap (referred to as Eg). In this simulation, the bandgap was 0.9 eV which was smaller than 1.2 eV that was an experimental value. The bandgap being smaller is, however, a problem which is common in the density functional theory and does not mean the inadequacy of this simulation.

It is found that there are some state densities of the electrons in the bandgap in the Model 1, that is, when one dangling bond is contained. These are defect levels due to the dangling bonds. If a defect exists in a silicon film, the defect becomes a leak path; and therefore, if a film having such a defect is used as the second semiconductor layer for the thin film transistor, the off-state current is generated.

On the other hand, in the Mode 2, that is, when one dangling bond is terminated with H atoms, and in the Mode 3, that is, when one dangling bond is terminated with one OH radical and three H atoms, the state density of electrons is 0 in the bandgap, from which it is found that no defect level is contained. Accordingly, the silicon film containing a defect is exposed to H atoms or OH radicals so that a dangling bond is terminated with the H atoms or OH radicals, thereby decreasing the defect level of the silicon film. It is found that by using such a film with the decreased defect level, for the thin film transistor, the off-state current is decreased.

Figure 31A:
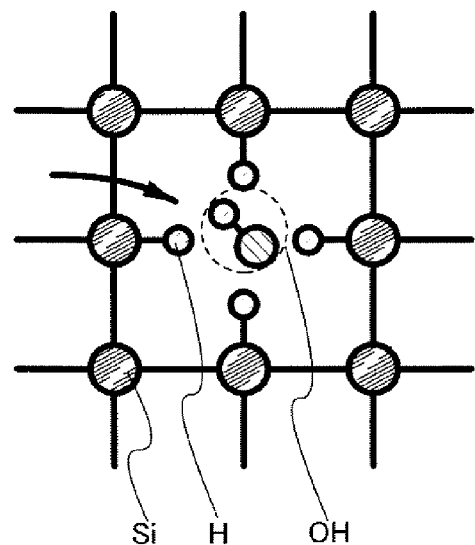
FIGS. 31A to 31D are diagrams illustrating models of silicon films.
Figure 31C:
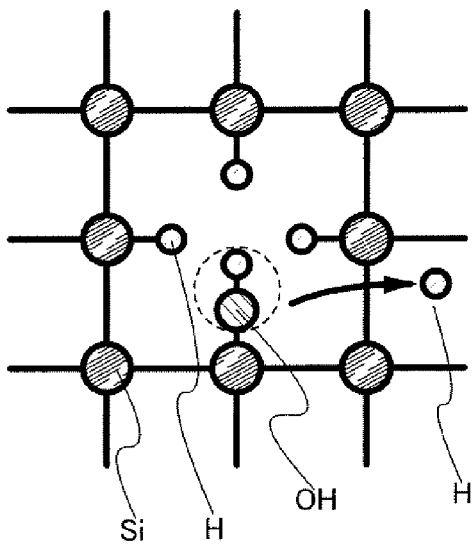

Next, with respect to the water plasma treatment, effect of the water plasma treatment will be deliberated. FIGS. 31A and 31C are model diagrams of lattice structure of silicon films, and FIGS. 31B and 31D are model diagrams of a bond of the silicon films.

Figure 31B:
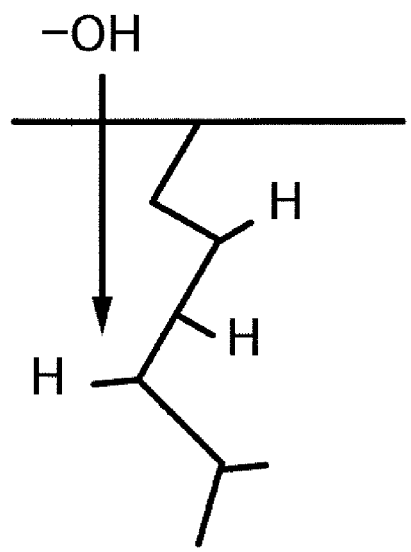
Figure 31D:
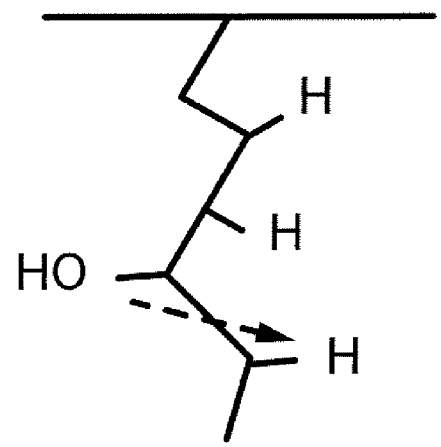

As shown in FIGS. 31A and 31B, when an OH radical comes closer to H which is bonded to Si, the OH radical having high bonding energy is bonded to Si so that an H atom which is bonded to Si is dissociated. The dissociated H atom moves into the silicon film as shown in FIGS. 31C and 31D. The bonding energy between Si and an OH radical is 3.03 eV and the bonding energy between Si and an H atom is 1.94 eV. This is because the bond between Si and OH is more stable than the bond between Si and H, which means that termination of a dangling bond in the silicon film is more promoted with an OH radical than with an H atom. Further, although both of an H atom and an OH radical decreases the defect level of a silicon film, the H atom tends to be dissociated easily at the time of driving the thin film transistor because the bonding energy thereof is smaller than that of the OH radical so that a defect level is generated again, which causes increase in the off state current. On the other hand, the OH radical is unlikely to be dissociated easily because the bonding energy thereof is larger than that of the H atom so that the defect level is unlikely to be generated.

From the above, defects in a silicon film can be decreased by exposing the silicon film having defects to OH radicals. Therefore, with the use of the silicon film for the thin film transistor, defects for trapping carriers are decreased so that the off-state current will be decreased.

Figure 5B:
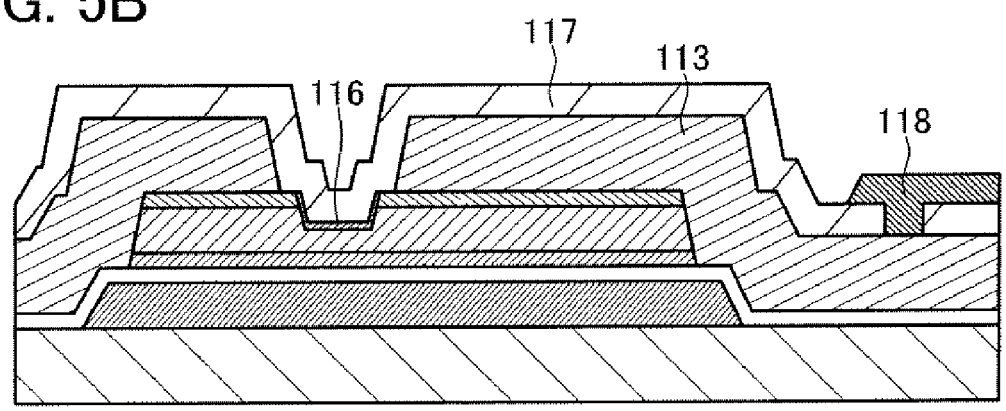

Through the above, the thin film transistor according to Embodiment 1 can be manufactured (see FIG. 5A). The thin-film transistor according to Embodiment 1 can be applied to a switching transistor in a pixel of a display device typified by a liquid-crystal display device or a light-emitting display device. Therefore, the insulating layer 117 having an opening is formed so as to cover the thin-film transistor, and the pixel electrode layer 118 is formed so as to connect to a source electrode or a drain electrode formed of the wiring layer 113 at the opening (see FIG. 5B). This opening can be formed by a photolithography method. After that, the pixel electrode layer 118 is provided over the insulating layer 117 so as to be connected to the source or drain electrode through the opening (see FIG. 5B). In this manner, the switching transistor in the pixel of a display device shown in FIGS. 1A and 1B can be manufactured.

The insulating layer 117 can be formed as is in the case of forming the gate insulating film 103. As the insulating layer 117, it is preferable to form a dense silicon nitride layer such that a contaminant impurity element such as an organic substance, a metal, or moisture in the air can be prevented from entering the insulating layer 117.

The pixel electrode layer 118 can be formed using a conductive composition including a conductive high molecule (also referred to as a conductive polymer) having a light-transmitting property. It is preferable that the pixel electrode layer 118 have a sheet resistance of 10000 Ω/square or less and a light transmittance of 70% or more at a wavelength of 550 nm. Further, the resistance of the conductive high molecule included in the conductive composition is preferably equal to or less than 0.1 Ω·cm.

As the conductive high molecule, a so-called π electron conjugated conductive high molecule can be used. For example, polyaniline and/or a derivative thereof, polypyrrole and/or a derivative thereof, polythiophene and/or a derivative thereof, and a copolymer of two or more kinds of these materials can be given.

The pixel electrode layer 118 can be formed using indium oxide containing tungsten oxide, indium zinc oxide containing tungsten oxide, indium oxide containing titanium oxide, indium tin oxide containing titanium oxide, indium tin oxide (ITO), indium zinc oxide, indium tin oxide to which silicon oxide is added, or the like.

The pixel electrode layer 118 may be patterned by etching using a photolithography method as is in the case of forming the wiring layer 113 and the like.

Although not shown, an insulating layer made of an organic resin formed by a spin coating method or the like may be provided between the insulating layer 117 and the pixel electrode layer 118.

In the thin film transistor according to one embodiment of the present invention, by stacking the semiconductor including a plurality of crystalline regions (typically a microcrystalline semiconductor) and the semiconductor having an amorphous structure (typically an amorphous semiconductor), preferable off-state current and on-state current both can be realized. Further, by performing the water plasma treatment on the depressed portion formed in the second semiconductor layer, dangling bonds in the depressed portion can be terminated with OH free radicals. The interface quality between the surface of the depressed portion and the insulating layer can be improved, the off-state current can be decreased, and variations in the transistor characteristics can be suppressed. Accordingly, a thin film transistor having high electrical characteristics can be provided.

This embodiment can be combined with any other embodiment as appropriate.

Embodiment 2

In Embodiment 2, the method for manufacturing a thin film transistor which is different from Embodiment 1 will be described using FIGS. 6A to 6D and 7A to 7D. The structural difference from the thin film transistor in Embodiment 1 is no existence of the first semiconductor layer 108. In the thin film transistor described in Embodiment 2, a second semiconductor layer 109 (a semiconductor layer having an amorphous structure) functions as a channel formation region of the thin film transistor according to one embodiment of the present invention. Hereinafter, the method for manufacturing the thin film transistor according to Embodiment 2 will be described. Described in Embodiment 2 is the method for manufacturing an n-channel thin film transistor. Note that description on the parts which are formed by the same steps as the method for manufacturing a thin film transistor shown in FIGS. 1A and 1B will be omitted or simplified.

Figure 6A:
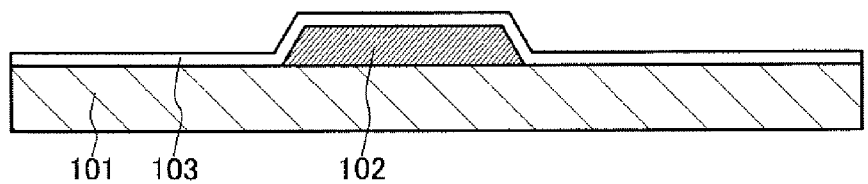
FIGS. 6A to 6D are cross-sectional diagrams illustrating a method for manufacturing a thin film transistor according to one embodiment of the present invention.

A gate electrode layer 102 and a gate insulating film 103 are formed over a substrate 101 by the same steps as FIGS. 1A and 1B described in Embodiment 1 (see FIG. 6A).

Figure 6B:
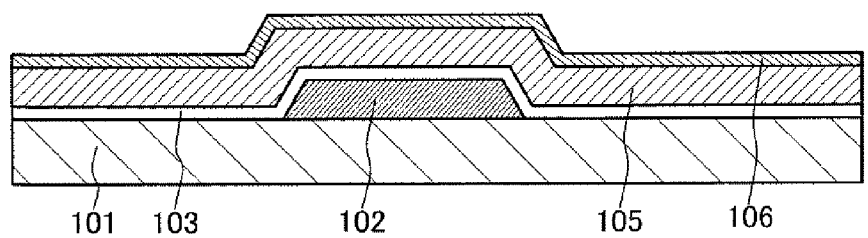
Figure 6C:
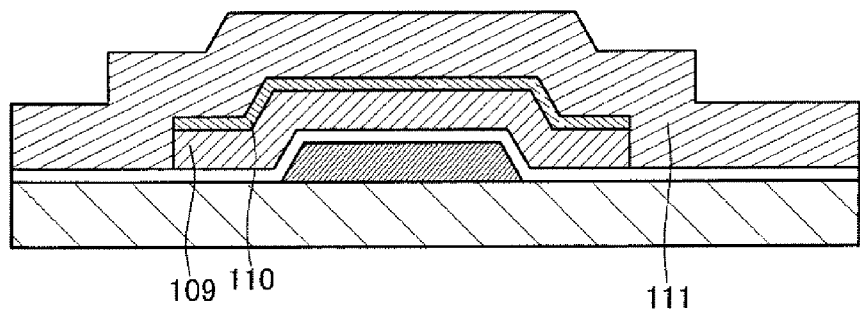
Figure 6D:
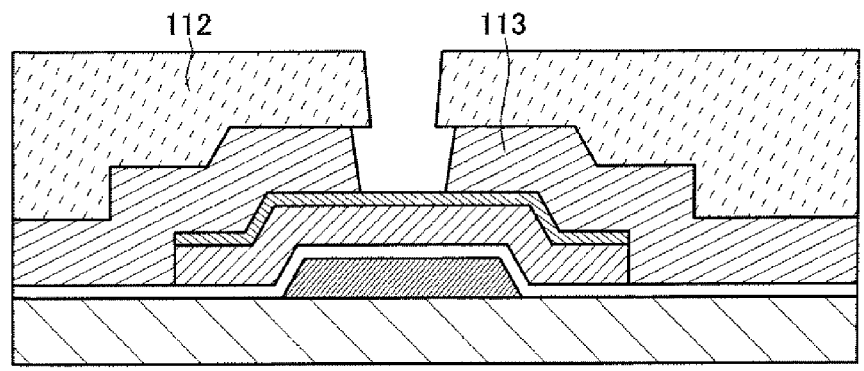

Next, a second semiconductor film 105 having an amorphous structure and an impurity semiconductor film 106 having one conductivity type, in which an impurity element which imparts one conductivity type is added are formed over the gate insulating film 103 (see FIG. 6B).

Next, a first resist mask is formed over the impurity semiconductor film 106, and the impurity semiconductor film 106 and the second semiconductor film 105 are etched using the first resist mask. By this step, the second semiconductor film 105 and the impurity semiconductor film 106 are separated for each element. Through the separation for each element, a second semiconductor layer 109 and an impurity semiconductor layer 110 which are patterned into a predetermined shape are obtained. After that, the first resist mask is removed.

Next, a conductive film 111 is formed over the gate insulating film 103 and the impurity semiconductor layer 110. The conductive film 111 is formed so as to cover the side and top surfaces of the impurity semiconductor layer 110 and the side surface of the second semiconductor layer 109 (see FIG. 6C).

Next, a second resist mask 112 is formed over the conductive film 111. The conductive film 111 is etched using the second resist mask 112. Through this step, a pair of wiring layers 113 is formed (see FIG. 6D). The pair of wiring layers 113 forms a source electrode and a drain electrode.

Figure 7A:
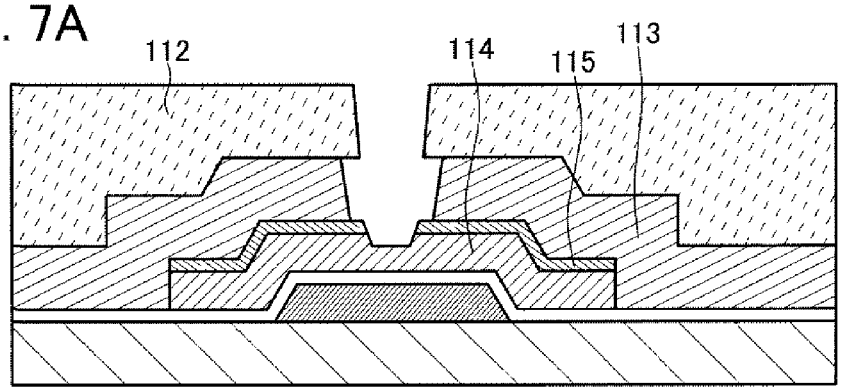
FIGS. 7A to 7D are cross-sectional diagrams illustrating the method for manufacturing the thin film transistor according to one embodiment of the present invention.

Next, the impurity semiconductor layer 110 is etched with the second resist mask 112 as it is (see FIG. 7A). By this etching, a pair of impurity semiconductor layers 115 which is patterned into a predetermined shape is obtained. The pair of impurity semiconductor layers 115 is spaced from each other and forms a source region and a drain region.

Also by the etching of forming the pair of impurity semiconductor layers 115 which forms a source region and a drain region, a part of the second semiconductor layer 109 below the pair of impurity semiconductor layers 115 is etched to form a depressed portion, so that a second semiconductor layer 114 is formed (see FIG. 7A).

Next, dry-etching is performed with the second resist mask 112 as it is. The dry-etching condition is set such that the exposed second semiconductor layer 114 is not damaged and the etching rate of the second semiconductor layer 114 is low. By performing the dry-etching in the condition so as not to damage the second semiconductor layer 114, impurities such as etching residues on the surface of the exposed second semiconductor layer 114 can be removed.

Figure 7B:
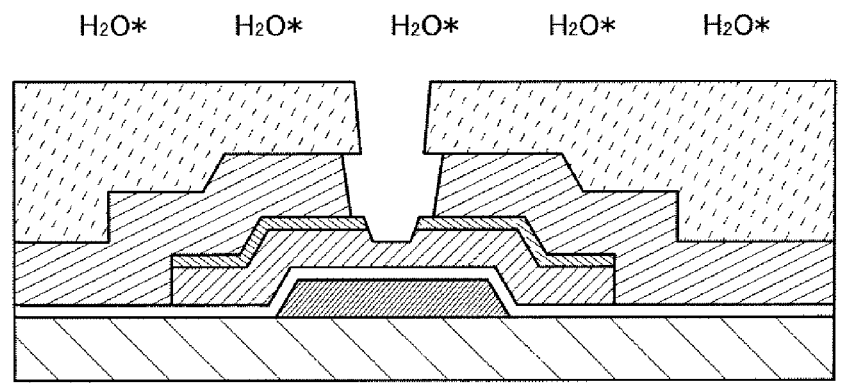
Figure 7C:
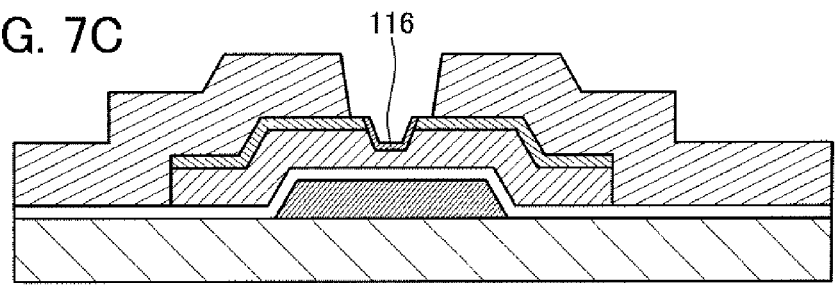

Next, water plasma treatment is performed with the second resist mask 112 as it is (see FIG. 7B). The water plasma treatment can be performed by generating water plasma using a gas containing water as its main component typified by water vapor ($H_2O$ vapor), introduced into a reaction chamber. By performing the water plasma treatment, an altered layer (an insulating layer 116) can be formed on the surface of the depressed portion in the second semiconductor layer. Further, the second resist mask 112 can be removed by exposure to water plasma (see FIG. 7C).

In this manner, by further performing dry-etching in the condition such that the second semiconductor layer 114 is not damaged, after the depressed portion of the second semiconductor layer 114 is formed, impurities such as residues or the like on the exposed second semiconductor layer 114 can be removed. Further, by performing the water plasma treatment using an $H_2O$ gas following the dry-etching, OH free radicals act on the dangling bonds formed at the time of the dry-etching on the surface of the depressed portion of the second semiconductor layer 114, so that the dangling bonds can be terminated with the OH free radicals. Accordingly, the stable altered layer (the insulating layer 116) can be formed on the surface of the depressed portion of the second semiconductor layer, so that defects formed at the time of forming the depressed portion of the second semiconductor layer can be repaired. Further, the interface quality between the surface of the depressed portion and the insulating layer 116 can be improved. Consequently, the water plasma treatment can improve the film quality, which leads to improvement of electrical characteristics of the thin film transistor.

The exposure of the second resist mask 112 to the water plasma can remove the second resist mask 112. By exposing the second resist mask 112 to the water plasma, chlorine and the like which cause corrosion, in the substrate can be removed by a product generated from the water plasma. Further, generation of corrosion in the wiring formed using a metal film can be suppressed, so that resist residues can be easily removed. Accordingly, by forming the depressed portion of the second semiconductor layer 114, further performing dry-etching in the condition such that the second semiconductor layer 114 is not damaged, and after that, performing plasma treatment using a $H_2O$ gas following the dry-etching, the off-state current of the thin film transistor can be decreased and electrical characteristics such as the field-effect mobility can be improved.

Figure 7D:
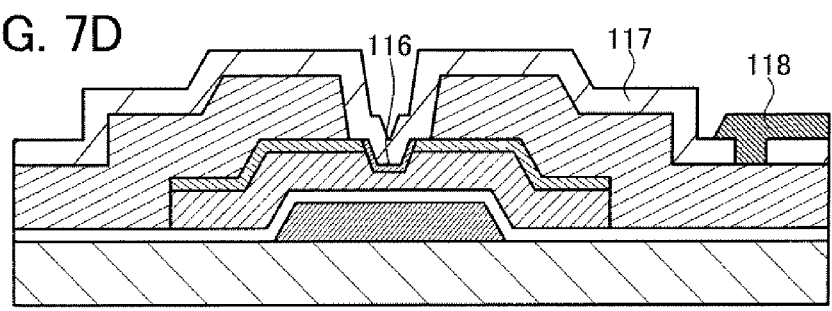

Through the above, the thin film transistor according to Embodiment 2 can be manufactured. As shown in FIG. 7D, an insulating layer 117 may be formed, and a pixel electrode layer 118 may be formed so as to fill an opening formed in the insulating layer 117.

Also in the thin film transistor described in Embodiment 2, by performing the water plasma treatment on the depressed portion formed in the second semiconductor layer, dangling bonds in the depressed portion can be terminated with OH free radicals. The interface quality between the surface of the depressed portion and the insulating layer can be improved, the off-state current can be decreased, and variations in the transistor characteristics can be suppressed. Accordingly, a thin film transistor having high electrical characteristics can be provided.

This embodiment can be combined with any other embodiment as appropriate.

Embodiment 3

In Embodiment 3, the process for manufacturing a thin film transistor which is different from Embodiments 1 and 2 will be described.

Figure 8A:
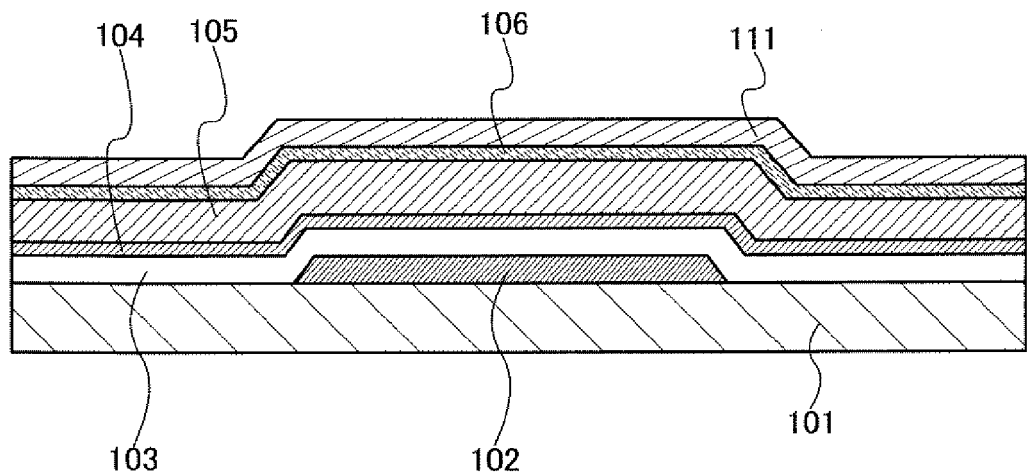
FIGS. 8A to 8C are cross-sectional diagrams illustrating a method for manufacturing a thin film transistor according to one embodiment of the present invention.

Through the same steps as FIGS. 1A and 1B described in Embodiment 1, a gate insulating film 103, a first semiconductor film 104, a second semiconductor film 105, and an impurity semiconductor film 106 are formed over a substrate 101 with a gate electrode layer 102 interposed between the substrate 101 and the gate insulating film 103 (see FIG. 8A). Their materials and methods are the same as Embodiment 1, and are omitted in Embodiment 3. Alternatively, as described in Embodiment 2, without forming a microcrystalline semiconductor film, the second semiconductor film 105 and the impurity semiconductor film 106 may be formed over the gate insulating film 103.

Next, a conductive film 111 is formed over the impurity semiconductor film 106 (see FIG. 8A). The material and method for manufacturing the conductive film are the same as Embodiment 1, and are omitted in Embodiment 3.

Figure 8B:
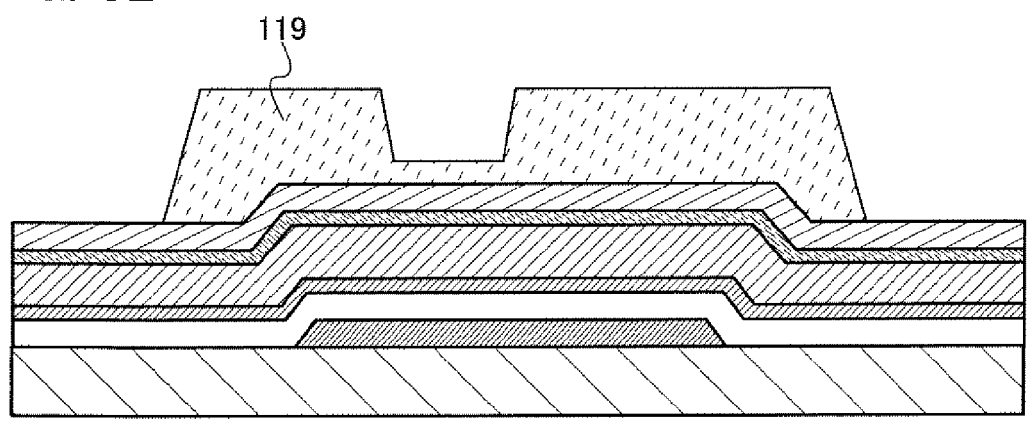

Next, a resist mask 119 is formed over the conductive film 111 (see FIG. 8B). The resist mask 119 has two regions whose thicknesses are different from each other, and can be formed by using a multi-tone mask. With the use of the multi-tone mask, the number of photomasks is reduced and the number of manufacturing steps can be reduced, which is preferable. In Embodiment 3, a multi-tone mask can be used at the step of patterning the microcrystalline semiconductor film and the amorphous semiconductor film and the step of separating the impurity semiconductor film to form a source region and a drain region.

The multi-tone mask is a mask capable of light exposure with multi-level light intensity, and typically, light exposure is performed with three levels of light intensity to provide an exposed region, a half-exposed region, and an unexposed region. With the use of the multi-tone mask, one light exposure and development process allows a resist mask having different thicknesses (typically, two kinds of thicknesses) to be formed. Therefore, by using the multi-tone mask, the number of photomasks can be reduced.

FIGS. 9(A-1) and 9(B-1) are cross-sectional diagrams of typical multi-tone masks. The former shows a gray-tone mask 180 and the latter shows a half-tone mask 185.

The gray-tone mask 180 shown in FIG. 9(A-1) includes a light-blocking portion 182 formed using a light-blocking film provided for a substrate 181 having a light-transmitting property, and a diffraction grating portion 183 provided with a pattern of the light-blocking film.

The transmittance of light is controlled by the diffraction grating portion 183 being provided with slits, dots, mesh, or the like at intervals equal to or less than the resolution limit of light used for light exposure. Note that the slits, dots, or mesh provided for the diffraction grating portion 183 may be provided periodically or nonperiodically.

As the substrate 181 having a light-transmitting property, a quartz substrate or the like can be used. The light-blocking film for forming the light-blocking portion 182 and the diffraction grating portion 183 may be formed using a metal film; preferably, chromium, chromium oxide, or the like is used.

In the case where the gray-tone mask 180 is irradiated with light for light exposure, as shown in FIG. 9(A-2), the transmittance in the region overlapping with the light-blocking portion 182 is 0%, and the transmittance in the region where neither the light-blocking portion 182 nor the diffraction grating portion 183 are provided is 100%. Further, the transmittance in the diffraction grating portion 183 is in the range of about 10% to 70%, which can be adjusted by the intervals of slits, dots, or mesh of the diffraction grating, or the like.

The half-tone mask 185 shown in FIG. 9(B-1) includes a semi-light-transmitting portion 187 which is formed of a semi-light-transmitting film provided for a substrate 186 having a light-transmitting property, and a light-blocking portion 188 formed of a light-blocking film.

The semi-light-transmitting portion 187 can be formed using a layer of MoSiN, MoSi, MoSiO, MoSiON, CrSi, or the like. The light-blocking portion 188 may be formed using the same metal film as is in the case of the light-blocking layer of the gray-tone mask; preferably, chromium, chromium oxide, or the like is used.

When the half-tone mask 185 is irradiated with light for light exposure, as shown in FIG. 9(B-2), the transmittance in the region overlapping with the light-blocking portion 188 is 0%, and the transmittance in the region where neither the light-blocking portion 188 nor the semi-light-transmitting portion 187 are provided is 100%. Further, the transmittance in the semi-light-transmitting portion 187 is in the range of about 10% to 70%, which can be adjusted by the kind, thickness, or the like of the material of the semi-light-transmitting portion 187.

By light exposure using the multi-tone mask and development, a resist mask which has regions having different thicknesses can be formed.

Figure 8C:
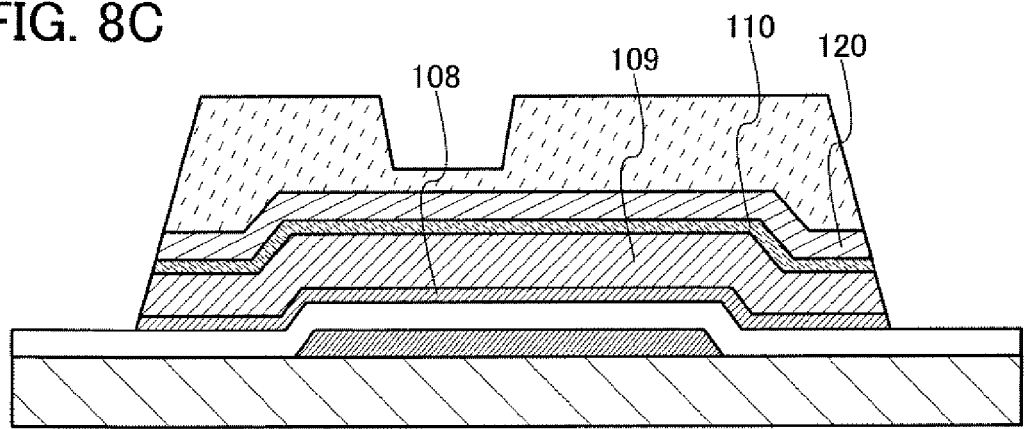
Figures 1, 9A:
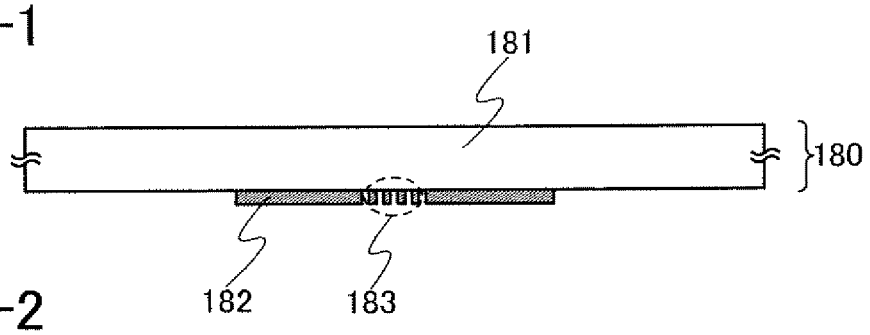
FIGS. 9(A-1) and 9(A-2) and 9(B-1) and 9(B-2) are diagrams illustrating multi-tone masks.
Figures 2, 9A:
Figures 1, 9B:
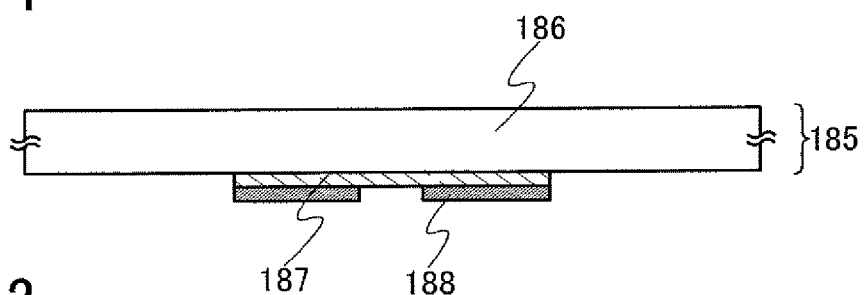
Figures 2, 9B:
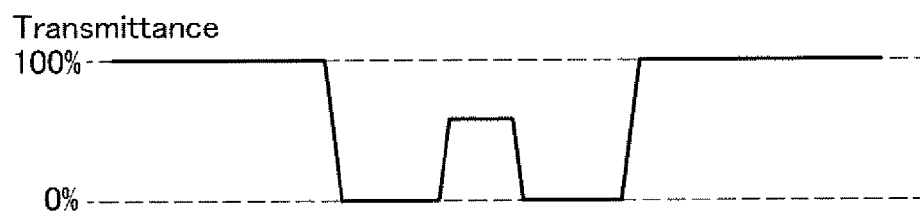

Next, the conductive film 111, the impurity semiconductor film 106, the second semiconductor film 105, and the first semiconductor film 104 are etched using the resist mask 119. By this step, the first semiconductor film 104, the second semiconductor film 105, the impurity semiconductor film 106, and the conductive film 111 are separated for each element (see FIG. 8C). Through the separation for each element, a first semiconductor layer 108, a second semiconductor layer 109, an impurity semiconductor layer 110, and a conductive layer 120 which are patterned into a predetermined shape are obtained.

Next, a resist mask 121 is formed by reducing the resist mask 119. In order to reduce the resist mask, ashing with oxygen plasma may be used.

Figure 10A:
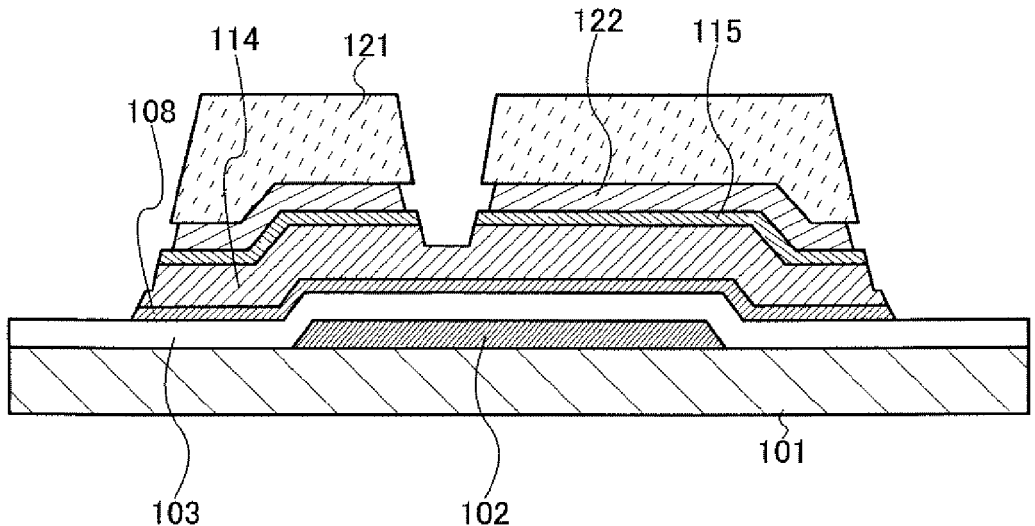
FIGS. 10A to 10C are cross-sectional diagrams illustrating the method for manufacturing the thin film transistor according to one embodiment of the present invention.

Next, the conductive film 111 is etched using the resist mask 121 to form a pair of wiring layers 122 which forms a source electrode and a drain electrode (see FIG. 10A). The etching of the conductive film 111 is preferably performed by wet-etching. By the wet-etching, the side surface of the conductive film 111 is isotropically etched. As a result, the conductive film 111 is side-etched in the direction to the inner side of the resist mask 121, so that the separated pair of wiring layers 122 is formed. Therefore, the side surfaces of the pair of wiring layers 122 are not aligned with the side surfaces of the pair of impurity semiconductor layers 110: the side surfaces of the pair of impurity semiconductor layers 110 which forms a source region and a drain region are positioned on the outer side of the side surfaces of the wiring layers 122. The wiring layers 122 function as not only a source electrode and a drain electrode but also as a signal line. However, the present invention is not limited thereto: a wiring layer which forms a signal line may be provided separately from the wiring layers which form a source electrode and a drain electrode.

Next, the impurity semiconductor layer 110 is etched with the second resist mask 121 as it is (see FIG. 10A). By this etching, a pair of impurity semiconductor layers 115 which is patterned into a predetermined shape is obtained. The pair of impurity semiconductor layers 115 is spaced from each other and forms a source region and a drain region.

Also by the etching of forming the pair of impurity semiconductor layers 115 which forms a source region and a drain region, a part of the second semiconductor layer 109 is etched to form a depressed portion, so that a second semiconductor layer 114 is formed. It is preferable that the etching of the impurity semiconductor layer 110 is controlled such that a part of the second semiconductor layer 109 remains in the depressed portion. It is preferable that the thickness of the part of the second semiconductor layer 114, which remains in the depressed portion after the etching of the impurity semiconductor layer 110 (the thickness is the thickness of the depressed portion of the second semiconductor layer 114) is about half the thickness before the etching. That is, after the formation of the pair of impurity semiconductor layers 115 by the etching, in the second semiconductor layer 114 under the pair of impurity semiconductor layers 115, the thickness thereof is different between the region just below the impurity semiconductor layer 115 and the region other than the region just below the impurity semiconductor layer 115 (the region just below the space between the impurity semiconductor layers 115). This is because the second semiconductor layer just below the impurity semiconductor layers 115 is not etched but the second semiconductor layer other than the second semiconductor layer just below the impurity semiconductor layers 115 is etched in the step of forming the impurity semiconductor layers 115 which form a source region and a drain region.

Next, dry-etching is performed with the resist mask 121 as it is. The dry-etching condition is set such that the exposed second semiconductor layer 114 is not damaged and the etching rate of the second semiconductor layer 114 is low. By performing the dry-etching in the condition so as not to damage the second semiconductor layer 114, impurities such as etching residues on the surface of the exposed second semiconductor layer 114 can be removed.

Figure 10B:
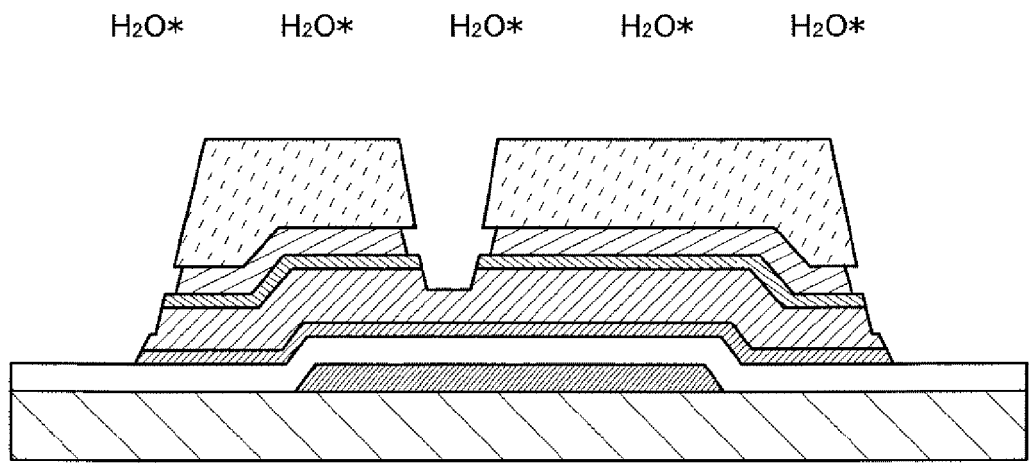
Figure 10C:
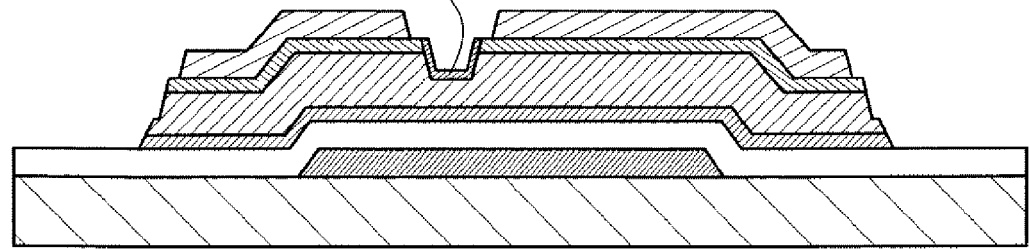

Next, water plasma treatment is performed with the resist mask 121 as it is. The water plasma treatment can be performed by generating water plasma using a gas containing water as its main component typified by water vapor ($H_2O$ vapor), introduced into a reaction chamber (see FIG. 10B). By performing the water plasma treatment, an altered layer (an insulating layer 116) can be formed on the surface of the depressed portion in the second semiconductor layer. Further, the resist mask 121 can be removed by exposure to water plasma (see FIG. 10C).

In this manner, by further performing dry-etching in the condition such that the second semiconductor layer 114 is not damaged, after the depressed portion of the second semiconductor layer 114 is formed, impurities such as residues or the like on the exposed second semiconductor layer 114 can be removed. Further, by performing the water plasma treatment using an $H_2O$ gas following the dry-etching, OH free radicals act on the dangling bonds (damage) formed at the time of the dry-etching on the surface of the depressed portion of the second semiconductor layer, so that the dangling bonds can be terminated with the OH free radicals. Accordingly, the stable altered layer (the insulating layer 116) can be formed on the surface of the depressed portion of the second semiconductor layer 114, so that defects formed at the time of forming the depressed portion of the second semiconductor layer 114 can be repaired. Further, the interface quality between the surface of the depressed portion and the insulating layer 116 can be improved. Consequently, the water plasma treatment can improve the film quality, which leads to improvement of electrical characteristics of the thin film transistor.

Further, the exposure of the resist mask 121 to the water plasma can remove the resist mask 121. By exposing the resist mask 121 to the water plasma, chlorine and the like which cause corrosion, in the substrate can be removed by a product generated from the water plasma. Further, generation of corrosion in the wiring formed using a metal film can be suppressed, so that resist residues can be easily removed. Accordingly, by forming the depressed portion of the second semiconductor layer 114, further performing dry-etching in the condition such that the second semiconductor layer 114 is not damaged, and after that, performing water plasma treatment following the dry-etching, the off-state current of the thin film transistor can be decreased and electrical characteristics such as the field-effect mobility can be improved. Further, with the use of the multi-tone mask, the number of photomasks can be reduced.

Through the above, the thin film transistor according to Embodiment 3 can be manufactured. After that, as is in the case of Embodiment 1, an insulating layer 117 may be formed, and a pixel electrode layer 118 may be formed so as to fill an opening formed in the insulating layer 117 (see FIG. 5B).

Although Embodiment 3 is described using the manufacturing process described in Embodiment 1, the manufacturing process described in Embodiment 2 can alternatively be used.

This embodiment can be combined with any other embodiment as appropriate.

Embodiment 4

In Embodiment 4, a liquid-crystal display device including the thin film transistor described in Embodiment 3 will be described below as one mode of a display device. A vertical alignment (VA) liquid-crystal display device will be described with reference to FIGS. 11 to 13. The VA liquid-crystal display device is a kind of mode in which alignment of liquid crystal molecules of a liquid crystal panel is controlled. The VA liquid-crystal display device is a mode in which liquid crystal molecules are vertical to the panel surface when voltage is not applied. In Embodiment 4, it is devised to particularly separate each pixel into some regions (sub-pixels) so that molecules are aligned in different directions in their respective regions. This is called multi-domain or multi-domain design. In the following description, a liquid-crystal display device with multi-domain design will be described.

Figure 11:
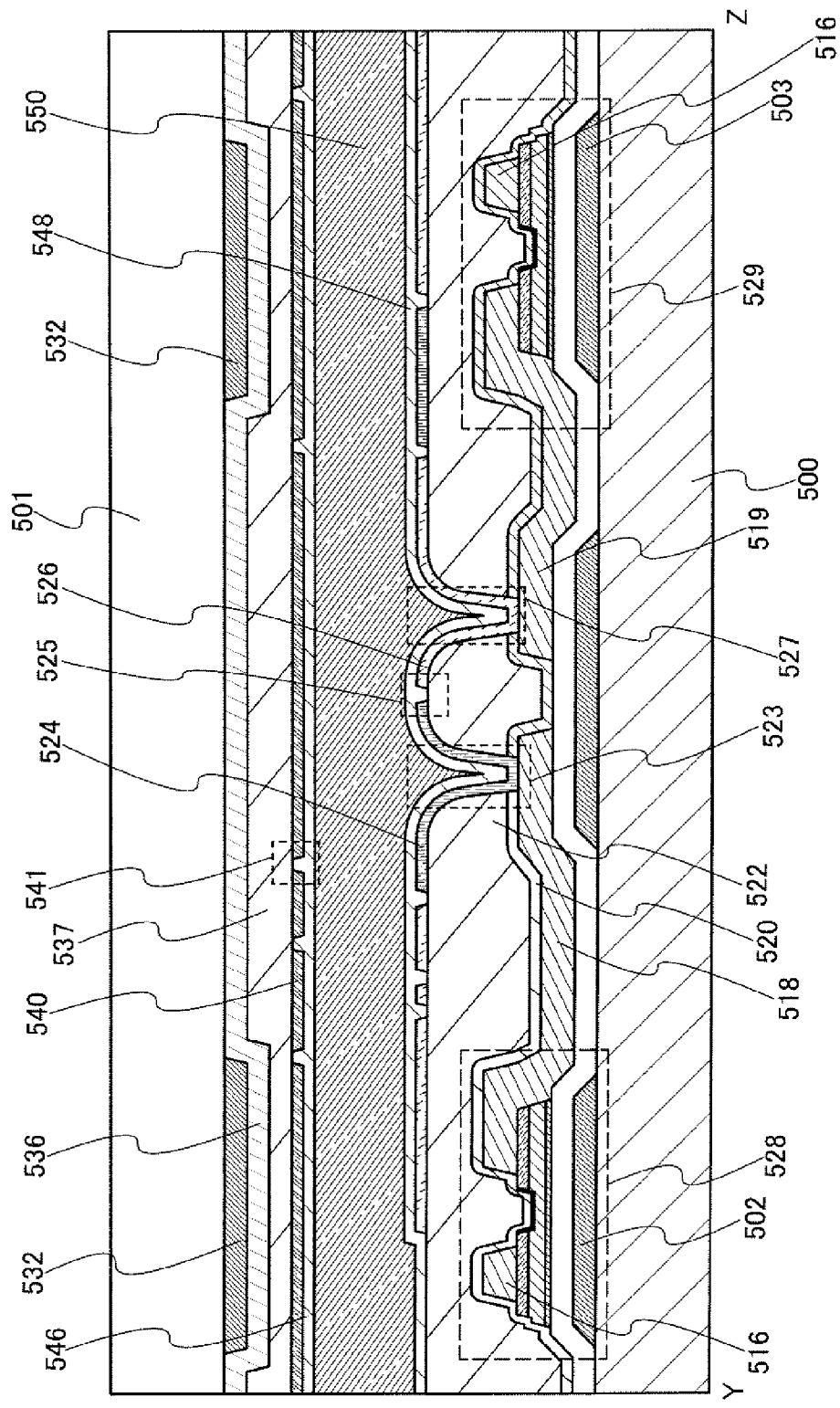
FIG. 11 is a cross-sectional diagram illustrating one example of a display device to which the thin film transistor can be applied, according to one embodiment of the present invention.
Figure 12:
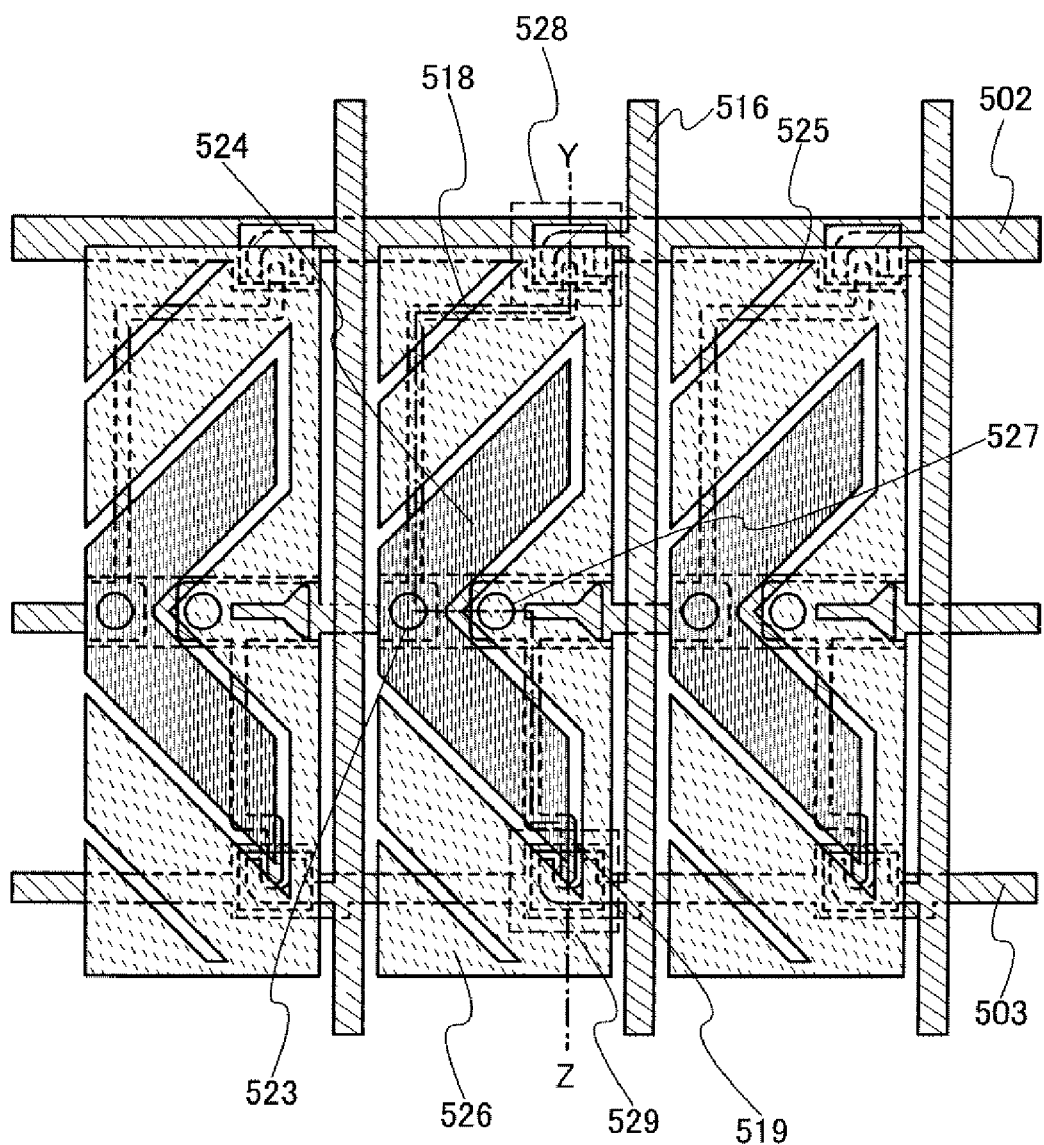
FIG. 12 is a view illustrating one example of a display device to which the thin film transistor can be applied, according to one embodiment of the present invention.

FIGS. 11 and 12 show a pixel structure of a VA liquid crystal panel. FIG. 12 is a plan view of a pixel structure described in Embodiment 4, and a cross-sectional structure along dashed line Y-Z in FIG. 12 is shown in FIG. 11. The following description will be made with reference to both the drawings.

In the pixel structure described in Embodiment 4, a plurality of pixel electrodes is provided for one pixel over a substrate 500 and each connected to a thin film transistor through a planarization film 522 and a passivation film 520. Each thin film transistor is driven by a different gate signal. That is, a pixel of multi-domain design has a structure in which a signal applied to each pixel electrode is independently controlled.

A pixel electrode 524 is connected to a thin film transistor 528 through a wiring 518 in a contact hole 523. A pixel electrode 526 is connected to a thin film transistor 529 through a wiring 519 in a contact hole 527. A gate wiring 502 of the thin film transistor 528 and a gate wiring 503 of the thin film transistor 529 are separated from each other so that different gate signals can be supplied thereto. To the contrary, a wiring 516 which functions as a data line is used in common for the thin film transistors 528 and 529. The thin film transistors 528 and 529 can be manufactured by the method described in Embodiment 3. The thin film transistors 528 and 529 can be manufactured by any method described in other embodiments.

The pixel electrodes 524 and 526 have different shapes and are separated by a slit 525. The pixel electrode 526 is formed so as to surround the outside of the pixel electrode 524 which is expanded in a V-shape. Timing of voltage application is made to vary between the pixel electrodes 524 and 526 by the thin film transistors 528 and 529 in order to control alignment of the liquid crystal. By supplying different gate signals to the gate wiring 502 and the gate wiring 503, operation timings of the thin film transistor 528 and the thin film transistor 529 can be varied. Further, an alignment film 548 is formed over the pixel electrodes 524 and 526.

Figure 13:
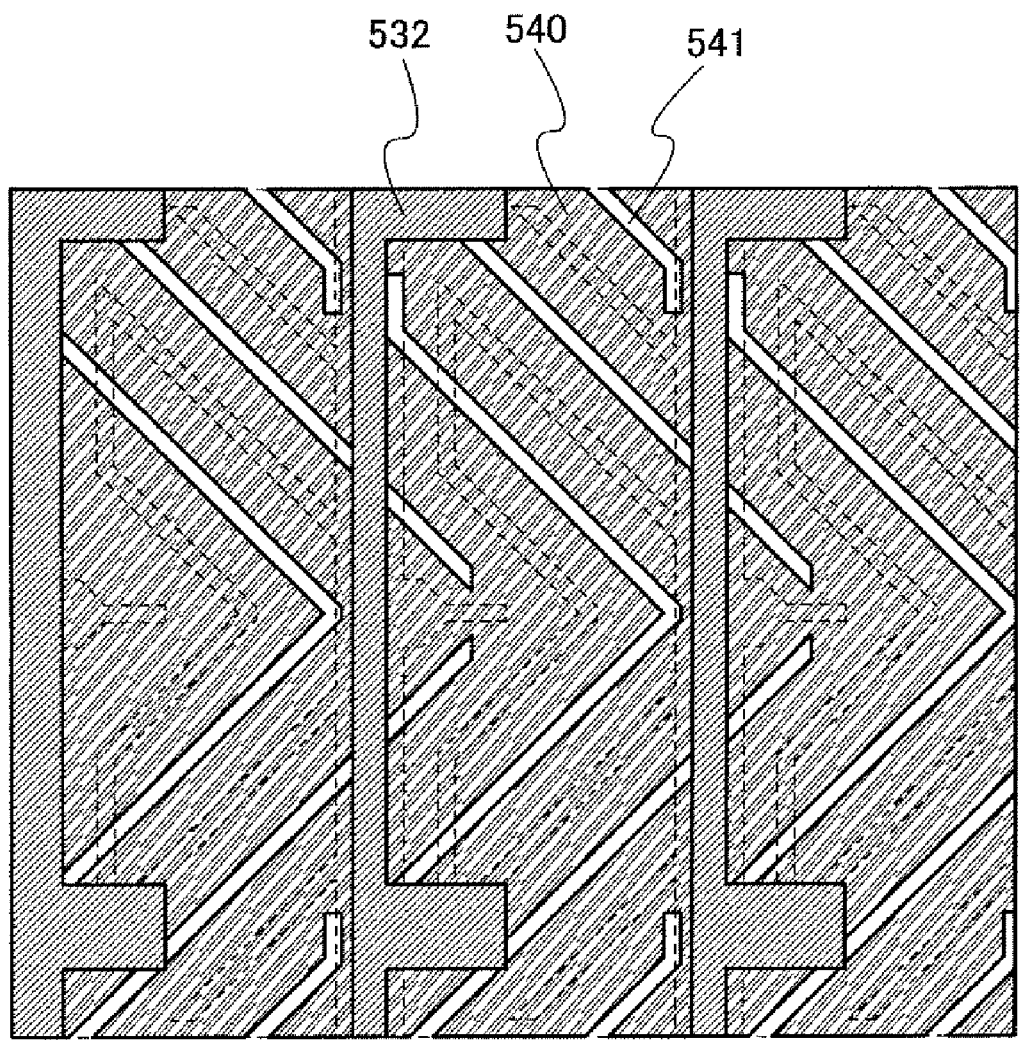
FIG. 13 is a view illustrating one example of a display device to which the thin film transistor can be applied, according to one embodiment of the present invention.

An opposite substrate 501 is provided with a light-blocking film 532, a coloring film 536, and an opposite electrode 540 (see FIG. 11). Further, a planarization film 537 is formed between the coloring film 536 and the opposite electrode 540 to prevent alignment disorder of the liquid crystal. Further, an alignment film 546 is provided for the opposite electrode 540. FIG. 13 shows the pixel structure on the opposite substrate 501 side. The opposite electrode 540 is an electrode used in common for different pixels, and a slit 541 is formed in the opposite electrode 540. The slit 541 and the slit 525 on the pixel electrode 524 or 526 side are alternately arranged so as not to overlap, so that an oblique electric field is effectively generated and the alignment of liquid crystal can be controlled. Consequently, the alignment direction of the liquid crystal can be varied depending on the position, and the viewing angle of the liquid crystal panel can be expanded.

A first liquid crystal element is formed by overlapping of the pixel electrode 524, a liquid crystal layer 550, and the opposite electrode 540. In addition, a second liquid crystal element is formed by overlapping of the pixel electrode 526, the liquid crystal layer 550, and the opposite electrode 540. This is a multi-domain structure in which the first liquid crystal element and the second liquid crystal element are provided for one pixel.

Although the VA liquid-crystal display device is described as a liquid-crystal display device in Embodiment 4, the element substrate formed using the thin film transistor according to one embodiment of the present invention can also be used for any other liquid-crystal display device such as an FFS liquid-crystal display device, an IPS liquid-crystal display device, or a TN liquid-crystal display device.

Through the above steps, the liquid-crystal display device can be manufactured. In the liquid-crystal display device described in Embodiment 4, the thin film transistor with high on-state current and low off-state current is used as a pixel transistor, whereby a liquid-crystal display device with high image quality (for example, high contrast) and less power consumption can be manufactured. Further, variations of the electrical characteristics between elements are reduced so that variations of the luminance are reduced, whereby a liquid-crystal display device with high image quality can be manufactured.

This embodiment can be combined with any other embodiment as appropriate.

Embodiment 5

In Embodiment 5, a light-emitting display device including the thin film transistor described in Embodiment 3 will be described below as one mode of a display device. The structure of a pixel included in the light-emitting display device will be described in Embodiment 5. FIG. 14A illustrates one mode of a top view of the pixel, and FIG. 14B illustrates one mode of the cross-sectional structure of the pixel, taken along line A-B in FIG. 14A.

A light-emitting device, in which a light-emitting element utilizing electroluminescence is used, will be described in Embodiment 5. Light-emitting elements utilizing electroluminescence are classified according to whether the light-emitting material is an organic compound or an inorganic compound: in general, the former is referred to as an organic EL element, and the latter is referred to as an inorganic EL element. Described in Embodiment 5 is the case where Embodiment 3 is applied for the process for manufacturing a thin film transistor. The thin film transistor described in any other embodiment can alternatively used as the thin film transistor described in Embodiment 5.

In an organic EL element, by application of a voltage to a light-emitting element, electrons and holes are separately injected from a pair of electrodes into a layer containing a light-emitting organic compound so that current flows. Then, these carriers (electrons and holes) are recombined so that the light-emitting organic compound gets in an excited state, and light is emitted when the excited state returns to a ground state. Due to such mechanism, such a light-emitting element is called a current-excitation-type light-emitting element.

Inorganic EL elements are classified into a dispersion-type inorganic EL element and a thin-film-type inorganic EL element depending on their element structures. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film-type inorganic EL element has a structure in which a light-emitting layer is interposed between dielectric layers and the light-emitting layer interposed between the dielectric layers is further interposed between electrodes and adopts local emission in which inner shell electron transition of a metal ion is utilized. Note that the description will be made in Embodiment 5 using an organic EL element as a light-emitting element. In addition, a channel-etched thin film transistor is used as each of a thin film transistor for switching which controls input of a signal to a pixel electrode and a thin film transistor which controls driving of a light-emitting element in Embodiment 5, but a channel-protective thin film transistor can also be used as appropriate.

In FIGS. 14A and 14B, a first thin film transistor 281a corresponds to a thin film transistor for switching, which controls input of a signal to a pixel electrode, and a second thin film transistor 281b corresponds to a thin film transistor for driving, which controls supply of current or voltage to a light-emitting element 282.

A gate electrode of the first thin film transistor 281a is connected to a scan line 283a, one of a source electrode and a drain electrode thereof is connected to a signal line 284a, and the other of the source electrode and the drain electrode thereof is connected to a gate electrode 283b of the second thin film transistor 281b through a wiring 284b. One of a source electrode and a drain electrode of the second thin film transistor 281b is connected to a power source line 285a, and the other of the source electrode and the drain electrode thereof is connected to the pixel electrode (a cathode 288) of the display device through a wiring 285b. A gate electrode, a gate insulating film, and the power source line 285a of the second thin film transistor 281b form a capacitor, and the other of the source electrode and the drain electrode of the first thin film transistor 281a is connected to the capacitor.

The capacitor corresponds to a capacitor for holding a voltage between the gate electrode and the source electrode or between the gate electrode and the drain electrode (hereinafter the voltage is referred to as a gate voltage) of the second thin film transistor 281b when the first thin film transistor 281a is off, and is not necessarily provided.

In Embodiment 5, the first thin film transistor 281a and the second thin film transistor 281b can be each formed using the thin film transistor described in any of Embodiments 1 to 3. In addition, although both the first thin film transistor 281a and the second thin film transistor 281b are n-channel thin film transistors in Embodiment 5, the first thin film transistor 281a and the second thin film transistor 281b may be formed using an n-channel thin film transistor and a p-channel thin film transistor as well. Further alternatively, both the first thin film transistor 281a and the second thin film transistor 281b may be formed using p-channel thin film transistors.

An insulating film 286 is formed over the first thin film transistor 281a and the second thin film transistor 281b, a planarization film 287 is formed over the insulating film 286, and the cathode 288 which is connected to the wiring 285b in a contact hole formed in the planarization film 287 and the insulating film 286 is formed. The planarization film 287 is formed preferably using an organic resin such as acrylic, polyimide, or polyimide, or a siloxane polymer. The cathode 288 has roughness in the contact hole, and therefore, a partition wall 291 having an opening and covering the contact hole is provided. A light-emitting layer 289 is formed so as to be in contact with the cathode 288 in the opening in the partition wall 291, an anode 290 is formed so as to cover the light-emitting layer 289, and a protection insulating film 292 is formed so as to cover the anode 290 and the partition wall 291.

The light-emitting element 282 having a top emission structure is described as a light-emitting element in Embodiment 5. The light-emitting element 282 with a top emission structure can emit light even over the first thin film transistor 281a or the second thin film transistor 281b; thus, a light emission area can be increased. However, if the base film of the light-emitting layer 289 has roughness, thickness distribution becomes nonuniform due to the roughness, which leads to short-circuiting between the anode 290 and the cathode 288 to cause a display defect. Therefore, it is preferable to provide the planarization film 287.

The region where the light-emitting layer 289 is interposed between the cathode 288 and the anode 290 corresponds to the light-emitting element 282. In the pixel illustrated in FIG. 14A, light generated in the light-emitting element 282 is emitted to pass through the anode 290 as shown by an outline arrow in FIG. 14B.

The cathode 288 is formed using any conductive film using a known material as long as it has a low work function and reflects light. For example, Ca, Al, MgAg, AlLi, or the like is preferably used. The light-emitting layer 289 may be formed to have a single-layer structure or a stack structure in which a plurality of layers are stacked. When the light-emitting layer 289 is formed using a plurality of layers, an electron-injection layer, an electron-transport layer, a light-emitting layer, a hole-transport layer, and a hole-injection layer are stacked in this order over the cathode 288. As for the layers other than the light-emitting layer, such as the electron-injection layer, the electron-transport layer, the hole-transport layer, and the hole-injection layer are not necessarily provided and each can be selected to be provided as appropriate. The anode 290 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Although the light-emitting element having a top emission structure in which light is extracted from a side opposite to the substrate is described in Embodiment 5, either a light-emitting element having a bottom emission structure in which light is extracted from the substrate side or a light-emitting element having a dual emission structure in which light is extracted from both the substrate side and the side opposite to the substrate can also be employed.

Further, although the organic EL element is described as a light-emitting element in Embodiment 5, an inorganic EL element can also be provided as a light-emitting element.

Although the case in which the thin film transistor for controlling the driving of a light-emitting element (the driving thin film transistor) is electrically connected to the light-emitting element is described in Embodiment 5, a thin film transistor for controlling current may be connected between the driving thin film transistor and the light-emitting element.

Through the above process, the light-emitting display device can be manufactured. In the light-emitting display device, the thin film transistor with high on-state current and low off-state current is used as a pixel transistor, whereby a light-emitting display device with high image quality (for example, high contrast) and less power consumption can be manufactured. Further, variations of the electrical characteristics between elements are reduced so that variations of the luminance are reduced, whereby a light-emitting display device with high image quality can be manufactured.

This embodiment can be combined with any other embodiment as appropriate.

Embodiment 6

Next, the structure of a display panel which is one mode of a display device according to one embodiment of the present invention will be described below.

Figure 15A:
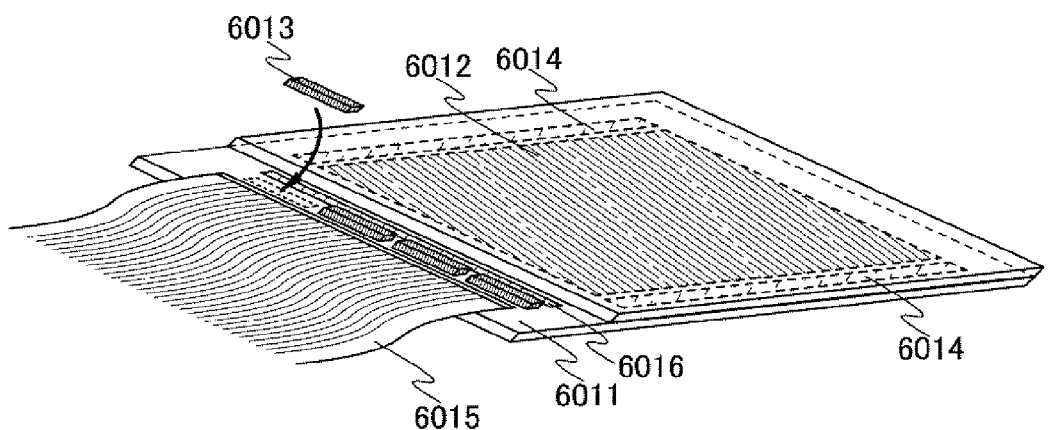
FIGS. 15A to 15C are views each illustrating one example of a display device to which the thin film transistor can be applied, according to one embodiment of the present invention.

FIG. 15A illustrates the mode of a display panel in which a pixel portion 6012 formed over a substrate 6011 is connected to a signal line driver circuit 6013 that is formed separately. An element substrate where the pixel portion 6012, a protection circuit 6016, and a scan line driver circuit 6014 are formed is formed using the thin film transistors described in any of the above-described embodiments. Variations in characteristics between elements are reduced, and therefore, the display panel can be operated stably. Note that the signal line driver circuit 6013 may be formed with the use of a transistor using a single crystal semiconductor, a thin film transistor using a polycrystalline semiconductor, or a transistor using SOI. The transistor using SOI includes in its category a transistor using a single crystal semiconductor layer provided for a glass substrate. The pixel portion 6012, the signal line driver circuit 6013, and the scan line driver circuit 6014 are each supplied with potential of a power source, a variety of signals, and the like through an FPC 6015. The protection circuit 6016 may be formed using the thin film transistor described in any of the above-described embodiments and provided between the signal line driver circuit 6013 and the FPC 6015 or between the signal line driver circuit 6013 and the pixel portion 6012. As the protection circuit 6016, instead of the protection circuit formed using the thin film transistor described in any of the above-described embodiments, a protection circuit formed using one or more kinds of elements selected from thin film transistor having other structures, a diode, a resistor, a capacitor, and the like may be provided.

Alternatively, the signal line driver circuit and the scan line driver circuit may both be formed over the same substrate as that of the pixel portion.

Figure 15B:
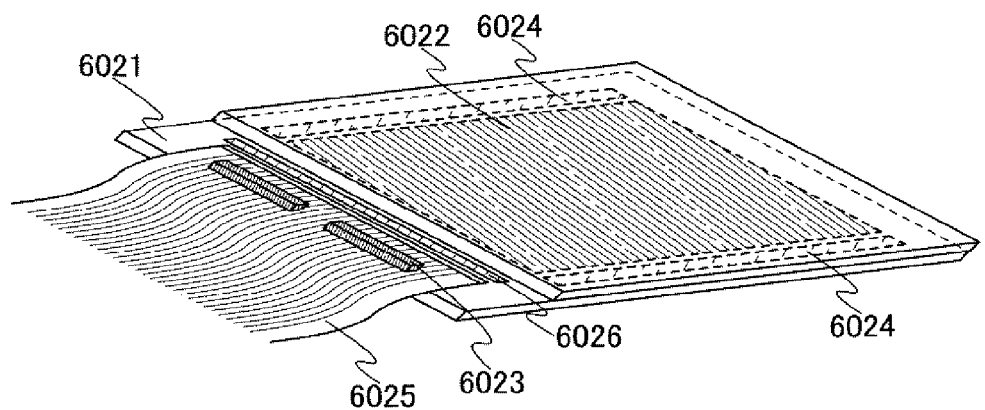

Further, when the driver circuitry is separately formed, a substrate provided with the driver circuitry is not necessarily attached to a substrate provided with the pixel portion, and may be attached to, for example, the FPC. FIG. 15B illustrates the mode of a panel of a display device in which a signal line driver circuit 6023 is formed separately and is connected to an FPC and an element substrate where a pixel portion 6022, a protection circuit 6026, and a scan line driver circuit 6024 are formed over a substrate 6021. The pixel portion 6022, the protection circuit 6026, and the scan line driver circuit 6024 are each formed using the thin film transistor described in any of the above-described embodiments. The signal line driver circuit 6023 is connected to the pixel portion 6022 via an FPC 6025 and the protection circuit 6026. The pixel portion 6022, the signal line driver circuit 6023, and the scan line driver circuit 6024 are each supplied with potential of a power source, a variety of signals, and the like through the FPC 6025. The protection circuit 6026 may be formed using the thin film transistor described in any of the above-described embodiments and provided between the FPC 6025 and the pixel portion 6022. As the protection circuit 6026, instead of the protection circuit formed using the thin film transistor described in any of the above-described embodiments, a protection circuit formed using one or more kinds of elements selected from thin film transistor having other structures, a diode, a resistor, a capacitor, and the like may be provided.

Figure 15C:
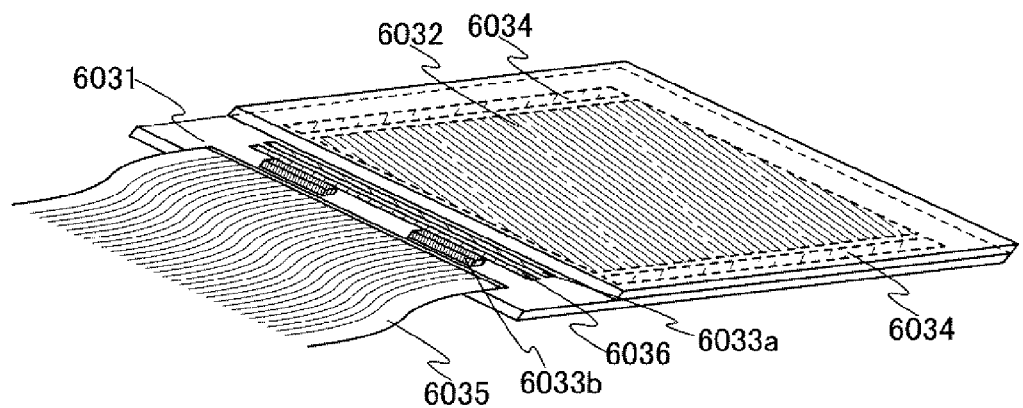

Further, only a part of the signal line driver circuit or only a part of the scan line driver circuit may be formed over the same substrate as that of the pixel portion, using the thin film transistors described in any of the above-described embodiments, and the resist thereof may be formed separately and electrically connected to the pixel portion. FIG. 15C illustrates the mode of a display panel in which an analog switch 6033*a* included in the signal line driver circuit is formed over a substrate 6031 which is the same as the substrate where a pixel portion 6032 and a scan line driver circuit 6034 are formed, and a shift register 6033*b* included in the signal line driver circuit is formed separately over a different substrate and then attached to the substrate 6031. The pixel portion 6032, a protection circuit 6036, and the scan line driver circuit 6034 are each formed using the thin film transistor described in any of the above-described embodiment modes. The shift register 6033b included in the signal line driver circuit is connected to the pixel portion 6032 via an FPC 6035 and the protection circuit 6036. The pixel portion 6032, the signal line driver circuit, and the scan line driver circuit 6034 are each supplied with potential of a power source, a variety of signals, and the like through the FPC 6035. The protection circuit 6036 may be formed using the thin film transistor described in any of the above-described embodiments and provided between the shift register 6033b and the analog switch 6033a. As the protection circuit 6036, instead of the protection circuit formed using the thin film transistor described in any of the above-described embodiments, a protection circuit formed using one or more kinds of elements selected from a thin film transistor, a diode, a resistor, a capacitor, and the like may be provided.

As shown in FIGS. 15A to 15C, in the display device of Embodiment 6, all or a part of the driver circuitry can be formed over the same substrate as that of the pixel portion, using the thin film transistor described in any of the above-described embodiments.

Note that there are no particular limitations on the connection method of a substrate separately formed: a known method such as a COG method, a wire bonding method, or a TAB method can be used. Further, the connection position is not limited to the positions shown in FIGS. 15A to 15C as long as electrical connection is possible. Further, a controller, a CPU, a memory, or the like may be formed separately and connected.

The signal line driver circuit according to one mode of the present invention includes a shift register and an analog switch. In addition to the shift register and the analog switch, another circuit such as a buffer, a level shifter, or a source follower may be included. The shift register and the analog switch are not necessarily provided: for example, a different circuit such as a decoder circuit by which selection of signal lines is possible may be used instead of the shift resistor, and a latch or the like may be used instead of the analog switch.

This embodiment can be combined with any other embodiment as appropriate.

Embodiment 7

With the use of an element substrate formed using the thin film transistor according to one mode of the present invention, a display device using the element substrate, or the like, an active matrix display device panel can be manufactured. That is, one mode of the present invention can be carried out in all the electronic devices in which any of them is incorporated into a display portion.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). Examples of these devices are illustrated in FIGS. 16A to 16D.

Figure 16A:
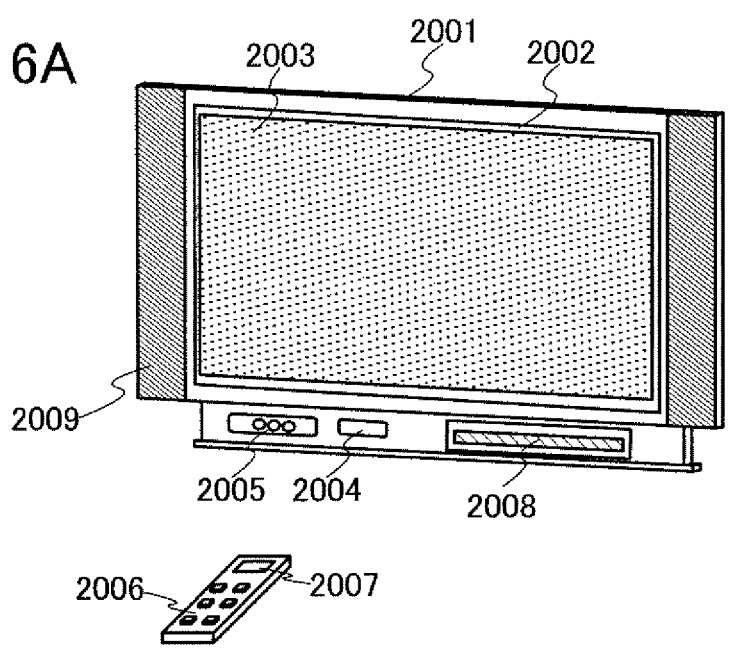
FIGS. 16A to 16D are views each illustrating one example of an electronic device or the like to which the thin film transistor can be applied, according to one embodiment of the present invention.

FIG. 16A illustrates a television device. The television device can be completed by incorporation of a display panel into a chassis as shown in FIG. 16A. A main screen 2003 is formed using the display panel, and other accessories such as a speaker portion 2009 and an operation switch are provided. In this manner, the television device can be completed.

As shown in FIG. 16A, a display panel 2002 which uses display elements is incorporated into a chassis 2001. In addition to reception of general TV broadcast with a receiver 2005, by connecting the television set to a communication network in a wired or wireless manner via a modem 2004, one-way (from sender to receiver) or two-way (between sender and receiver or between receivers) information communication can be performed. The television device can be operated by using a switch built in the chassis or a remote control unit 2006. A display portion 2007 for displaying output information may also be provided for the remote control unit 2006.

Further, the television device may include a sub-screen 2008 formed using a second display panel for displaying channels, sound volume, and the like, in addition to the main screen 2003. In this structure, the main screen 2003 may be formed using a liquid crystal display panel, and the sub-screen may be formed using a light-emitting display panel. Alternatively, the main screen 2003 may be formed using a light-emitting display panel, the sub-screen may be formed using a light-emitting display panel, and the sub-screen may blink.

Figure 17:
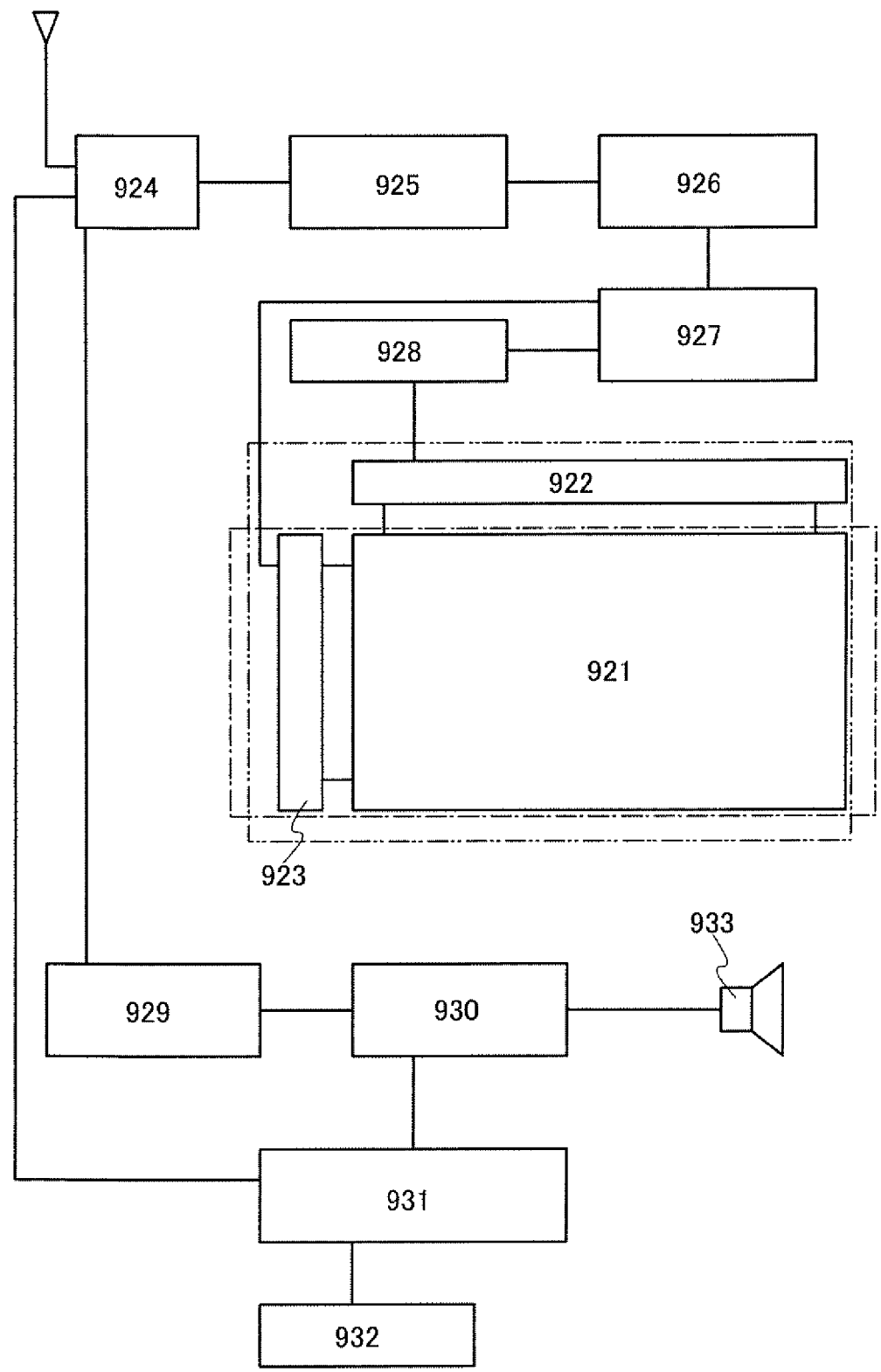
FIG. 17 is a block diagram showing one example of an electronic device or the like to which the thin film transistor can be applied, according to one embodiment of the present invention.

FIG. 17 is a block diagram showing the main structure of a television device. A display panel is provided with a pixel portion 921. A signal line driver circuit 922 and a scan line driver circuit 923 may be mounted on the display panel by a COG method.

With respect to the other external circuitry, the television device has a video signal amplifier circuit 925 which amplifies a video signal among signals received by a tuner 924; a video signal processing circuit 926 which converts signals output from the video signal amplifier circuit 925 into color signals corresponding to each color of red, green, and blue; a control circuit 927 which converts the video signals into an input specification of a driver IC; and the like. The control circuit 927 outputs signals to each of the scan line side and the signal line side. In the case of digital driving, a signal dividing circuit 928 may be provided on the signal line side and an input digital signal may be divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

One mode of the present invention can be applied not only to a television device but also for a variety of uses, such as a monitor of a personal computer and a large display medium such as an information display board at the train station, the airport, or the like or an advertisement display board on the street.

By applying the element substrate using the thin film transistor described in any of the above-described embodiments and the display device including the element substrate to the main screen 2003 and the sub-screen 2008, a television device with improved image quality can be provided.

Figure 16B:
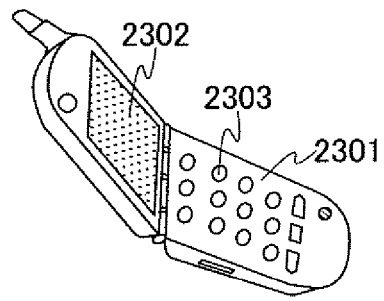

FIG. 16B illustrates one mode of a mobile phone 2301. The mobile phone 2301 includes a display portion 2302, operation switches 2303, and the like. By applying the element substrate using the thin film transistor described in any of the above-described embodiments and the display device including the element substrate to the display portion 2302, a mobile phone with improved image quality can be provided.

Figure 16C:
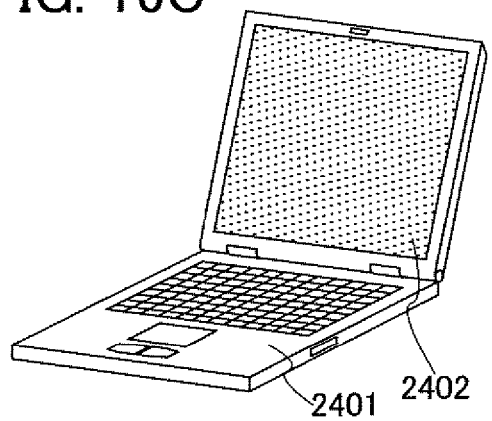

A portable computer illustrated in FIG. 16C includes a main body 2401, a display portion 2402, and the like. By applying the element substrate using the thin film transistor described in any of the above-described embodiments and the display device including the element substrate to the display portion 2402, a computer with improved image quality can be provided.

Figure 16D:
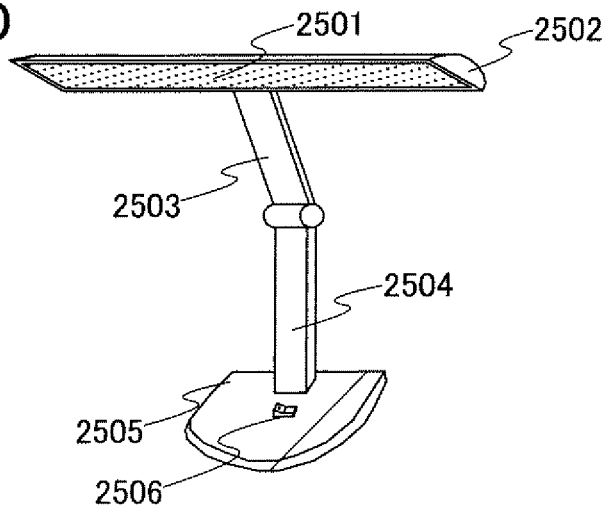

FIG. 16D illustrates a desk lamp including a lighting portion 2501, a shade 2502, an adjustable arm 2503, a support 2504, a base 2505, and a power switch 2506. The desk lamp is formed using the light-emitting device described in the above-described embodiment, for the lighting portion 2501. Note that a lamp includes in its category ceiling lights, wall lights, and the like. By applying the element substrate using the thin film transistor described in any of the above-described embodiments and the display device including the element substrate, lamps can be provided with high productivity and low cost.

Figure 18A:
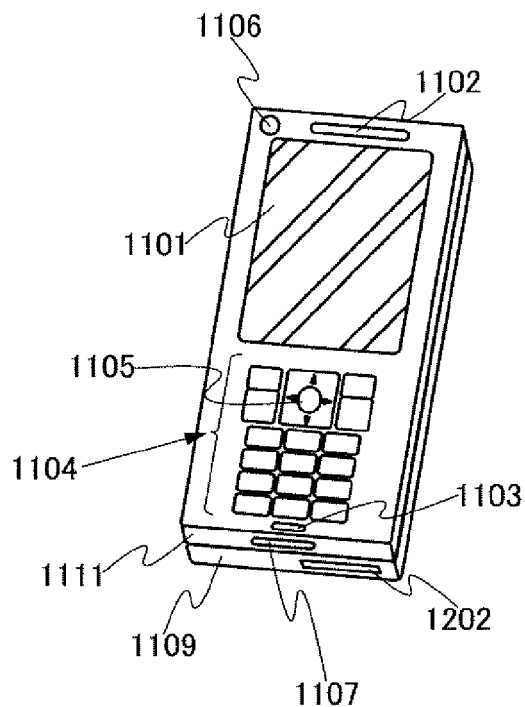
FIGS. 18A to 18C are views illustrating one example of an electronic device or the like to which the thin film transistor can be applied, according to one embodiment of the present invention.
Figure 18B:
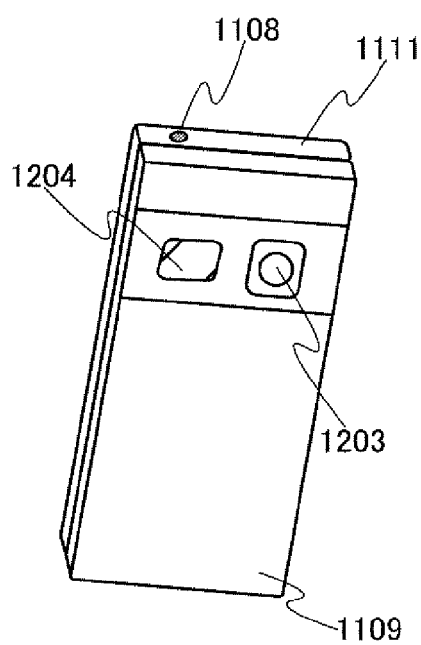
Figure 18C:
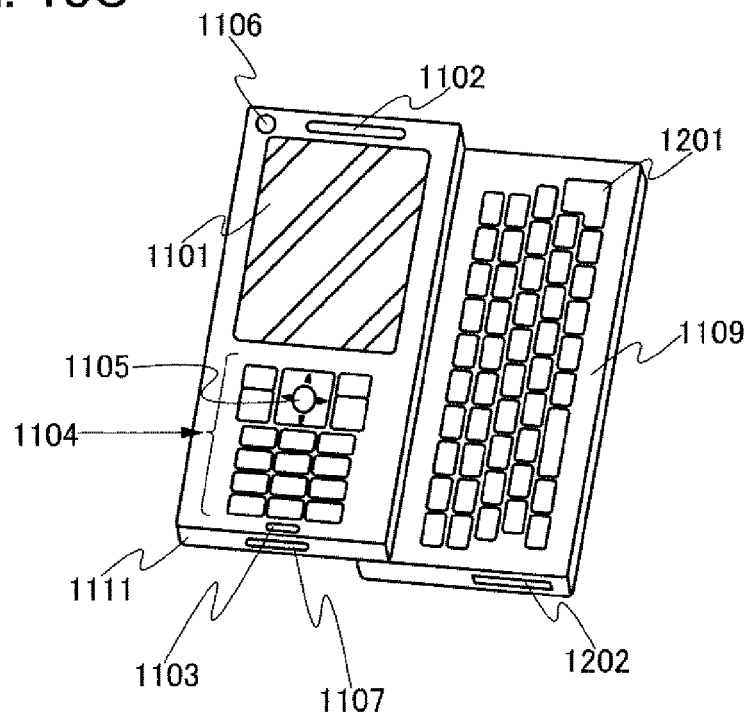

FIGS. 18A to 18C illustrates one mode of the structure of a smart mobile phone, and the element substrate using the thin film transistor described in any of the above-described embodiments and the display device including the element substrate is applied to, for example, a display portion. FIG. 18A is a front view, FIG. 18B is a back view, and FIG. 18C is a development view. The smart mobile phone has two chassis 1111 and 1109. The smart mobile phone has both functions of a mobile phone and of a portable information terminal, incorporates a computer, and enables various kinds of data processing in addition to telephone conversation. The smart mobile phone is also called a smartphone.

The chassis 1111 includes a display portion 1101, a speaker 1102, a microphone 1103, operation keys 1104, a pointing device 1105, a front camera lens 1106, a jack 1107 for an external connection terminal, an earphone terminal 1108, and the like, while the chassis 1109 includes a keyboard 1201, an external memory slot 1202, a rear camera 1203, a light 1204, and the like. An antenna is incorporated in the chassis 1111.

Further, in addition to the above-described structure, a wireless IC chip, a small-size memory device, or the like may be incorporated.

The smart mobile phone is folded into the chassis 1111 and the chassis 1109 in FIG. 18A, and as shown in FIG. 18C, the chassis 1111 and the chassis 1109 are slid from the state shown in FIG. 18A. In the display portion 1101, the display device described in the above-described embodiment can be incorporated, and the display direction can be changed depending on a use mode. Since the front camera lens 1106 is provided in the same plane as the display portion 1101, the smart mobile phone can be used as a videophone. Further, a still image and a moving image can be taken by the rear camera 1203 and the light 1204 by using the display portion 1101 as a viewfinder.

The speaker 1102 and the microphone 1103 can be used for videophone, recording, playback, and the like in addition to verbal communication. With the use of the operation keys 1104, making and receiving calls, inputting simple data of e-mails or the like, scrolling of the screen, moving the cursor and the like are possible.

When much data is needed to be treated, such as documentation, use as a portable information terminal, and the like, it is convenient to use the keyboard 1201. The chassis 1111 and 11109 overlapped with each other (FIG. 18A) can be slid to be used as a portable information terminal in the state shown in FIG. 18C. Further, the keyboard 1201 and the pointing device 1105 enables smooth operation. To the jack 1107 for an external connection terminal, an AC adaptor and various types of cables such as a USB cable can be connected, and charging and data communication with a personal computer or the like are possible. Further, a large amount of data can be stored and moved by inserting a storage medium into the external memory slot 1202.

For the rear surface of the chassis 1109 (FIG. 18B), the rear camera 1203 and the light 1204 are provided, so that a still image and a moving image can be taken by using the display portion 1101 as a viewfinder.

Further, an infrared communication function, a USB port, a function of receiving one segment television broadcast, a wireless IC chip, an earphone jack, or the like may be provided in addition to the above-described function and structure.

By applying the display device described in the above-described embodiment, a smartphone with high image quality can be provided.

This embodiment can be combined with any other embodiment as appropriate.

Example 1

Hereinafter, one embodiment of the present invention will be described in more detail based on an example. Described in this example below is an experimental result of plasma effect on a microcrystalline silicon film by water plasma treatment performed after channel etching, obtained by measuring a lifetime of carriers in a microcrystalline silicon film formed over a glass substrate.

Here, the "lifetime" means an average lifetime from generation of carriers in a semiconductor to recombination of the carriers to decay. For example, a semiconductor wafer (silicon wafer) is irradiated with light, which leads to generation of electrons and holes (carriers) in the semiconductor wafer. The generated electrons and holes are recombined to decay. In this manner, the average lifetime from generation of carriers to recombination and decay of the carriers is called the "lifetime." Note that the "lifetime" is also called a "recombination lifetime" or a "carrier lifetime."

Excess carriers of electrons and holes being introduced into a semiconductor wafer by light irradiation or the like are recombined through traps when a trap level due to a lattice defect, a heavy-metal impurity, or the like exists in the semiconductor wafer, which decrease the lifetime. That is, improvement in lifetime leads to improvement in carrier mobility, which can bring improvement in electrical characteristics (high-speed operation and the like) of the transistor.

Samples which were used in Example 1 will be described. The samples which were used in Example 1 were each formed by forming a 100-nm-thick microcrystalline silicon film on a glass substrate by a plasma CVD method. The deposition condition of each microcrystalline silicon film was set as follows: the RF power supply frequency was 13.56 MHz, the RF power supply was 50 W, the deposition temperature was 280° C., the flow ratio of silane gas to hydrogen was 1:150, and the pressure was 280 Pa. The microcrystalline silicon film thus manufactured was used as Sample A.

Next prepared was a microcrystalline silicon film by performing dry-etching on the 100-nm-thick microcrystalline silicon film which was deposited on a glass substrate in the same condition as the Sample A. The dry-etching condition was set as follows: the flow rate of chlorine which was an etching gas was 100 sccm, the power applied to a coil electrode was 150 W, the power applied to a lower electrode (on a bias side) was 40 W, the reaction pressure was 1.0 Pa, and the temperature of the lower electrode was 70° C. The microcrystalline silicon film thus manufactured was used as Sample B.

Next prepared was a microcrystalline silicon film by performing dry-etching in the same condition as the Sample B on the 100-nm-thick microcrystalline silicon film which was deposited on a glass substrate in the same condition as the Sample A, and then performing plasma treatment using an $O_2$ gas. The plasma treatment condition was set as follows: the flow rate of $O_2$ was 300 sccm, the power applied to a coil electrode was 1800 W, the reaction pressure was 66.5 Pa, and the temperature of a lower electrode was 250° C. The microcrystalline silicon film thus manufactured was used as Sample C.

Next prepared was a microcrystalline silicon film by performing dry-etching in the same condition as the Sample B on the 100-nm-thick microcrystalline silicon film which was deposited on a glass substrate in the same condition as the Sample A, and then performing plasma treatment using an $H_2O$ gas. The plasma treatment condition was set as follows: the flow rate of $H_2O$ was 300 sccm, the power applied to a coil electrode was 1800 W, the reaction pressure was 66.5 Pa, and the temperature of a lower electrode was 250° C. The microcrystalline silicon film thus manufactured was used as Sample D.

The lifetimes of carriers included in the microcrystalline silicon films of the Samples A to D were evaluated using microwave photo-conductivity decay (a μ-PCD method). The μ-PCD method is a measurement method of evaluating a lifetime without contact: each microcrystalline silicon film is irradiated with microwaves and pulsed laser light, so that the lifetime from generation of excessive carriers in the microcrystalline silicon film to recombination and decay of the carriers is measured. Generation of the carriers increases the conductivity of the microcrystalline silicon film, and thus the reflectance of microwaves with which the microcrystalline silicon film is irradiated changes in accordance with the excessive carrier density. The time of decrease in the reflectance of the microwaves is measured, whereby the lifetime of the carriers can be measured.

In Example 1, with the use of a crystallinity evaluation equipment using microwaves (produced by KOBELCO RESEARCH INSTITUTE, INC.), the Samples A to D were irradiated with microwaves with a frequency of 13.56 MHz and with third harmonics of a YLG laser with a wavelength of 349 nm, and change in reflection intensity with time, which changes in accordance with generation of carriers, was measured with a voltmeter for measuring a phase contrast of microwaves. Note that the peak of the measured values is steep and thus the time of decay caused by carrier recombination cannot be measured. However, relatively, a higher peak level of the reflection intensity indicates that a longer lifetime of carriers and higher crystallinity. Thus, the lifetimes of the samples were compared with each other using the peak levels of the reflection intensity.

Figure 19:
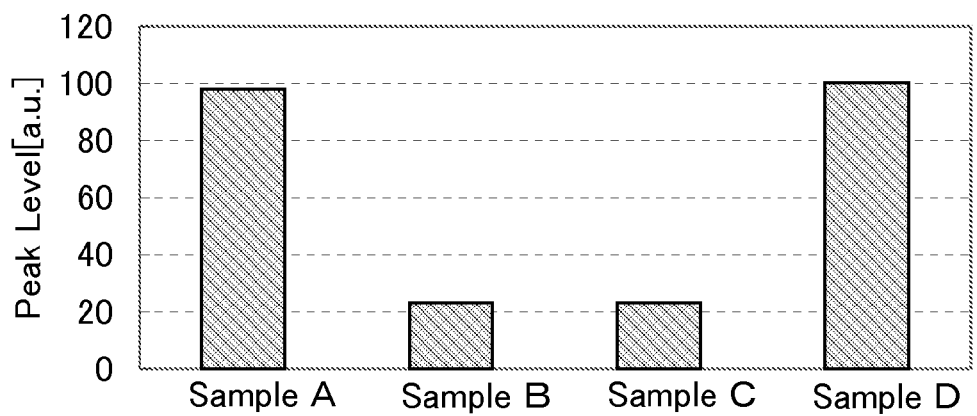
FIG. 19 is a graph of lifetime evaluation and measurement results of Samples A to D.

FIG. 19 shows lifetime measurement results of the Samples A to D. The horizontal axis indicates the Samples A to D and the vertical axis indicates the peak level of the reflection intensity. As the peak level of the reflection intensity gets higher, the lifetime becomes longer. It was found from FIG. 19 that the peak level of the reflection intensity was higher in the order of the Sample D, the Sample A, the Sample B, and the Sample C. That is, it was found that the microcrystalline silicon film passed through the dry-etching and the plasma treatment using an $H_2O$ gas in this order had the longest lifetime. The peak level of the reflection intensity of the Sample C passed through the dry-etching and the plasma treatment using an $O_2$ gas in this order was almost the same as that of the Sample B passed through the dry-etching, from which it was found that an $O_2$ gas did not contribute to the improvement in the lifetime.

Through the above, it was found that with the water plasma treatment after the dry-etching performed on a microcrystalline silicon film, the number of recombination centers of carriers was decreased, defects were decreased, and the crystallinity was improved.

Example 2

Examined in Example 2 were, with respect to the surface states of an amorphous silicon film after a depressed portion is formed by removing a part of the amorphous silicon film and of an amorphous silicon film after a depressed portion is formed by removing a part of the amorphous silicon film and plasma treatment using an $H_2O$ gas is performed thereon, on the kind, the amount, and the chemical-bonding state of elements existing on the surfaces of the depressed portions of the amorphous silicon films by using X-ray photoelectron spectroscopy (XPS).

Samples which were used in Example 2 will be described. The samples which were used in Example 2 were each formed by forming a 200-nm-thick amorphous silicon film on a glass substrate by a plasma CVD method. The deposition condition of each amorphous silicon film was set as follows: the RF power supply frequency was 13.56 MHz, the RF power supply was 60 W, the deposition temperature was 280° C., the flow ratio of silane gas to hydrogen was 28:30, and the pressure was 170 Pa. The amorphous silicon film thus manufactured was used as Sample E.

Next prepared was an amorphous silicon film by performing dry-etching on the 200-nm-thick amorphous silicon film which was deposited on a glass substrate in the same condition as the Sample E. The dry-etching condition was set as follows, which is the same as the dry-etching condition when forming the depressed portion by removing a part of the amorphous silicon film: the flow rate of chlorine which was an etching gas was 100 sccm, the power applied to a coil electrode was 150 W, the power applied to a lower electrode (on a bias side) was 40 W, the reaction pressure was 1.0 Pa, and the temperature of the lower electrode was 70° C. The amorphous silicon film thus manufactured was used as Sample F.

Next prepared was an amorphous silicon film by performing dry-etching in the same condition as the Sample F on the 200-nm-thick amorphous silicon film which was deposited on a glass substrate in the same condition as the Sample E, and then performing plasma treatment using an $H_2O$ gas. The plasma treatment condition was set as follows: the flow rate of $H_2O$ was 250 sccm, the power applied to a coil electrode was 1800 W, the reaction pressure was 66.5 Pa, and the temperature of a lower electrode was 250° C. The amorphous silicon film thus manufactured was used as Sample G.

Next, the surfaces of the Samples E, F, and G were measured by XPS. Photoelectron spectroscopy spectra of Si-2p of the Samples E, F, and G were shown in FIG. 20. The position of the photoelectron peak shifts depending on the bonding state of elements, and Si-2p can identify the bonding state of Si, $SiO_2$, and $SiO_xC_y$.

Figure 20:
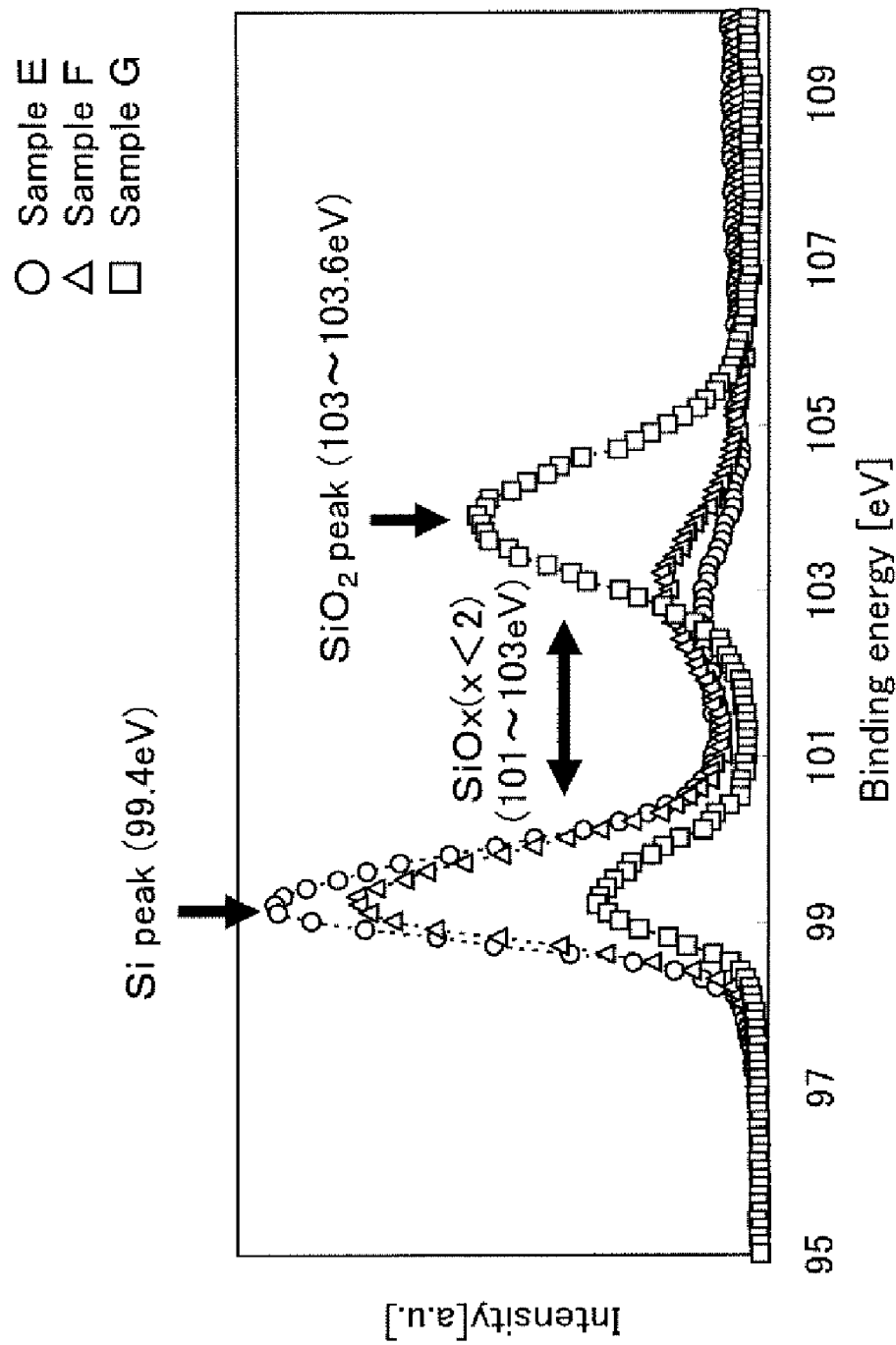
FIG. 20 is a graph of XPS of Samples E to G.

In the Si-2p spectra in FIG. 20, one peak which was a peak of Si was formed as the peak of the Sample E whereas the Sample F had two peaks, that is, the peak after the dry-etching tends to shift in the positive direction of the binding energy and oxidation of silicon progresses. Further, the peak of the Sample G passed through the plasma treatment using an $H_2O$ gas after the dry-etching further shifted in the positive direction, and the position of the peak intensity was reversed as compared to the Sample E.

From the above results, the surface of the amorphous silicon film after the depressed portion was formed by removing a part of the amorphous silicon film was considered to be damaged by the dry-etching as shown in the peak of the Sample F. Further, the surface of the amorphous silicon film after the depressed portion was formed by removing a part of the amorphous silicon film and the plasma treatment using an $H_2O$ gas was performed thereon is conceived to be silicon oxide as shown in the peak of the Sample G.

Example 3

In Example 3, with respect to the surface states of an amorphous silicon film after a depressed portion was formed by removing a part of the amorphous silicon film and of an amorphous silicon film after a depressed portion was formed by removing a part of the amorphous silicon film and plasma treatment using an $H_2O$ gas was performed thereon, qualitative analysis by time-of-flight secondary ion mass spectrometry (ToF-SIMS) was performed.

Samples which were used in Example 3 will be described. The samples which were used in Example 3 were each formed by forming a 200-nm-thick amorphous silicon film on a glass substrate by a plasma CVD method. Among these, a sample manufactured in the same manner as that of the Sample E manufactured in Example 2 was used as Sample H; a sample manufactured in the same manner as that of the Sample F manufactured in Example 2 was used as Sample I; and a sample manufactured in the same manner as that of the Sample G manufactured in Example 2 was used as Sample J.

Figure 21:
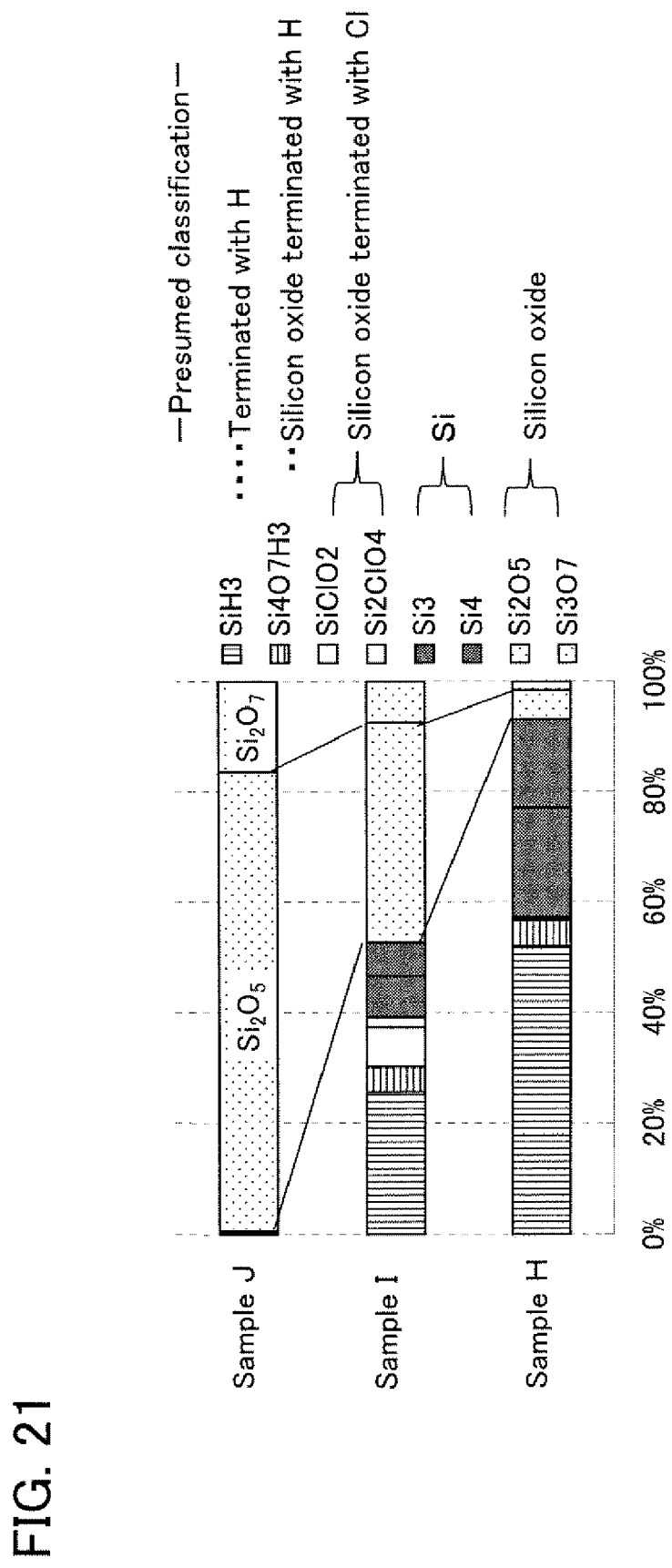
FIG. 21 is a graph of measurement results of ToF-SIMS of Samples H to J.

Next, in order to examine the surface states of the Samples H, I, and J, qualitative analysis by ToF-SIMS was performed. Results of negative-ion analysis of the outer-most surface of the amorphous silicon films of the Samples H, I, and J are shown in FIG. 21.

From the outer-most surface of the amorphous silicon film of the Sample H, $Si_3$, $Si_4$, and $SiH_3$ were detected as negative ions. From the outer-most surface of the amorphous silicon film of the Sample I, $Si_3$, $Si_4$, $SiH_3$, and $Si_xO_yCl$ were detected as negative ions. As compared to the Sample H, $Si_xO_y$ series were strong. In addition, silicon oxide terminated with Cl was detected because a Cl gas was used in the dry-etching. From the outer-most surface of the amorphous silicon film of the Sample J, $Si_xO_y$ was strongly detected as negative ions. Little silicon oxide terminated with H or Cl was detected from the Sample J.

From the above results, it was found that in the surface state of the amorphous silicon film before the depressed portion was formed by removing a part of the amorphous silicon film, the surface of the amorphous silicon film was not oxidized so much and was terminated with H. Further, it was found that in the surface state of the amorphous silicon film after the depressed portion was formed by removing a part of the amorphous silicon film, the surface of the amorphous silicon film was oxidized a little and had silicon oxide terminated with H or Cl. Further, it was found that the surface state of the amorphous silicon film after the depressed portion was formed and plasma treatment using an $H_2O$ gas was performed thereon was oxidized to become silicon oxide at 99%.

Example 4

In Example 4, thin film transistors according to Embodiment 1 were manufactured and measurement results of the transistor characteristics thereof will be described.

First, the manufacturing process of the thin film transistors manufactured in Example 4 will be described.

Figure 22A:
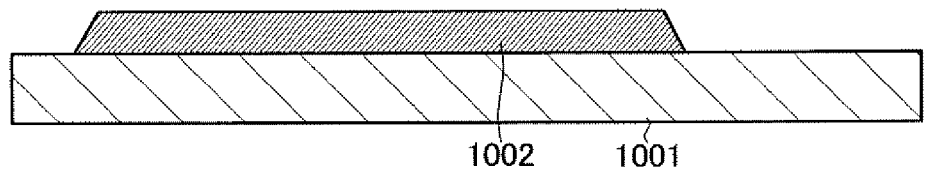
FIGS. 22A to 22C are diagrams illustrating a method for manufacturing a thin film transistor according to Example 4.

As shown in FIG. 22A, as a conductive layer which forms a gate electrode on a substrate 1001, a 150-nm-thick molybdenum layer was formed by sputtering a molybdenum target with argon. A resist mask was formed by a photolithography method using a resist applied over the conductive layer, and the conductive layer was dry-etched using the resist mask to form a gate electrode 1002. After that, the resist mask was removed.

Figure 22B:
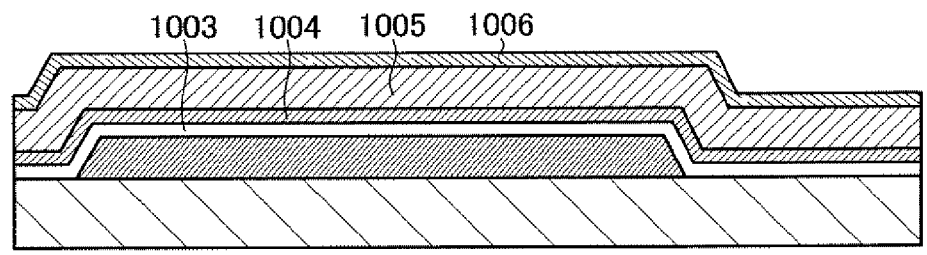

Next, as shown in FIG. 22B, a gate insulating film 1003 was formed over the substrate 1001 and the gate electrode 1002; a microcrystalline silicon film 1004 was formed over the gate insulating film 1003; an amorphous silicon film 1005 was formed over the microcrystalline silicon film 1004; and an impurity semiconductor film 1006 in which an impurity which imparts one conductivity type was added was formed over the amorphous silicon film 1005.

In Example 4, as the gate insulating film 1003, a 300-nm-thick silicon nitride film was formed by a plasma CVD method. As the microcrystalline silicon film 1004, a 50-nm-thick silicon oxynitride film was formed by a plasma CVD method in the following condition: the RF power supply frequency was 13.56 MHz, the RF power supply was 50 W, the deposition temperature was 280° C., the flow ratio of silane gas to hydrogen was 1:150, and the pressure was 280 Pa. Next, as the amorphous silicon film 1005 formed over the microcrystalline silicon film, a 80-nm-thick amorphous silicon film was formed by a plasma CVD method. Next, over the amorphous silicon film 1005, the impurity semiconductor film 1006 in which an impurity which imparts one conductivity type was added was formed. As the impurity semiconductor film 1006, a 50-nm-thick amorphous silicon film in which phosphorus was added was formed by a plasma CVD method.

Figure 22C:
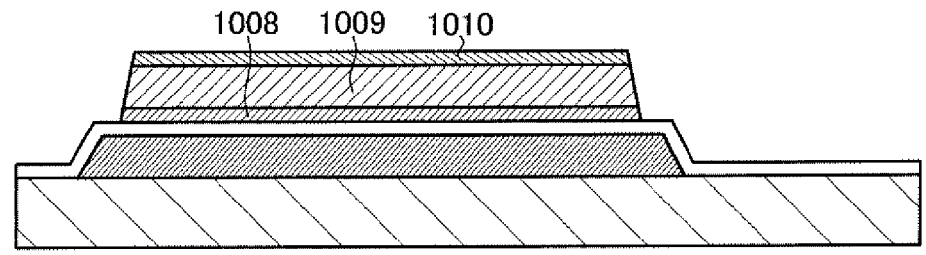

Next, a resist was applied on the impurity semiconductor film 1006 in which an impurity which imparts one conductivity type was added, and subjected to a photolithography process to form a resist mask, and the microcrystalline silicon film 1004, the amorphous silicon film 1005, and the impurity semiconductor film 1006 were dry-etched using the resist mask to form a microcrystalline silicon layer 1008, an amorphous silicon layer 1009, and an impurity semiconductor layer 1010 as shown in FIG. 22C. After that, the resist mask was removed.

Figure 23A:
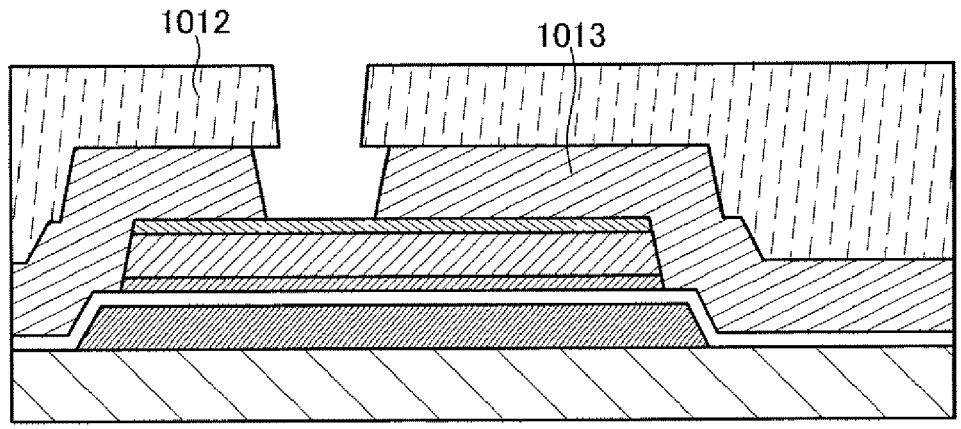
FIGS. 23A to 23C are diagrams illustrating a method for manufacturing the thin film transistor according to Example 4.
Figure 23B:
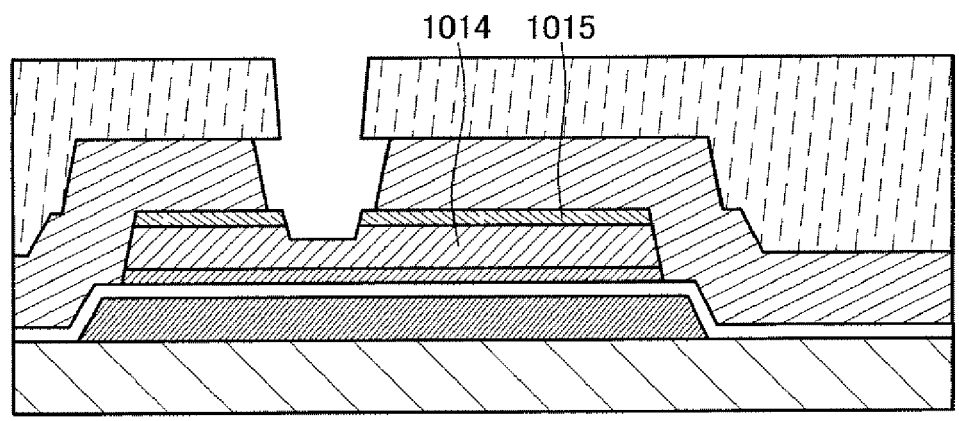

Next, a conductive film was formed over the gate insulating film 1003 and the impurity semiconductor layer 1010. In Example 4, as the conductive film, a 300-nm-thick molybdenum layer was formed by sputtering a molybdenum target with argon. Next, a resist was applied over the conductive film, and subjected to a photolithography process to form a resist mask 1012, and the conductive film was wet-etched using the resist mask 1012 to form a source and drain wirings 1013 as shown in FIG. 23A. Further, as shown in FIG. 23B, the impurity semiconductor layer 1010 was dry-etched to form a pair of impurity semiconductor layers 1015. When the impurity semiconductor layer 1010 was dry-etched, the surface of the amorphous silicon film 1005 was also partially etched away so that an amorphous silicon layer 1014 having a depressed portion was formed.

Here, for the preparation of Sample K, the resist mask was removed by $O_2$ aching or a resist stripper, and the surface of the amorphous silicon layer 1014 was dry-etched so that impurities on the depressed portion of the amorphous silicon layer 1014 were removed. The condition of the dry-etching was set as follows: the flow rate of chlorine which was an etching gas in an ICP method was 100 sccm, the power applied to a coil electrode was 2000 W, no power (0 W) was applied to a substrate 101 (the substrate provided with the amorphous silicon film) side, the reaction pressure was 0.67 Pa, and the temperature of a lower electrode was −10° C.

Next, for the preparation of Sample L, plasma treatment using an $H_2O$ gas was performed on the substrate formed at the step of FIG. 23B. The condition of the plasma treatment was set as follows: the flow rate of $H_2O$ was 300 seem, the power applied to a coil electrode was 1800 W, the reaction pressure was 66.5 Pa, and the temperature of a lower electrode was 250° C. Note that at the time of the plasma treatment using an $H_2O$ gas, the resist mask was removed.

Next, for the preparation of Sample M, dry-etching and plasma treatment using an $H_2O$ gas were performed in this order on the surface of the amorphous silicon film of the substrate formed at the step of FIG. 23B. The condition of the dry-etching was the same as that of the Sample K. The condition of the plasma treatment was the same as that of the Sample L. Note that at the time of the plasma treatment using an $H_2O$ gas, the resist mask was removed.

Next, for the preparation of Sample N, plasma treatment using an $H_2O$ gas and dry-etching were performed in this order on the surface of the amorphous silicon film of the substrate formed at the step of FIG. 23B. The condition of the plasma treatment was the same as that of the Sample L. The condition of the dry-etching was the same as that of the Sample K. Note that at the time of the plasma treatment using an $H_2O$ gas, the resist mask was removed.

Figure 23C:
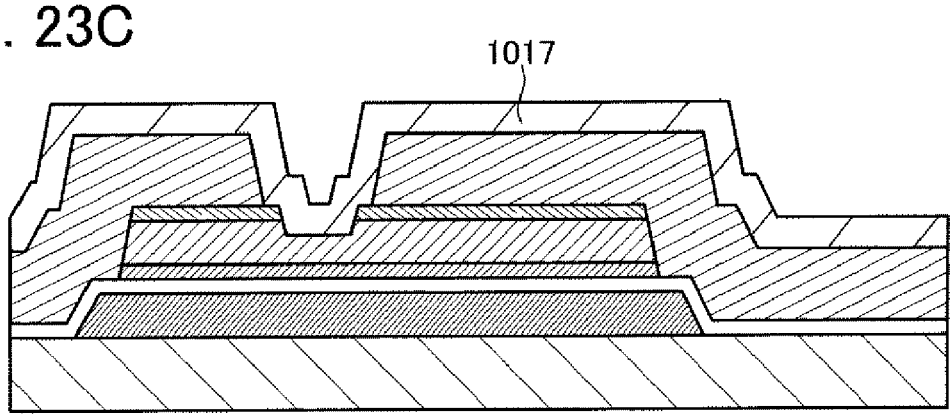

Next, as shown in FIG. 23C, a protection insulating film was formed over each of the Samples K to N. In Example 4, as a protection insulating film 1017, a 300-nm-thick silicon nitride film was formed by a plasma CVD method.

Next, electrical characteristics of the thin film transistors of the Samples K to N were measured. Note that the channel length of each thin film transistor of the Samples K to N was 10 μm and the channel width thereof was 8 μm. The number of points of measurement in each of the Samples K to N was 15.

Figure 24A:
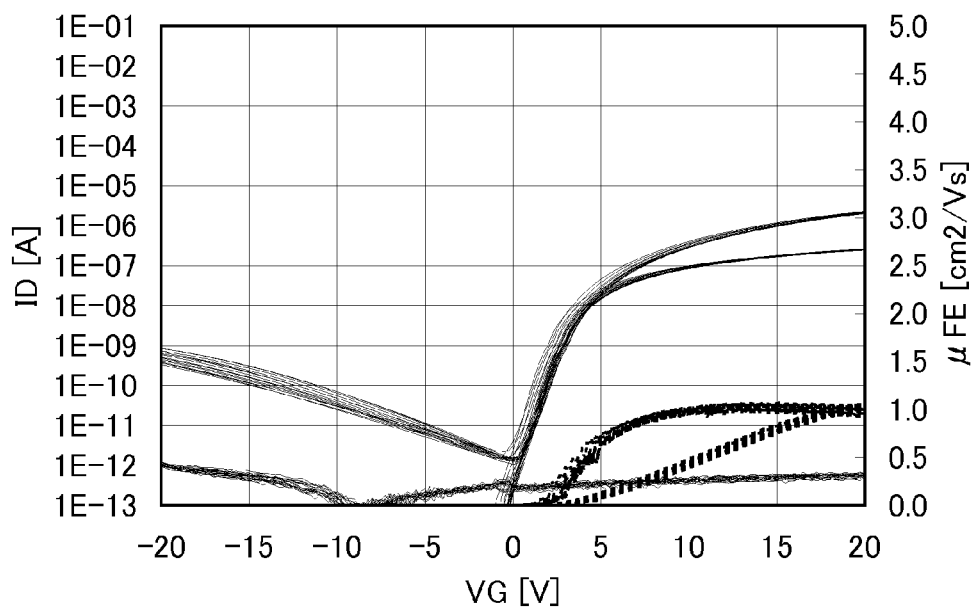
FIGS. 24A and 24B are current vs. voltage characteristics of Samples K and L.
Figure 24B:
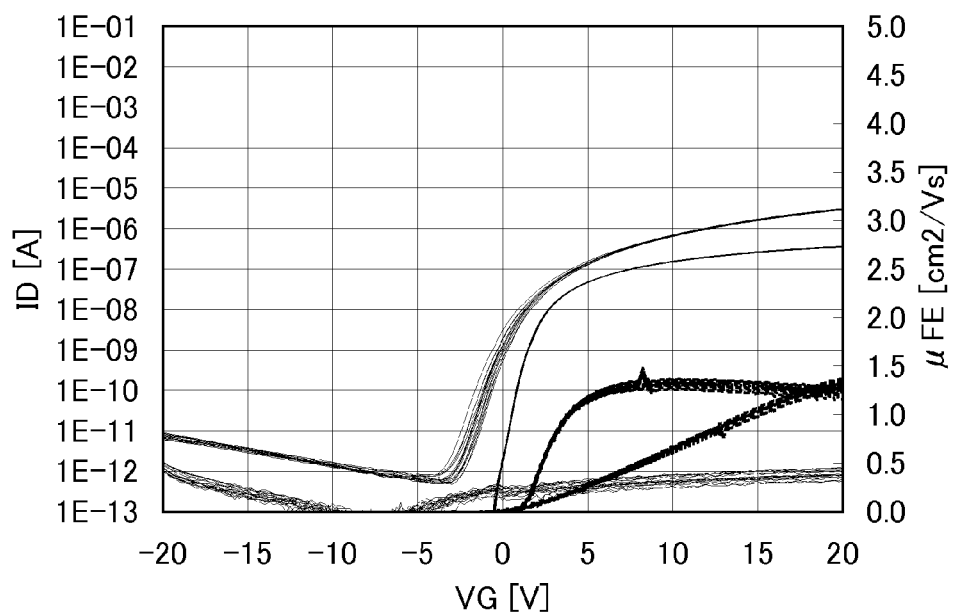
Figure 25A:
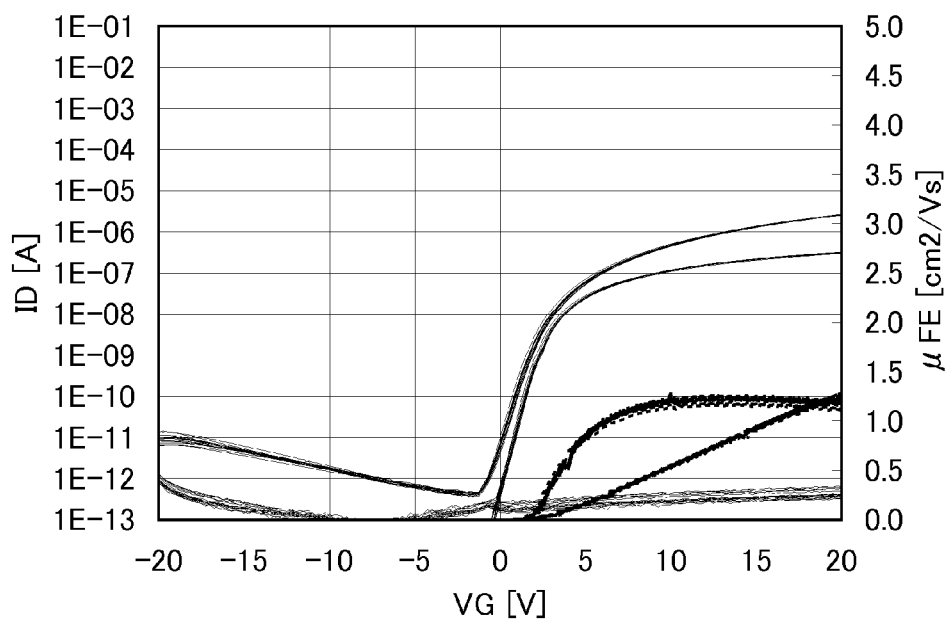
FIGS. 25A and 25B are current vs. voltage characteristics of Samples M and N.
Figure 25B:
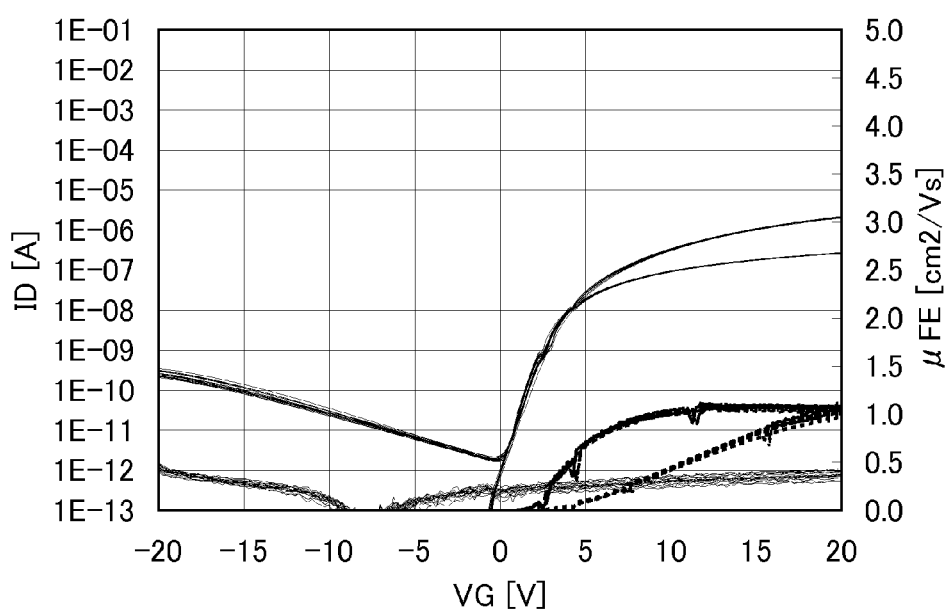

FIGS. 24A and 24B and 25A and 25B show the measurement results of the current vs. voltage characteristics. FIG. 24A shows the current vs. voltage characteristics of the Sample K; FIG. 24B shows the current vs. voltage characteristics of the Sample L; FIG. 25A shows the current vs. voltage characteristics of the Sample M; and FIG. 25B shows the current vs. voltage characteristics of the Sample N. The horizontal axis indicates a voltage value and the vertical axis indicates a current value. The current vs. voltage characteristics at drain voltages of 1 V and 14 V are shown using solid lines and the field-effect mobilities at drain voltages of 1 V and 14 V are shown using dashed lines.

As shown in FIG. 24B, the filed-effect mobility was the highest and the off-state current was small in the Sample L but the curves at the drain voltages of 1 V and 14 V were relatively separated form each other and it is remarkably observed that the curve at the drain voltage of 14 V was shifted in the negative direction. Further, variations of the characteristics were large between elements. On the other hand, although the field-effect mobility was lower than that of the Sample L, the Sample M in which dry-etching treatment was performed just before plasma treatment using an $H_2O$ gas had an effect of reducing the off-state current as shown in FIG. 25A. Further, variations of the characteristics between elements were able to be reduced.

Figure 26A:
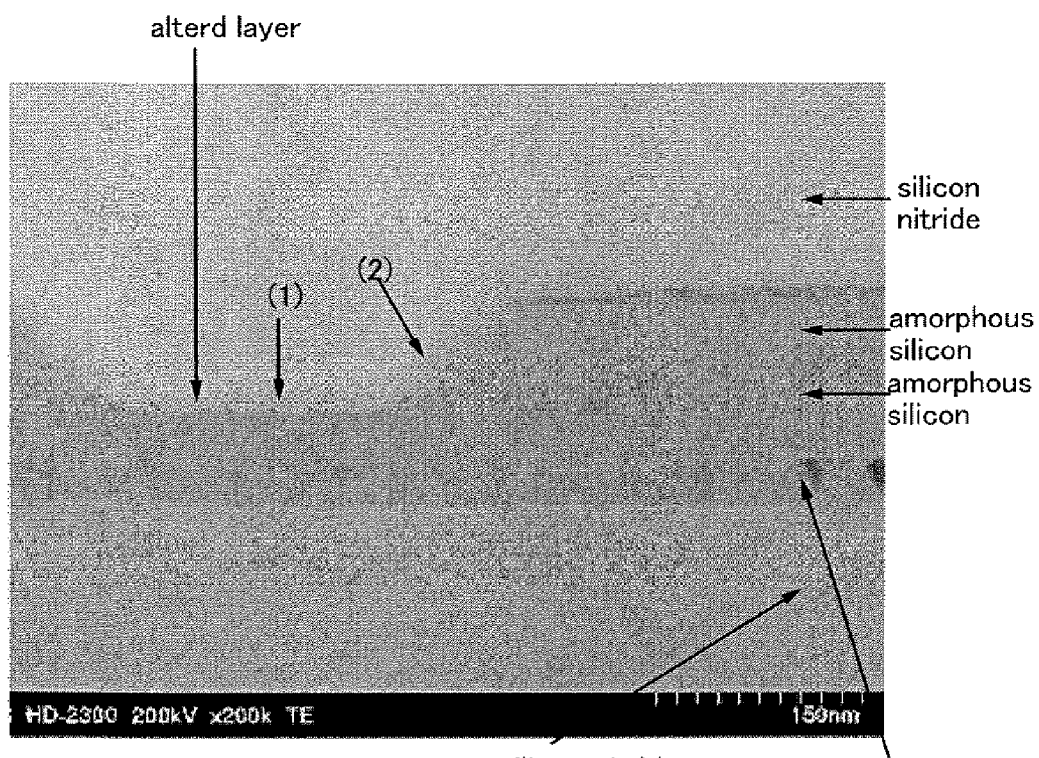
FIGS. 26A and 26B are cross-sectional TEM images of the Samples K and M.
Figure 26B:
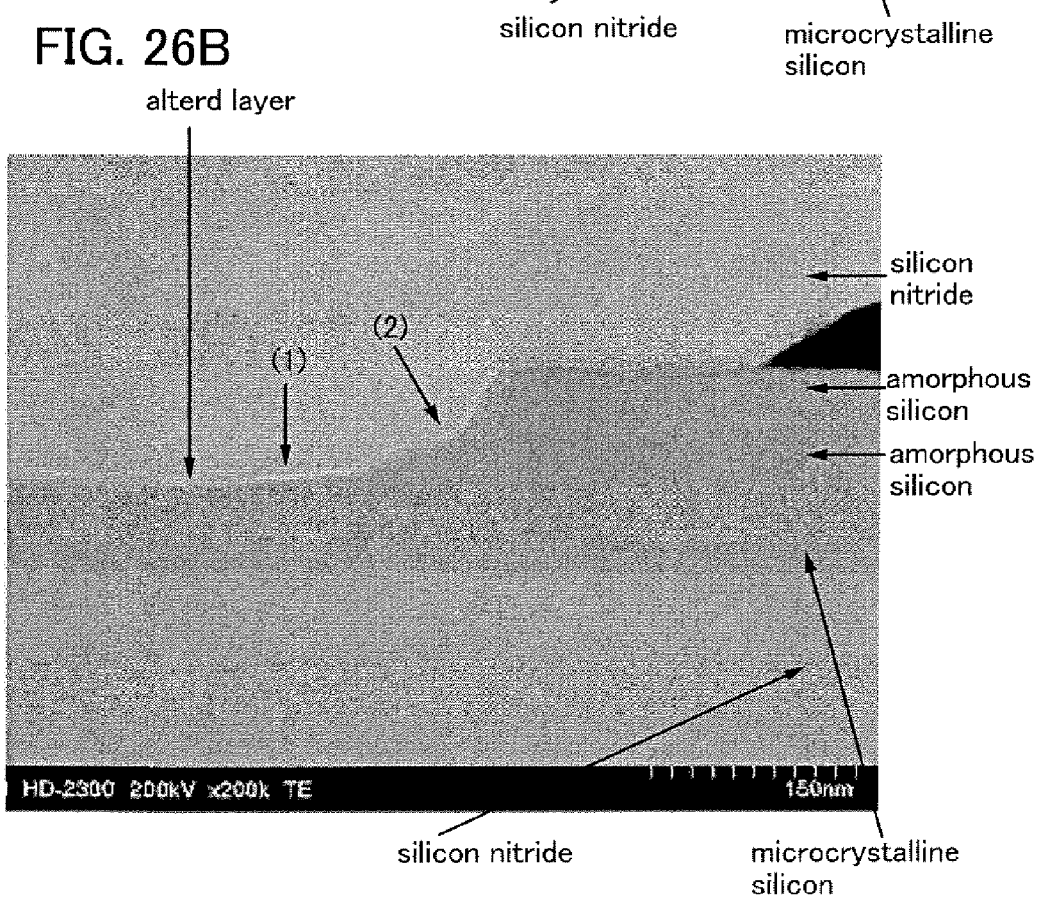

Further, for examination of the relationship between the reduction of the off state current and the state of the interface between the amorphous silicon film and the interlayer insulating film, the cross section of the interface between the amorphous silicon film and the interlayer insulating film was observed by a transmission electron microscope (hereinafter referred to as TEM). FIGS. 26A and 26B are TEM images each of the cross section of the interface between the amorphous silicon film and the interlayer insulating film. FIG. 26A is a cross-section TEM image of the interface between the amorphous silicon film and the interlayer insulating film of the Sample K. FIG. 26B is a cross-section TEM image of the interface between the amorphous silicon film and the interlayer insulating film of the Sample M.

It can be observed that an altered layer was formed in the interface between the amorphous silicon film and the interlayer insulating film in the cross-section TEM image of the Sample M shown in FIG. 26A. This altered layer is thought to be silicon oxide, considering the results of the XPS analysis in Example 2 and the ToF-SIMS analysis in Example 3. On the other hand, it can be observed that an altered layer was also formed in the interface between the amorphous silicon film and the interlayer insulating film in the cross-section TEM image of the Sample K shown in FIG. 26B, and this altered layer is thought to be an native oxide film because exposure to the air was performed before the formation of the interlayer insulating film, after the channel etching.

Further, the measurement results of the thickness of the amorphous silicon film and the interlayer insulating film are shown in Table 1. The measurement points are denoted by reference numerals (1) and (2) in FIGS. 26A and 26B.

TABLE 1

| | Water plasma treatment | |
|---|---|---|
| | No | Yes |
| (1) | 3.12 nm | 5.33 nm |
| (2) | 3.64 nm | 4.63 nm |

From the above results, the composition of the altered layer formed in the interface between the amorphous silicon film and the interlayer insulating film is though to affect the electrical characteristics of the TFT. When an impurity is contained in the composition of the altered layer, the off-state current tends to be increased. As for the sample K, the altered layer is assumed to contain impurities such as Cl from the results of the XPS analysis in Example 2 and the ToF-SIMS analysis in Example 3, so that the off-state current of the TFT is thought to be large. To the contrary, as for the sample M, silicon oxide in which the amount of impurities was extremely small was formed as the altered layer from the results of the XPS analysis in Example 2 and the ToF-SIMS analysis in Example 3, which is though to contribute to reduction of the off-state current of the TFT.

Next described will be measurement results of transistor characteristics of the thin film transistors in which plasma treatment using a gas other than an $H_2O$ gas was performed on the amorphous silicon films.

First, for the preparation of Sample O, the resist mask was removed by $O_2$ ashing or a resist stripper, and the surface of the amorphous silicon layer 1014 was dry-etched so that impurities on the depressed portion of the amorphous silicon layer 1014 were removed. The Sample O was manufactured in the same manner as that of the Sample K. Next, for the preparation of Sample P, dry-etching and plasma treatment using an $H_2O$ gas were performed in this order on the surface of the amorphous silicon film of the substrate formed at the step of FIG. 23B. The Sample P was manufactured in the same manner as that of the Sample M.

Next, for the preparation of Sample Q, plasma treatment using an $O_2$ gas was performed on what was manufactured in the same manner as that of the Sample K. The condition of the plasma treatment was set as follows: the flow rate of $O_2$ was 300 sccm, the power applied to a coil electrode was 1800 W, the reaction pressure was 66.5 Pa, and the temperature of a lower electrode was 250° C. Note that at the time of the plasma treatment using an $O_2$ gas, the resist mask was removed.

Next, for the preparation of Sample R, plasma treatment using an $H_2$ gas was performed on what was manufactured in the same manner as that of the Sample Q. The condition of the plasma treatment was set as follows: the flow rate of $H_2$ was 300 sccm, the power applied to a coil electrode was 1800 W, the reaction pressure was 66.5 Pa, and the temperature of a lower electrode was 250° C. Note that at the time of the plasma treatment using an $H_2$ gas, the resist mask was removed.

Next, a protection insulating layer was formed over each of the Samples O to R. In Example 4, as the protection insulating layer, a 300-nm-thick silicon nitride film was formed by a plasma CVD method.

Next, electrical characteristics of the thin film transistors of the Samples O to R were measured. Note that the channel length of each thin film transistor of the Samples O to R was 10 μm and the channel width thereof was 8 μm. The number of points of measurement in each of the Samples O to R was 15.

Figure 27A:
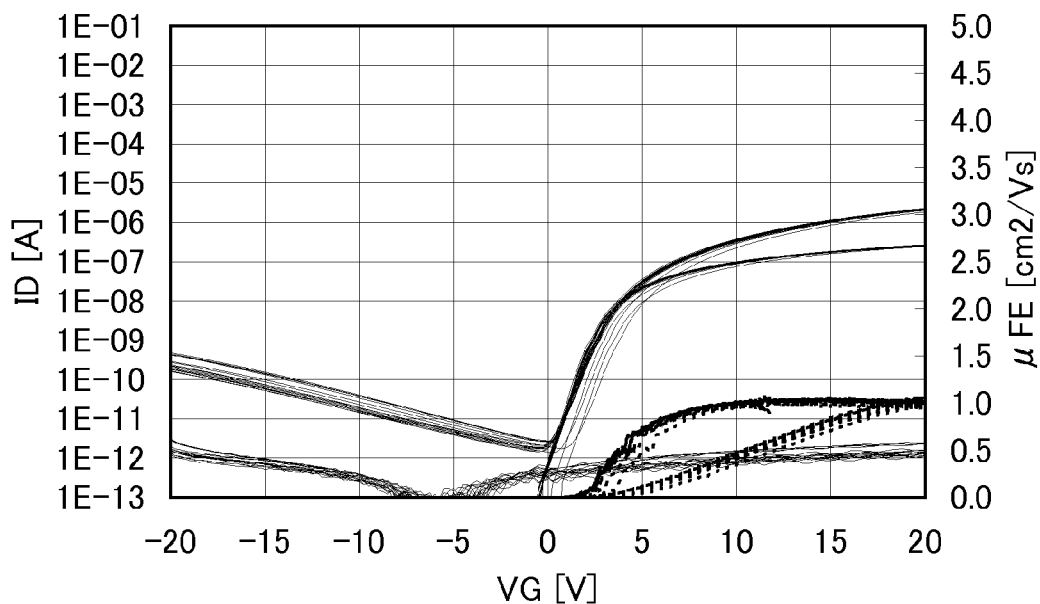
FIGS. 27A and 27B are current vs. voltage characteristics of Samples O and P.
Figure 27B:
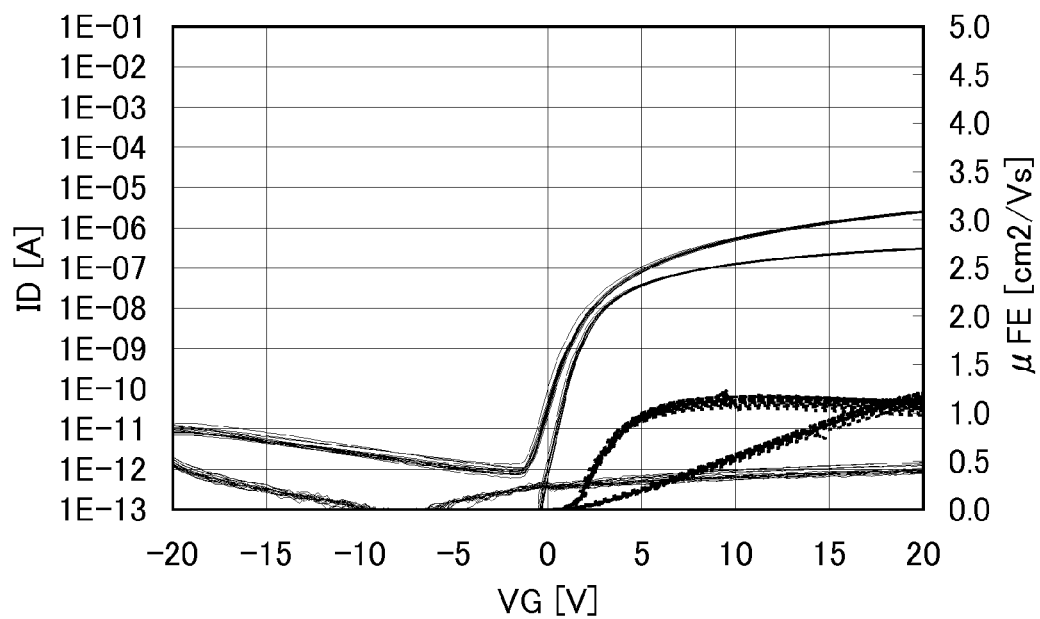
Figure 28A:
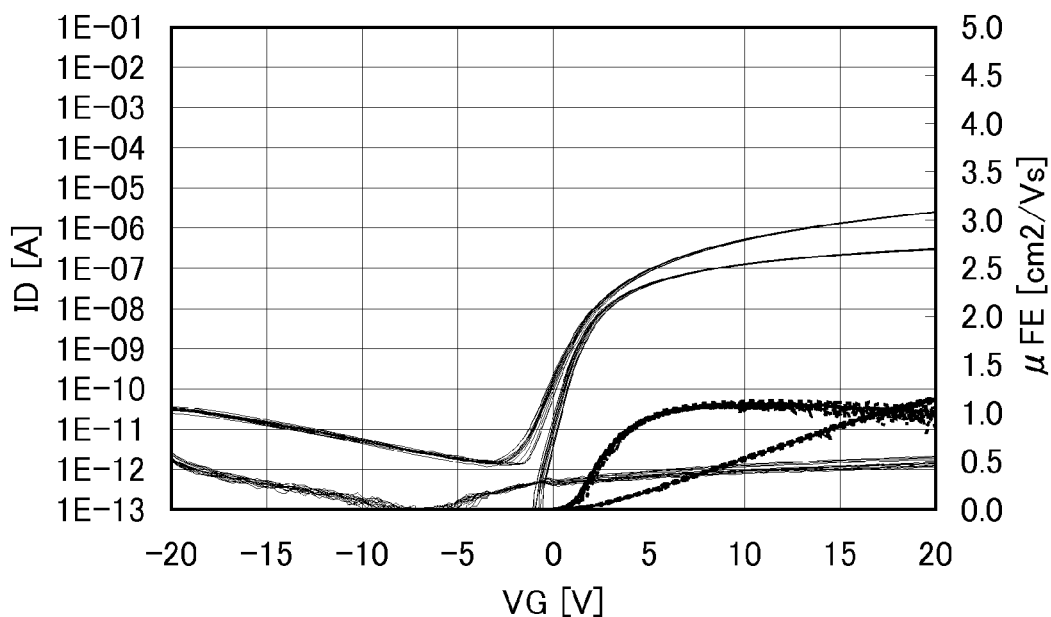
FIGS. 28A and 28B are current vs. voltage characteristics of Samples Q and R.
Figure 28B:
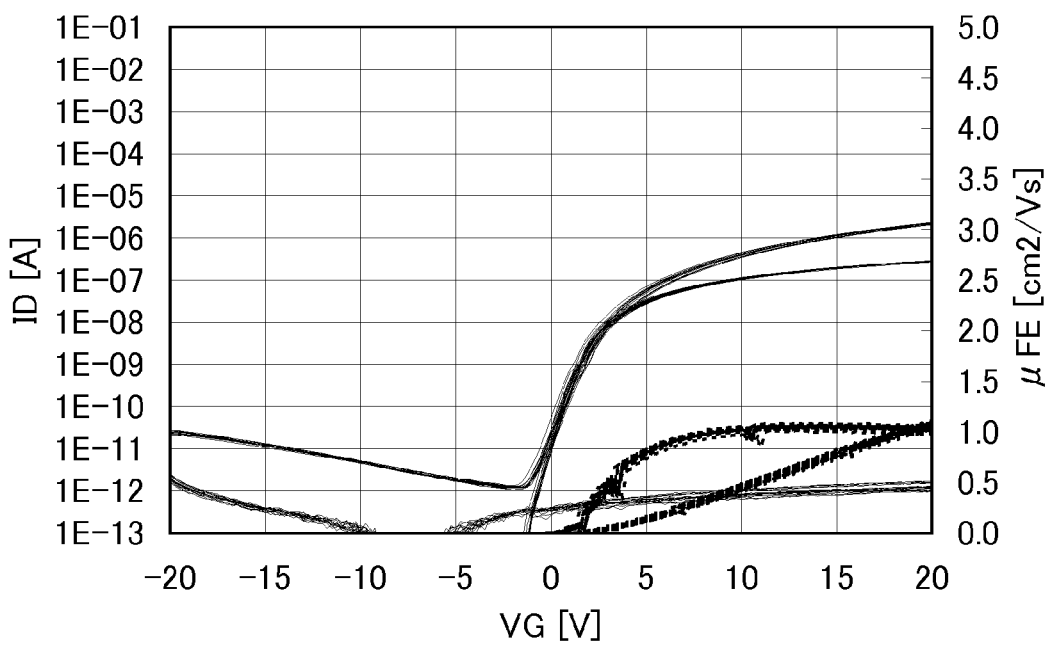

FIGS. 27A and 27B and 28A and 28B show the measurement results of the current vs. voltage characteristics. FIG. 27A shows the current vs. voltage characteristics of the Sample O; FIG. 27B shows the current vs. voltage characteristics of the Sample P; FIG. 28A shows the current vs. voltage characteristics of the Sample Q; and FIG. 28B shows the current vs. voltage characteristics of the Sample R. The horizontal axis indicates a voltage value and the vertical axis indicates a current value. The current vs. voltage characteristics at drain voltages of 1 V and 14 V are shown using solid lines and the field-effect mobilities at drain voltages of 1 V and 14 V are shown using dashed lines.

As shown in FIG. 27B, the off state current was the smallest, the field-effect mobility was increased, and variations of the characteristics were able to be reduced in the Sample P in which plasma treatment using an $H_2O$ gas was performed. On the other hand, it was observed that the off-state currents in the Samples Q and R shown in FIGS. 28A and 28B were much smaller than that in the Sample O. However, the characteristics of the Sample R in FIG. 28B in which plasma treatment using an $H_2$ gas was performed after plasma treatment using an $O_2$ gas are scarcely different from those of the Sample Q, from which the effect of the plasma treatment using an $H_2$ gas after the plasma treatment using an $O_2$ gas is though to be small and the oxidation of the back-channel surface by plasma using an $O_2$ gas is though to contribute to the reduction of the off-state current.

From the above results, it was found that a back-channel superficial layer being covered with silicon oxide in which the amount of impurities was extremely small, after channel etching had an effect of characteristics of the TFT (particularly, reduction of the off-state current). By using the method for manufacturing a thin film transistor according to one embodiment of the present invention, a silicon oxide film in which the amount of impurities is extremely small can be formed on the back-channel superficial layer. Therefore, the thin film transistor according to one embodiment of the present invention is a thin film transistor having high electrical characteristics such as small off-state current and high field-effect mobility.

The present application is based on Japanese Patent Application serial No. 2008-115834 filed with Japan Patent Office on Apr. 25, 2008, the entire contents of which are hereby incorporated by reference.

What is claimed is:

1. A method for manufacturing a thin film transistor, comprising the steps of:
    forming a gate insulating layer over a gate electrode over a substrate;
    forming a microcrystalline semiconductor layer over the gate insulating layer;
    forming an amorphous semiconductor layer over the microcrystalline semiconductor layer;
    forming a semiconductor layer including an impurity element which imparts one conductivity type, wherein the semiconductor layer forms a source and drain regions over the amorphous semiconductor layer;
    forming a source and drain electrodes by using a mask over the semiconductor layer;
    removing by first dry-etching, a part of the semiconductor layer, which is exposed from the source and drain electrodes, and partially a part of the amorphous semiconductor layer just below and in contact with the part of the semiconductor layer;
    removing by second dry-etching, partially a part of the amorphous semiconductor layer which is exposed by the first dry-etching; and
    performing plasma treatment on a surface of a part of the amorphous semiconductor layer that is exposed by the second dry-etching so that an altered layer is formed,
    wherein the surface of the part of the amorphous semiconductor layer that is exposed by the second dry-etching is exposed to a plasma containing OH free radicals in the plasma treatment.

2. The method for manufacturing the thin film transistor, according to claim 1, wherein the amorphous semiconductor layer is etched without supplying power to the substrate.

3. The method for manufacturing the thin film transistor, according to claim 1, wherein the OH free radicals are generated by making at least one of water and hydrogen peroxide water into plasma.

4. The method for manufacturing the thin film transistor, according to claim 1, wherein the substrate is heated in the plasma treatment.

5. The method for manufacturing the thin film transistor, according to claim 4, wherein the substrate is heated at a temperature of 100° C. to 280° C.

6. The method for manufacturing the thin film transistor, according to claim 4, wherein the substrate is heated at a temperature of 220° C. to 280° C.

7. The method for manufacturing the thin film transistor, according to claim 1, wherein the plasma treatment is performed with a plasma down-flow processing apparatus in which a plasma generation chamber and a reaction chamber are separated from each other.

8. A method for manufacturing a thin film transistor, comprising the steps of:
    forming a gate insulating layer over a gate electrode over a substrate;
    forming an amorphous semiconductor layer over the gate insulating layer;
    forming a semiconductor layer including an impurity element which imparts one conductivity type, wherein the semiconductor layer forms a source and drain regions over the amorphous semiconductor layer;
    forming a source and drain electrodes by using a mask over the semiconductor layer;

removing by first dry-etching, a part of the semiconductor layer, which is exposed from the source and drain electrodes, and partially a part of the amorphous semiconductor layer just below and in contact with the part of the semiconductor layer;

removing by second dry-etching, partially a part of the amorphous semiconductor layer which is exposed by the first dry-etching; and performing plasma treatment on a surface of a part of the amorphous semiconductor layer that is exposed by the second dry-etching so that an altered layer is formed, wherein the surface of the part of the amorphous semiconductor layer that is exposed by the second dry-etching is exposed to a plasma containing OH free radicals in the plasma treatment.

9. The method for manufacturing the thin film transistor, according to claim 8, wherein the amorphous semiconductor layer is etched without supplying power to the substrate.

10. The method for manufacturing the thin film transistor, according to claim 8, wherein the OH free radicals are generated by making at least one of water and hydrogen peroxide water into plasma.

11. The method for manufacturing the thin film transistor, according to claim 8, wherein the substrate is heated in the plasma treatment.

12. The method for manufacturing the thin film transistor, according to claim 11, wherein the substrate is heated at a temperature of 100° C. to 280° C.

13. The method for manufacturing the thin film transistor, according to claim 11, wherein the substrate is heated at a temperature of 220° C. to 280° C.

14. The method for manufacturing the thin film transistor, according to claim 8, wherein the plasma treatment is performed with a plasma down-flow processing apparatus in which a plasma generation chamber and a reaction chamber are separated from each other.

* * * * *

UNITED STATES PATENT AND TRADEMARK OFFICE
CERTIFICATE OF CORRECTION

PATENT NO.        : 7,998,801 B2                              Page 1 of 1
APPLICATION NO.   : 12/424563
DATED             : August 16, 2011
INVENTOR(S)       : Shinya Sasagawa et al.

It is certified that error appears in the above-identified patent and that said Letters Patent is hereby corrected as shown below:

In the Specification:

Column 26, line 50, "or polyimide," should read "or polyamide,"

Column 33, line 7, "300 seem," should read "300 sccm,"

Column 33, line 18, "300 seem," should read "300 sccm,"

Column 36, line 67, "100 seem," should read "100 sccm,"

Column 37, line 8, "300 seem," should read "300 sccm,"

Column 39, line 5, "300 seem," should read "300 sccm,"

Signed and Sealed this
First Day of May, 2012

David J. Kappos
*Director of the United States Patent and Trademark Office*